(12) United States Patent
Geiger et al.

(10) Patent No.: US 6,885,319 B2
(45) Date of Patent: Apr. 26, 2005

(54) SYSTEM AND METHOD FOR GENERATING OPTIMALLY COMPRESSED DATA FROM A PLURALITY OF DATA COMPRESSION/DECOMPRESSION ENGINES IMPLEMENTING DIFFERENT DATA COMPRESSION ALGORITHMS

(75) Inventors: Peter D. Geiger, Austin, TX (US); Manuel J. Alvarez, II, Austin, TX (US); Thomas A. Dye, Austin, TX (US)

(73) Assignee: Quickshift, Inc., Austin, TX (US)

( * ) Notice: Subject to any disclaimer, the term of this patent is extended or adjusted under 35 U.S.C. 154(b) by 0 days.

(21) Appl. No.: 10/044,785

(22) Filed: Jan. 11, 2002

(65) Prior Publication Data

US 2002/0101367 A1 Aug. 1, 2002

Related U.S. Application Data

(63) Continuation-in-part of application No. 09/818,283, filed on Mar. 27, 2001, which is a continuation-in-part of application No. 09/421,968, filed on Oct. 20, 1999, now Pat. No. 6,208,273, which is a continuation-in-part of application No. 09/239,659, filed on Jan. 29, 1999.

(51) Int. Cl.[7] .............................................. H03M 7/30
(52) U.S. Cl. .......................................... 341/51; 341/87
(58) Field of Search ..................................... 341/51, 87

(56) References Cited

U.S. PATENT DOCUMENTS

| | | | |
|---|---|---|---|
| 4,008,460 A | 2/1977 | Bryant et al. | |
| 4,558,302 A | * 12/1985 | Welch | ........................ 341/51 |
| 4,688,108 A | 8/1987 | Cotton et al. | |
| 4,876,541 A | 10/1989 | Storer | |
| 4,881,075 A | 11/1989 | Weng | |
| 5,003,307 A | 3/1991 | Whiting et al. | |
| 5,016,009 A | 5/1991 | Whiting et al. | |

(Continued)

FOREIGN PATENT DOCUMENTS

| | | |
|---|---|---|
| EP | 0 702 457 | 3/1996 |
| WO | 92/17844 | 10/1992 |
| WO | 95/18997 | 7/1995 |
| WO | 95/19662 | 7/1995 |

OTHER PUBLICATIONS

U.S. patent application Ser. No. 09/239,659, Dye et al., filed Jan. 29, 1999.

(Continued)

Primary Examiner—Howard L. Williams
(74) Attorney, Agent, or Firm—Winstead Sechrest & Minick P.C.; Michael P. Adams; E. E. Jack Richards, II

(57) ABSTRACT

Embodiments of a compression/decompression (codec) system may include a plurality of data compression engines each implementing a different data compression algorithm. A codec system may be designed for the reduction of data bandwidth and storage requirements and for compressing/decompressing data. Uncompressed data may be compressed using a plurality of compression engines in parallel, with each engine compressing the data using a different lossless data compression algorithm. At least one of the data compression engines may implement a parallel lossless data compression algorithm designed to process stream data at more than a single byte or symbol at one time. The plurality of different versions of compressed data generated by the different compression algorithms may be examined to determine an optimal version of the compressed data according to one or more predetermined criteria. A codec system may be integrated in a processor, a system memory controller or elsewhere within a system.

73 Claims, 29 Drawing Sheets

U.S. PATENT DOCUMENTS

| | | |
|---|---|---|
| 5,109,226 A | 4/1992 | MacLean, Jr. et al. |
| 5,126,739 A | 6/1992 | Whiting et al. |
| 5,146,221 A | 9/1992 | Whiting et al. |
| 5,150,430 A * | 9/1992 | Chu .......................... 341/51 |
| 5,155,484 A | 10/1992 | Chambers, IV |
| 5,237,460 A | 8/1993 | Miller et al. |
| 5,237,675 A | 8/1993 | Hannon, Jr. |
| 5,247,638 A | 9/1993 | O'Brien et al. |
| 5,247,646 A | 9/1993 | Osterlund et al. |
| 5,337,275 A | 8/1994 | Garner |
| 5,341,339 A | 8/1994 | Wells |
| 5,353,024 A | 10/1994 | Graybill |
| 5,353,425 A | 10/1994 | Malamy et al. |
| 5,357,614 A | 10/1994 | Pattisam et al. |
| 5,371,499 A | 12/1994 | Graybill et al. |
| 5,379,036 A | 1/1995 | Storer |
| 5,389,922 A * | 2/1995 | Seroussi et al. .............. 341/51 |
| 5,394,534 A | 2/1995 | Kulakowski et al. |
| 5,396,343 A | 3/1995 | Hanselman |
| 5,406,278 A | 4/1995 | Graybill et al. |
| 5,406,279 A | 4/1995 | Anderson et al. |
| 5,412,429 A | 5/1995 | Glover |
| 5,414,425 A | 5/1995 | Whiting et al. |
| 5,414,850 A | 5/1995 | Whiting |
| 5,420,696 A | 5/1995 | Wegeng et al. |
| 5,424,733 A | 6/1995 | Fimoff et al. |
| 5,426,779 A | 6/1995 | Chambers, IV |
| 5,448,577 A | 9/1995 | Wells et al. |
| 5,455,577 A | 10/1995 | Slivka et al. |
| 5,455,943 A | 10/1995 | Chambers, IV |
| 5,459,850 A | 10/1995 | Clay et al. |
| 5,463,390 A | 10/1995 | Whiting et al. |
| 5,465,338 A | 11/1995 | Clay |
| 5,467,087 A | 11/1995 | Chu |
| 5,471,206 A | 11/1995 | Allen et al. |
| 5,477,264 A | 12/1995 | Sarbadhikari et al. |
| 5,479,638 A | 12/1995 | Assar |
| 5,485,526 A | 1/1996 | Tobin |
| 5,504,842 A | 4/1996 | Gentile |
| 5,506,580 A | 4/1996 | Whiting et al. |
| 5,510,840 A | 4/1996 | Yonemitsu et al. |
| 5,526,363 A | 6/1996 | Weiss et al. |
| 5,532,693 A | 7/1996 | Winters et al. |
| 5,532,694 A | 7/1996 | Mayers et al. |
| 5,548,742 A | 8/1996 | Wang et al. |
| 5,553,261 A | 9/1996 | Hasbun |
| 5,559,978 A | 9/1996 | Spilo |
| 5,563,595 A | 10/1996 | Strohacker |
| 5,568,423 A | 10/1996 | Jou et al. |
| 5,572,206 A | 11/1996 | Miller et al. |
| 5,577,248 A | 11/1996 | Chambers, IV |
| 5,584,008 A | 12/1996 | Shimada et al. |
| 5,606,428 A | 2/1997 | Hanselman |
| 5,608,396 A * | 3/1997 | Cheng et al. ................ 341/87 |
| 5,621,403 A | 4/1997 | Reznik |
| 5,627,995 A | 5/1997 | Miller et al. |
| 5,640,529 A | 6/1997 | Hasbun |
| 5,696,912 A | 12/1997 | Bicevskis et al. |
| 5,729,228 A | 3/1998 | Franaszek et al. |
| 5,771,011 A * | 6/1998 | Masenas ...................... 341/51 |
| 5,798,718 A | 8/1998 | Hadady |
| 5,812,817 A | 9/1998 | Hovis et al. |
| 5,828,877 A | 10/1998 | Pearce et al. |
| 5,836,003 A | 11/1998 | Sadeh |
| 5,838,334 A | 11/1998 | Dye |
| 5,874,908 A | 2/1999 | Craft |
| 5,877,711 A | 3/1999 | Craft |
| 5,883,588 A | 3/1999 | Okamura |
| 5,933,104 A | 8/1999 | Kimura |
| 5,936,560 A | 8/1999 | Higuchi |
| 5,945,933 A | 8/1999 | Kalkstein |
| 5,956,372 A | 9/1999 | Vaman et al. |
| 5,973,630 A | 10/1999 | Heath |
| 6,002,411 A | 12/1999 | Dye |
| 6,008,743 A * | 12/1999 | Jaquette ...................... 341/51 |
| 6,145,069 A | 11/2000 | Dye |
| 6,170,047 B1 | 1/2001 | Dye |
| 6,173,381 B1 | 1/2001 | Dye |
| 6,208,273 B1 | 3/2001 | Dye et al. |
| 6,304,197 B1 | 10/2001 | Freking et al. |
| 6,523,102 B1 | 2/2003 | Dye et al. |
| 2001/0031092 A1 * | 10/2001 | Zeck et al. ................. 382/239 |

OTHER PUBLICATIONS

U.S. patent application Ser. No. 09/491,343, Dye et al., filed Jan. 26, 2000.

U.S. patent application Ser. No. 09/818,283, Dye et al., filed Mar. 27, 2001.

U.S. patent application Ser. No. 09/821,785, Dye et al., filed Mar. 28, 2001.

U.S. patent application Ser. No. 09/915,751, Dye et al., filed Jul. 26, 2001.

U.S. patent application Ser. No. 60/307,964, Dye et al., filed Jul. 26, 2001.

U.S. patent application Ser. No. 60/250,177, Dye et al., filed Nov. 29, 2000.

U.S. patent application Ser. No. 10/205,590, Dye et al., filed Jul. 25, 2002.

U.S. patent application Ser. No. 10/044,786, Dye et al., filed Jan. 11, 2002.

Brenza, "Synonym Avoidance Cache," IBM Technical Disclosure Bulletin, vol. 34, No. 1, Jun. 1991, pp. 377–381.

Y. Yabe et al.; "Compression/Decompression DRAM for United Memory Systems: a 16Mb, 200MHz, 90% to 50% Graphics–Bandwidth Reduction Prototype"; Solid–State Circuits Conf., 1998; Digest of Technical Papers; 1998 IEEE Int'l; San Francisco, CA, USA; Feb. 5–7, 1998; NY, NY, USA; IEEE; US: Feb. 5, 1998; pp. 342–343; XP010278670; ISBN 0–7803–4344–1.

M. Kjelso et al.; "Performance evaluation of computer architectures with main memory data compression"; Journal of Systems Architecture; Elsevier Science Publishers Bv.; Amsterdam, NL; vol. 45, No. 8; Feb. 1999; pp. 571–590; XO004153056; ISSN: 1383–7621; p. 574, left–hand column, paragraph 4; p. 580, left–hand column, paragraph 2.

* cited by examiner

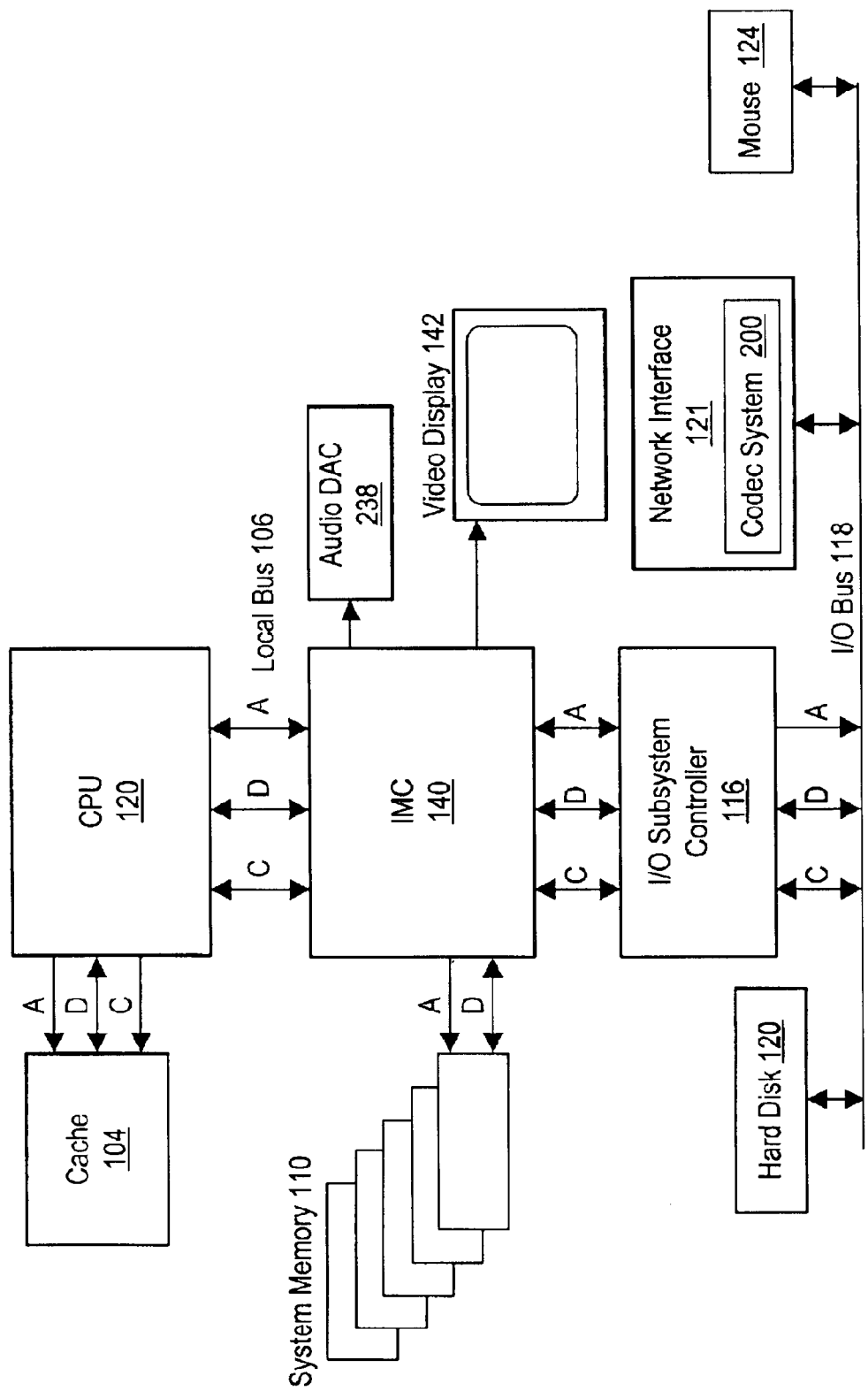

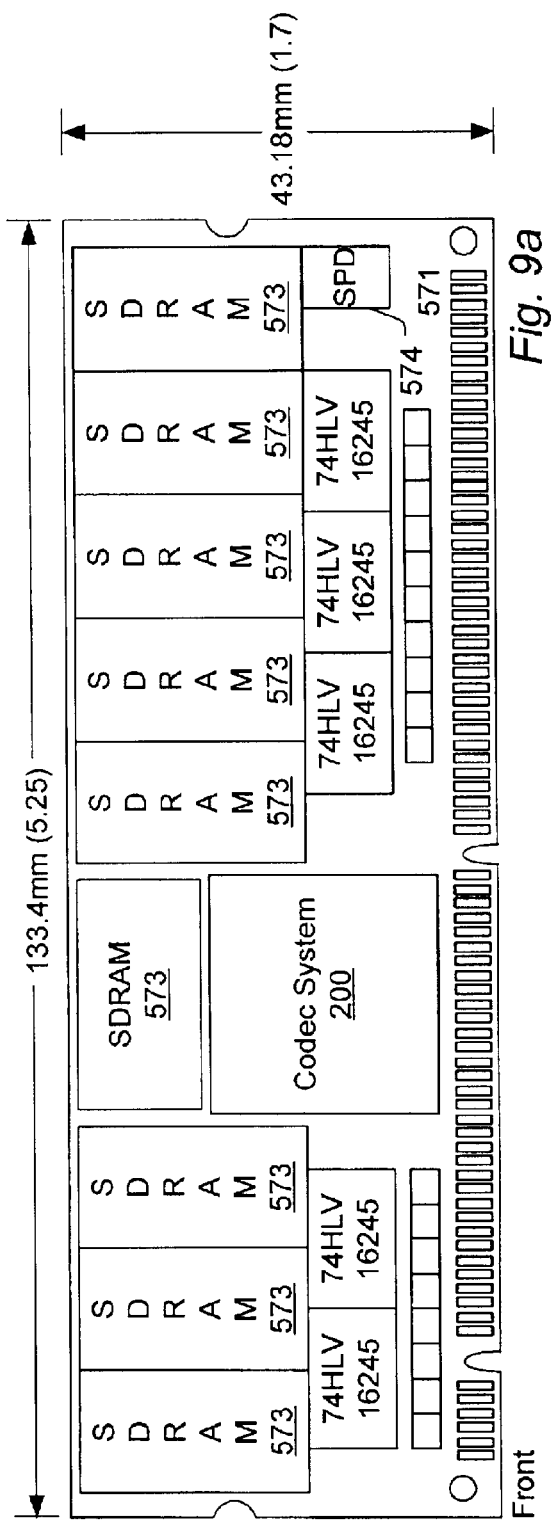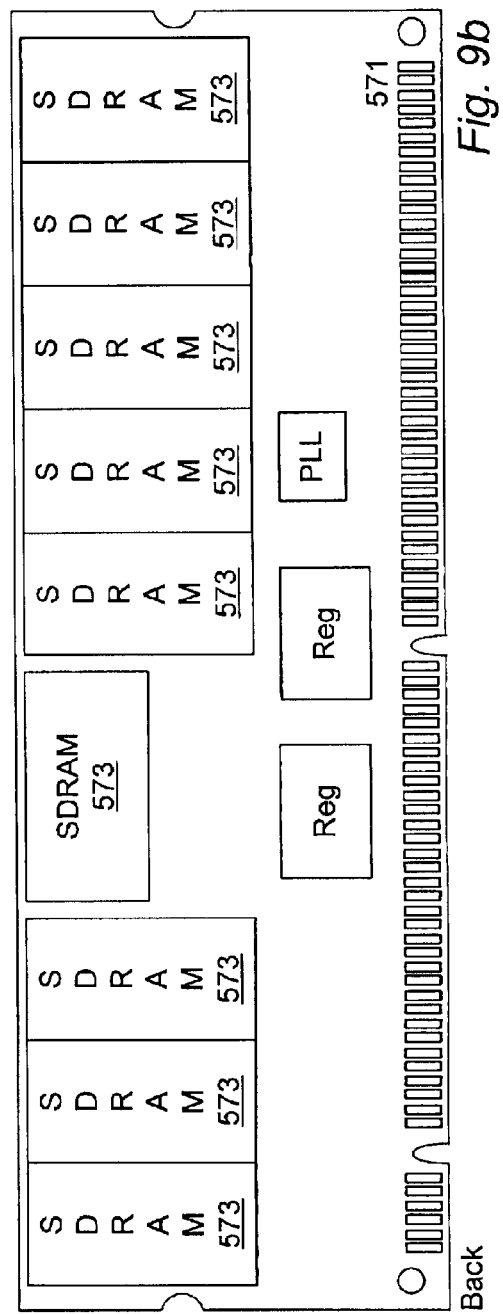

Network Device 130

PDA

| Bytes Compressed | Flag | Index | Count | Data | Bits Used |
|---|---|---|---|---|---|
| 0 | 0 | - | - | 8b | 9 |
| 1 | 10 | 6b | - | - | 8 |
| 2 | 1100 | 6b | - | - | 10 |
| 3 | 1101 | 6b | - | - | 10 |
| 4 | 1110 | 6b | - | - | 10 |
| 5 | 1111000 | 6b | - | - | 13 |
| 6 | 1111001 | 6b | - | - | 13 |
| 7 | 1111010 | 6b | - | - | 13 |
| 8 | 1111011 | 6b | - | - | 13 |
| 9 | 1111100 | 6b | - | - | 13 |
| 10 | 1111101 | 6b | - | - | 13 |
| 11 | 1111110 | 6b | - | - | 13 |
| >11 | 1111111 | 6b | 12b | - | 25 |

Fig. 14

- 4 input bytes, 3 decoders, 4 output bytes

Decompression flowchart

Decompression flowchart

Decompression flowchart

Decompression flowchart

Decompression flowchart

Decompression flowchart

SYSTEM AND METHOD FOR GENERATING OPTIMALLY COMPRESSED DATA FROM A PLURALITY OF DATA COMPRESSION/DECOMPRESSION ENGINES IMPLEMENTING DIFFERENT DATA COMPRESSION ALGORITHMS

CONTINUATION DATA

This application is a continuation-in-part (CIP) of U.S. patent application Ser. No. 09/818,283 titled "SYSTEM AND METHOD FOR PERFORMING SCALABLE EMBEDDED PARALLEL DATA COMPRESSION" filed Mar. 27, 2001, whose inventors were Manuel J. Alvarez II, Peter Geiger, and Thomas A. Dye; which is a continuation-in-part of U.S. patent application Ser. No. 09/421,968 titled "SYSTEM AND METHOD FOR PERFORMING SCALABLE EMBEDDED PARALLEL DATA COMPRESSION" filed Oct. 20, 1999 whose inventors were Manuel J. Alvarez II, Peter Geiger, and Thomas A. Dye, now U.S. Pat. No. 6,208,273; which is a continuation-in-part of U.S. patent application Ser. No. 09/239,659 titled BANDWIDTH REDUCING MEMORY CONTROLLER INCLUDING SCALABLE EMBEDDED PARALLEL DATA COMPRESSION AND DECOMPRESSION ENGINES" filed Jan. 29, 1999 whose inventors were Thomas A. Dye, Manuel J. Alvarez II, and Peter Geiger.

FIELD OF THE INVENTION

The present invention relates to computer system architectures, and more particularly to a system and method for selectively generating compressed data from one of a plurality of data compression engines, wherein each of the data compression engines implement a different data compression algorithm.

DESCRIPTION OF THE RELATED ART

Computer system and memory subsystem architectures have remained relatively unchanged for many years. While memory density has increased and the cost per storage bit has decreased over time, there has not been a significant improvement to the effective operation of the memory subsystem or the software which manages the memory subsystem. The majority of computing systems presently use a software implemented memory management unit which performs virtual memory functions. In a virtual memory system, the non-volatile memory (e.g., hard disk) is used as a secondary memory to provide the appearance of a greater amount of system memory. In a virtual memory system, as system memory becomes full, least recently used (LRU) pages are swapped to the hard disk. These pages can be swapped back to the system memory when needed.

Software-implemented compression and decompression technologies have also been used to reduce the size of data stored on the disk subsystem or in the system memory data. Current compressed data storage implementations use the system's CPU executing a software program to compress information for storage on disk. However, a software solution typically uses too many CPU compute cycles and/or adds too much bus traffic to operate both compression and decompression in the present application(s). This compute cycle problem increases as applications increase in size and complexity. In addition, there has been no general-purpose use of compression and decompression for in-memory system data. Prior art systems have been specific to certain data types. Thus, software compression has been used, but this technique limits CPU performance and has restricted use to certain data types.

Similar problems exist for programs that require multiple applications of software threads to operate in parallel. Software compression does not address heavy loaded or multi-threaded applications, which require high CPU throughput. Other hardware compression solutions have not focused on "in-memory" data (data which reside in the active portion of the memory and software hierarchy). These solutions have typically been I/O data compression devices located away from the system memory or memory subsystem. In general, the usage of hardware compression has been restricted to slow input and output devices usually located at the I/O subsystem, such as the hard drive.

Mainframe computers have used data compression for acceleration and reduction of storage space for years. These systems require high dollar compression modules located away from the system memory and do not compress in-memory data in the same memory subsystem for improved performance. Such high dollar compression subsystems use multiple separate engines running in parallel to achieve compression speeds at super computer rates. Multiple separate, serial compression and decompression engines running in parallel are cost prohibitive for general use servers, workstations, desktops, or mobile units.

Lower cost semiconductor devices have been developed that use compression hardware. However, these devices do not operate fast enough to run at memory speed and thus lack the necessary performance for in-memory data. Such compression hardware devices are limited to serial operation at compression rates that work for slow I/O devices such as tape backup units. The problem with such I/O compression devices, other than tape backup units, is that portions of the data to compress are often too small of a block size to effectively see the benefits of compression. This is especially true in disk and network subsystems. To operate hardware compression on in-memory data at memory bus speeds requires over an order of magnitude more speed than present day state-of-the-art compression hardware.

The amount of system memory available for executing processes within Prior Art computer systems is generally limited by the amount of physical memory installed in the system. It is desirable to provide a method of increasing the effective size of system memory without increasing actual physical memory, and to thus allow processors and/or I/O masters of the system to address more system memory than physically exists. It is also desirable to improve data transfer bandwidth in computer systems. It is also desirable that this method be applicable to other aspects of computer operation such as the transmission and reception of data via a network.

SUMMARY OF THE INVENTION

Embodiments of a compression/decompression (codec) system may include a plurality of data compression engines each implementing a different data compression algorithm. The codec system may be designed for the reduction of data bandwidth and storage requirements and for compressing/decompressing data.

In one embodiment, uncompressed data may be compressed using a plurality of compression engines operating concurrently, i.e., in parallel, with each engine compressing the data using a different lossless data compression algorithm. At least one of the data compression engines may implement a parallel lossless data compression algorithm. In one embodiment each of the data compression engines implements a different parallel lossless data compression engine.

The plurality of different versions of compressed data generated by the different compression algorithms may be examined to determine a "best" or "most qualified" version of the compressed data according to one or more predetermined criteria or metrics. In one embodiment, the version with the highest compression ratio is selected. In another embodiment, the version that compresses the fastest is selected. In another embodiment, the selection examines both time and compression ratio metrics.

In one embodiment, each of the data compression engines implements a parallel lossless data compression algorithm. For example, each of the data compression engines may implement a parallel version of an LZ-based data compression algorithm. In this example, a first compression engine may implement a parallel LZ-based data compression algorithm which uses tag-based encoding, while a second compression engine may implement a parallel LZ-based data compression algorithm which uses "escape" characters to differentiate among compressed and "raw" data characters (and which does not use a tag-based coding scheme). In another embodiment, a first compression engine may implement a parallel LZ-based (or dictionary based) data compression algorithm, a second compression engine may implement a parallel RLE (run length encoding) algorithm, and a third compression engine may implement a parallel Huffman-based encoding scheme.

A codec system as described herein may be included in any of various devices, including a memory controller; memory modules; a processor or CPU; peripheral devices, such as a network interface card, modem, IDSN terminal adapter, ATM adapter, etc.; and network devices, such as routers, hubs, switches, bridges, etc., among others. Where the codec system is included in a device, data transfers to and from the device can thus be in either of two formats, these being compressed or normal (non-compressed). Thus compressed data from system I/O peripherals such as the non-volatile memory, floppy drive, or local area network (LAN) may be decompressed in the device and stored into memory or saved in the memory in compressed format. Thus, data can be saved in either a normal or compressed format, retrieved from the memory for CPU usage in a normal or compressed format, or transmitted and stored on a medium in a normal or compressed format.

Embodiments of a parallel compression engine as described herein may implement an improved system and method for performing parallel data compression designed to process stream data at more than a single byte or symbol (character) at one time. The parallel compression engine may examine a plurality of symbols in parallel, thus providing greatly increased compression and decompression performance. More specifically, a parallel compression engine may operate to examine each of a plurality of symbols with each of a plurality of entries in a history buffer concurrently, i.e., in a single clock cycle. The codec system may also include a parallel decompression engine that operates to examine a plurality of compressed symbols concurrently, i.e., in a single clock cycle and may operate to produce a plurality of decompressed symbols concurrently, i.e., per clock cycle. These parallel compression and decompression engines may be referred to herein as parallel codec engines. In one embodiment, the parallel compression and decompression engines may implement a modified single stream dictionary based (or history table based) data compression and decompression method, such as an LZ based method, to provide a scalable, high bandwidth compression and decompression operation.

The integrated data compression and decompression capabilities of the codec system removes system bottlenecks and increases performance. This allows lower cost systems due to smaller data storage requirements and reduced bandwidth requirements. This also increases system bandwidth and hence increases system performance. Thus the present invention provides a significant advance over the operation of current devices, such as memory controllers, memory modules, processors, and network devices, among others.

BRIEF DESCRIPTION OF THE DRAWINGS

A better understanding of the present invention can be obtained when the following detailed description of the preferred embodiment is considered in conjunction with the following drawings, in which:

FIG. 8e illustrates a computer system having a network interface device including the codec system according to one embodiment;

FIGS. 9a and 9b illustrate a memory module including the codec system according to one embodiment;

FIG. 14 is a table illustrating the header information presented to a lossless decompression engine according to one embodiment;

DETAILED DESCRIPTION OF THE PREFERRED EMBODIMENT

Incorporation by Reference

U.S. Pat. No. 6,208,273 titled "System and Method for Performing Scalable Embedded Parallel Data Compression", whose inventors are Thomas A. Dye, Manuel J. Alvarez II, and Peter Geiger, and which issued on Mar. 27, 2001, is hereby incorporated by reference in its entirety as though fully and completely set forth herein.

U.S. Pat. No. 6,145,069 titled "Parallel Decompression and Compression System and Method for Improving Storage Density and Access Speed for Non-volatile Memory and Embedded Memory Devices", whose inventor is Thomas A. Dye, and which issued on Nov. 7, 2000, is hereby incorporated by reference in its entirety as though filly and completely set forth herein.

U.S. Pat. No. 6,173,381 titled "Memory Controller Including Embedded Data Compression and Decompression Engines", whose inventor is Thomas A. Dye, and which issued on Jan. 9, 2001, is hereby incorporated by reference in its entirety as though fully and completely set forth herein.

U.S. patent application Ser. No. 09/239,659 titled "Bandwidth Reducing Memory Controller Including Scalable Embedded Parallel Data Compression and Decompression Engines" and filed Jan. 29, 1999, whose inventors are Thomas A. Dye, Manuel J. Alvarez II, and Peter Geiger, is hereby incorporated by reference in its entirety as though fully and completely set forth herein.

U.S. patent application Ser. No. 09/491,343 titled "System and Method for Performing Scalable Embedded Parallel Data Decompression" and filed Jan. 26, 2000, whose inventors are Thomas A. Dye, Manuel J. Alvarez II, and Peter Geiger, is hereby incorporated by reference in its entirety as though fully and completely set forth herein.

U.S. patent application Ser. No. 09/818,283 titled "System And Method For Performing Scalable Embedded Parallel Data Compression", and filed Mar. 27, 2001, whose inventors are Manuel J. Alvarez II, Peter Geiger and Thomas A. Dye, is hereby incorporated by reference in its entirety as though fully and completely set forth herein.

U.S. patent application Ser. No. 09/821,785 titled "System And Method For Performing Scalable Embedded Parallel Data Decompression", and filed Mar. 28, 2001, whose inventors are Manuel J. Alvarez II, Peter Geiger and Thomas A. Dye, is hereby incorporated by reference in its entirety as though fully and completely set forth herein.

U.S. patent application Ser. No. 09/915,751 titled "System And Method For Managing Compression And Decompression Of System Memory In A Computer System", and filed Jul. 26, 2001, whose inventors are Peter Geiger, Manuel J. Alvarez II, and Thomas A. Dye, is hereby incorporated by reference in its entirety as though fully and completely set forth herein.

Parallel Compression/Decompression Engines in Parallel

Figure 1:
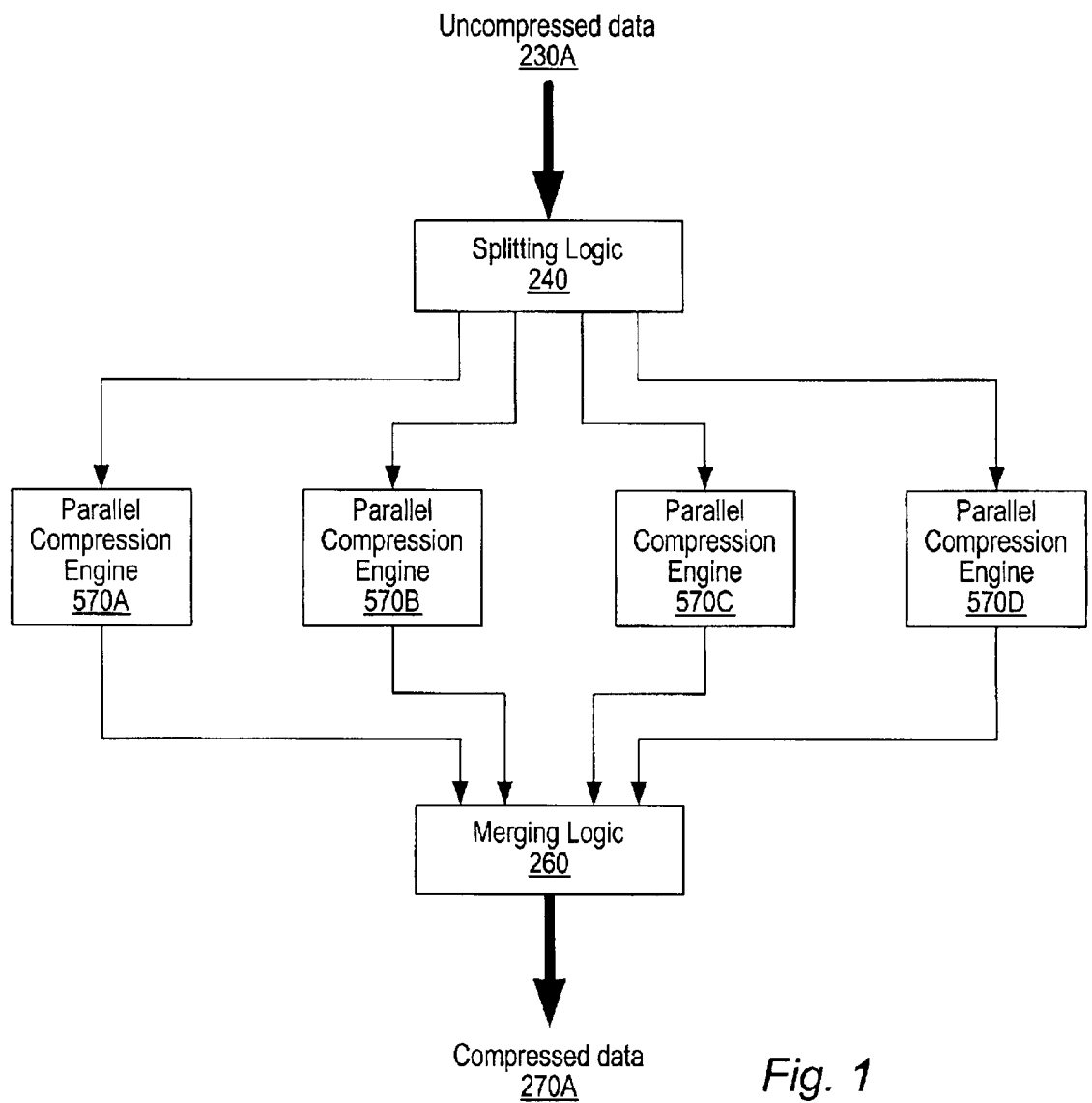
FIG. 1 illustrates the compression of uncompressed data using a plurality of parallel compression engines in parallel according to one embodiment.
Figure 12:
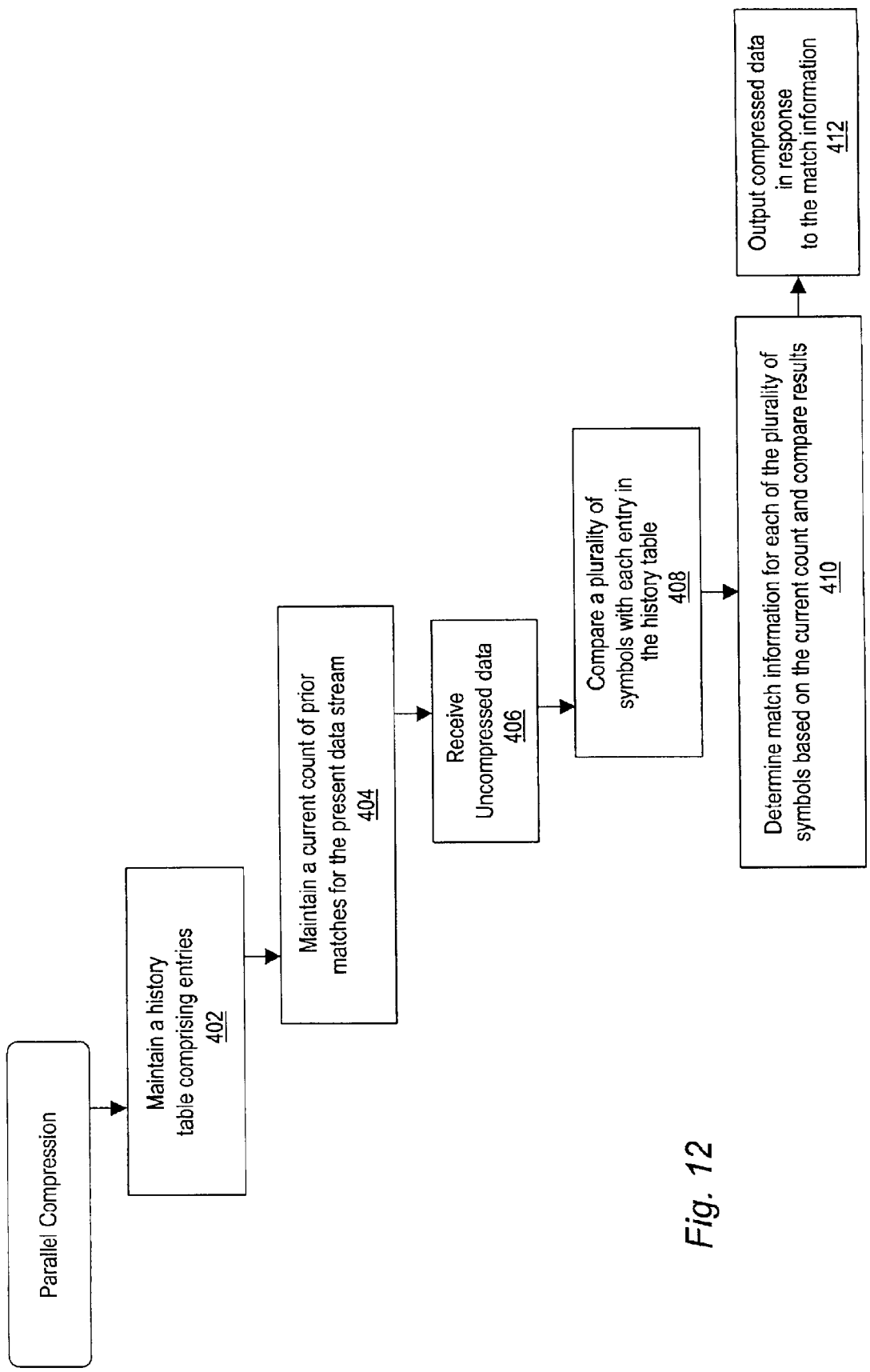
FIG. 12 is a high-level flowchart diagram illustrating operation of a parallel compression engine according to one embodiment.
Figure 13:
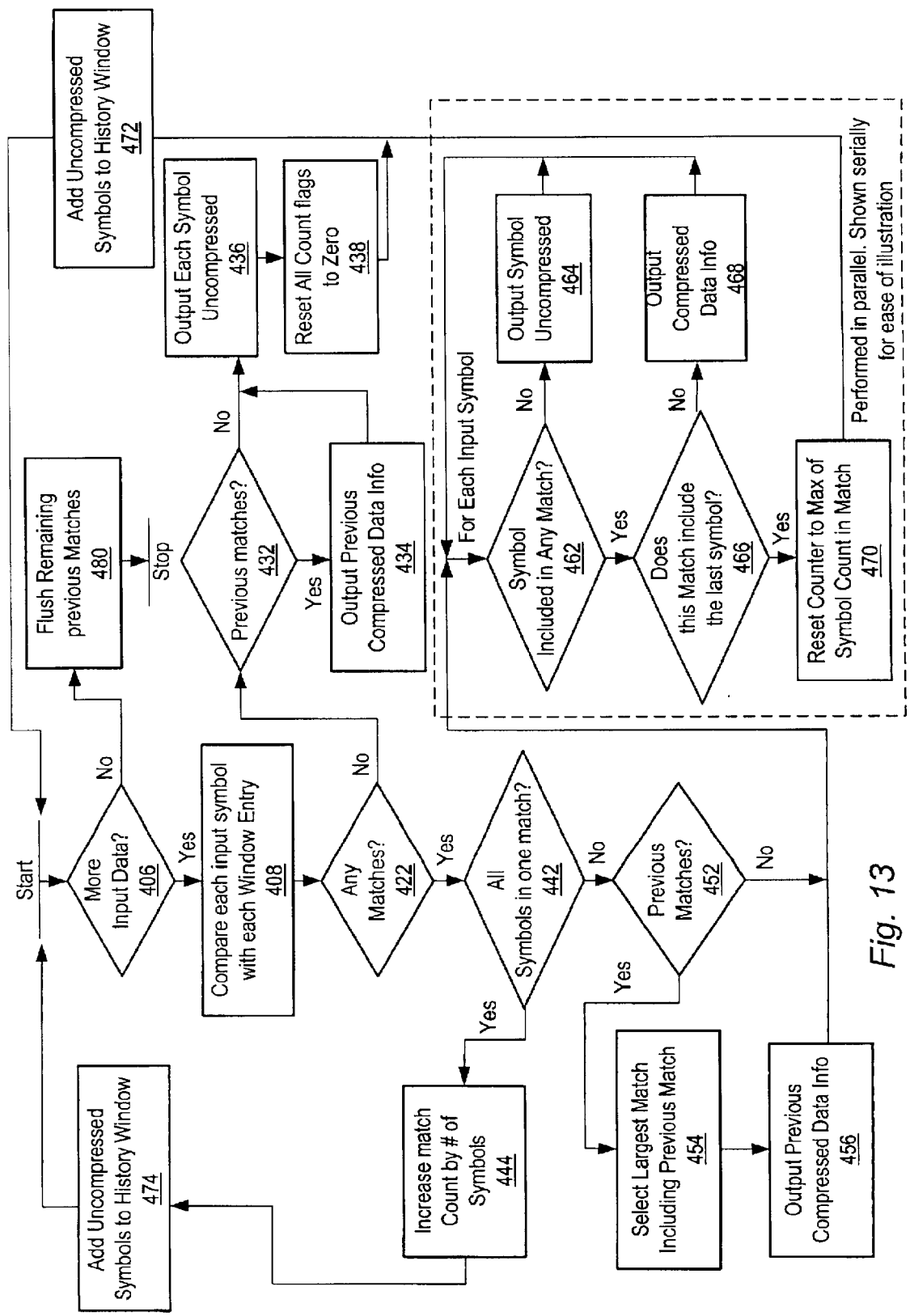
FIG. 13 is a more detailed flowchart diagram illustrating operation of the parallel compression engine according to one embodiment.

FIG. 1 illustrates the compression of uncompressed data using a plurality of parallel compression engines (also called slices) operating in parallel according to one embodiment. The plurality of compression engines 570 may each implement a parallel lossless data compression algorithm. An example of a compression engine that implements a parallel lossless data compression algorithm and that may be used in one embodiment is illustrated in FIGS. 12–13 and further described in U.S. Pat. No. 6,208,273 titled "System and Method for Performing Scalable Embedded Parallel Data Compression" which was previously incorporated herein by reference.

In one embodiment of FIG. 1, each of the plurality of parallel compression engines 570A–D implements the same parallel compression algorithm. In another embodiment of FIG. 1, each of the plurality of parallel compression engines produces compressed data in the same format, thus allowing the compressed data streams from each engine 570 to be combined to create a single compressed data stream.

In one embodiment, data compression system may include splitting logic 240, a plurality of compression engines 570 coupled to outputs of splitting logic 240, and merging logic 260 coupled to outputs of the plurality of compression engines 570. FIG. 1 shows four compression engines, although a greater or lesser number (two or more) may be used.

In one embodiment, the data compression system or logic may comprise a single engine. In another embodiment, the splitting logic 240, plurality of compression engines 570, and merging logic 260 may be located in different components of a computer system or computing appliance. The various components shown in FIG. 1 may be implemented in hardware, in software or in a combination of hardware and software. In one embodiment, the data compression system may further include one or more data decompression engines and may be referred to as compression/decompression (codec) logic.

A system that includes the data compression logic as illustrated in FIG. 1 may have uncompressed data 230A that needs to be compressed. Uncompressed data 230A may come from any of various sources, for example, from system memory, from non-volatile storage (e.g. a hard drive) or from another device or Input/Output (I/O) port (e.g. a network interface). Uncompressed data 230A may be a unit of data (such as a page of memory or a file) or a stream of data. Uncompressed data 230A may be provided to an input of splitting logic 240. Splitting logic 240 may divide the uncompressed data 230A into a plurality of parts or portions of the uncompressed data 230A, with one portion for each of the plurality of compression engines 570 coupled to splitting logic 240. Splitting logic 240 may then provide the plurality of portions of the uncompressed data 230A to the plurality of compression engines 570.

Each of the plurality of compression engines 570 may then compress the particular portion of the uncompressed data 230A that was provided to it by splitting logic 240 to produce a compressed portion of the original uncompressed data 230A. The plurality of compression engines 570 thus may compress the plurality of portions of the uncompressed data 230A to produce a plurality of compressed portions of the original uncompressed data 230A. In one embodiment, the plurality of compression engines 570 may perform the compression operation on the plurality of portions of the uncompressed data 230A in a parallel fashion. In other words, the compression of the plurality of portions of the uncompressed data 230A by the plurality of compression engines 570 may occur concurrently.

In addition, since each of the individual compression engines 570A, 570B, 570C and 570D is a parallel compression engine, each parallel compression engine 570A, 570B, 570C and 570D operates to compress a plurality of symbols concurrently, i.e., each parallel compression engine may operate to compress a plurality of symbols per clock cycle. In one embodiment, each engine may operate to compare a plurality of symbols with each of a plurality of entries in a history buffer concurrently, i.e., in a single clock cycle. In one embodiment, each parallel compression engine 570A, 570B, 570C and 570D has its own history buffer. In another embodiment, the plurality of parallel compression engines 570A, 570B, 570C and 570D share a common history buffer.

The plurality of compression engines 570 may output the plurality of compressed portions of data 230A to merging logic 260. In one embodiment, merging logic 260 may multiplex the plurality of compressed portions to produce compressed data 270A, which is a compressed version of the input uncompressed data 230A. In this embodiment, the merging logic 260 may order the compressed portions of the data in compressed data 270A in the same order as the original uncompressed portions of the data from which they were generated. For example, if uncompressed data 230A is a data stream, merging logic 260 may output a compressed data stream corresponding to the uncompressed data stream. As another example, if uncompressed data 230A is a page or a file, merging logic 260 may output a compressed page or compressed file. In another embodiment, the compressed portions of the data may be output as compressed data 270A from merging logic 260 in a different order from the original order of the uncompressed portions of the data 230A from which they were generated.

Depending upon the particular function for which the data compression logic is being used, compressed data 270A may be written to volatile memory (e.g. system memory), non-volatile memory (e.g. a disk drive), or alternatively may be written to a bus, device, or I/O port (e.g. a network interface).

In some cases, the entire uncompressed data 230A (whether a unit or a stream) may not be compressed in one pass using the data compression logic. In one embodiment, parts of the uncompressed data may be compressed by the data compression logic in a pipelined fashion. In other words, the data compression logic may receive a first part of uncompressed data 230A, break the first part into a first plurality of portions, and compress the first plurality of portions and output a compressed first part. While the compression of the first part is being performed, a second part of the uncompressed data may be received. This process may continue until the entire uncompressed data 230A is compressed.

Figure 2:
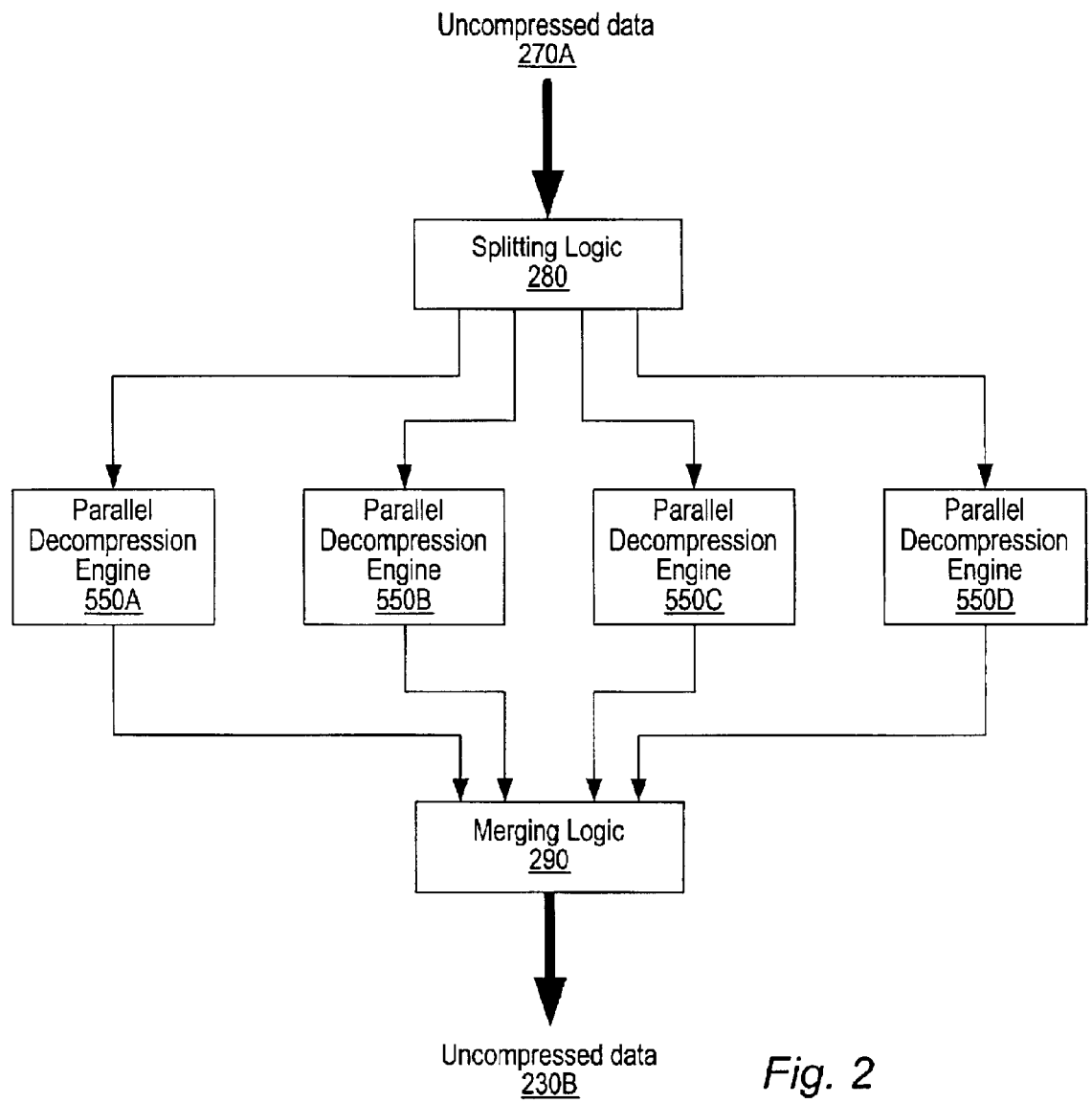
FIG. 2 illustrates the decompression of compressed data using a plurality of parallel decompression engines in parallel according to one embodiment.

FIG. 2 illustrates the decompression of compressed data using a plurality of parallel decompression engines operating concurrently or in parallel according to one embodiment. The plurality of decompression engines 550 may each implement a parallel lossless data decompression algorithm. An example of a decompression engine that implements a parallel lossless data decompression algorithm that may be used in one embodiment is illustrated in FIGS. 14–23f. In one embodiment of FIG. 2, each of the plurality of parallel decompression engines 550A–D implements the same parallel decompression algorithm.

In one embodiment, data decompression system or logic may include splitting logic 280, a plurality of decompression engines 550 coupled to outputs of splitting logic 280, and merging logic 290 coupled to outputs of the plurality of decompression engines 550. FIG. 2 shows four decompression engines, although a greater or lesser number (two or more) may be used.

In one embodiment, the data decompression system or logic may comprise a single engine. In another embodiment, the splitting logic 280, plurality of decompression engines 550, and merging logic 290 may be located in two or more different components of a computer system or computing appliance. The components shown in FIG. 2 may be implemented in hardware, in software or in a combination of hardware and software. In one embodiment, the data decompression logic may further include one or more data compression engines and may be referred to as compression/decompression (codec) logic.

A system that includes the data decompression logic as illustrated in FIG. 2 may have compressed data 270B that needs to be decompressed. Compressed data 270B may come from any of various sources, for example, from system memory, from non-volatile storage (e.g. a hard drive) or from another device or Input/Output (I/O) port (e.g. a network interface). Compressed data 270B may be a unit of data (such as a page of memory or a file) or a stream of data. Compressed data 270B may be provided to an input of splitting logic 280. Splitting logic 280 may divide the compressed data 270B into a plurality of parts or portions of the compressed data 270B, with one portion for each of the plurality of decompression engines 550 coupled to splitting logic 280. Splitting logic 280 may then provide the plurality of portions of the compressed data 270B to the plurality of decompression engines 550.

Each of the plurality of decompression engines 550 may then decompress the particular portion of the compressed data 270B that was provided to it by splitting logic 280 to produce an uncompressed portion of the original compressed data 270B. The plurality of decompression engines 550 thus may decompress the plurality of portions of compressed data 270B to produce a plurality of uncompressed portions of the original compressed data 270B. In one embodiment, the plurality of decompression engines 550 may perform the decompression operation on the plurality of portions of the compressed data 270B in a parallel fashion. In other words, the decompression of the plurality of portions of the compressed data 270B by the plurality of decompression engines 550 may occur concurrently.

In addition, since each of the individual decompression engines 550A, 550B, 550C and 550D is a parallel decompression engine, each parallel decompression engine 550A, 550B, 550C and 550D operates to decompress a plurality of symbols concurrently, i.e., each parallel compression engine may operate to decompress a plurality of symbols per clock cycle.

In one embodiment, each parallel decompression engine 550A, 550B, 550C and 550D has its own history buffer. In another embodiment, the plurality of parallel decompression engines 550A, 550B, 550C and 550D share a common history buffer.

The plurality of decompression engines 550 may output the plurality of uncompressed portions of data 270B to merging logic 290. Merging logic 290 may multiplex the plurality of uncompressed portions to produce uncompressed data 230B, which is a decompressed version of the input compressed data 270B. Merging logic 290 may order the uncompressed portions of the data in uncompressed data 230B in the same order as the original compressed portions of the data from which they were generated. For example, if compressed data 270B is a data stream, merging logic 290 may output a corresponding uncompressed data stream. As another example, if compressed data 270B is a compressed page or file, merging logic 290 may output an uncompressed page or file.

Depending upon the particular function for which the data decompression logic is being used, uncompressed data 230B may be written to volatile memory (e.g. system memory), non-volatile memory (e.g. a disk drive), may be provided to a processor such as a Central Processing Unit (CPU), or alternatively may be written to a bus, device, or I/O port (e.g. a network interface).

In some cases, the entire compressed data 270B (whether a unit or a stream) may not be decompressed in one pass using the data decompression logic. In one embodiment, parts of the compressed data may be decompressed by the data decompression logic in a pipelined fashion. In other words, the data decompression logic may receive a first part of compressed data 270B, break the first part into a first plurality of portions, and decompress the first plurality of portions and output an uncompressed first part. While the decompression of the first part is being performed, a second part of the compressed data may be received. This process may continue until the entire compressed data 270B is decompressed.

The embodiments described in FIGS. 1 and 2 are described as including compression and decompression engines implementing parallel lossless compression/decompression algorithms. Note that other embodiments are possible and contemplated that may include multiple parallel compression and/or decompression engines implementing one of several lossy compression algorithms for image, video, sound, or other types of data.

Figure 3:
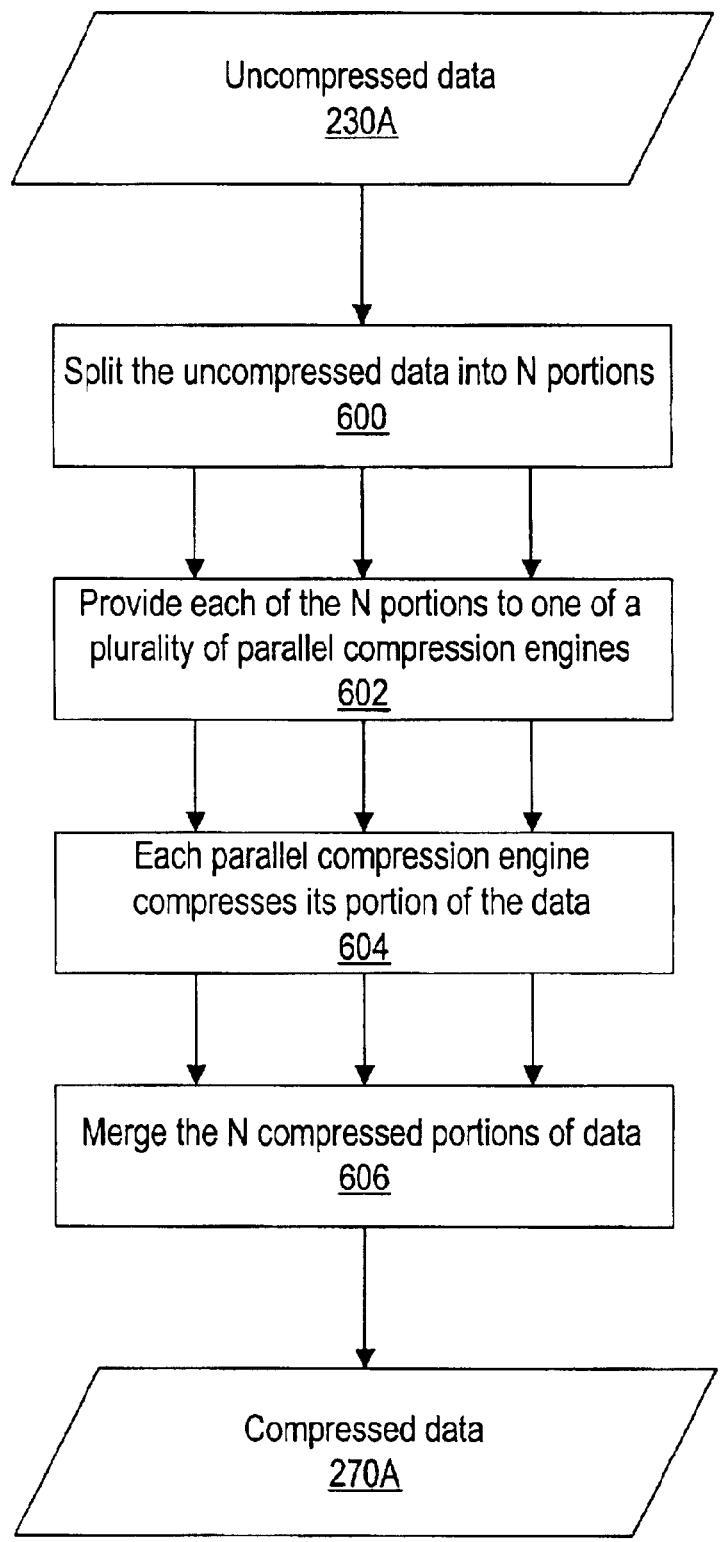
FIG. 3 is a flowchart illustrating one embodiment of a method of splitting uncompressed data among a plurality of parallel compression engines to produce compressed data.

FIG. 3 is a flowchart illustrating one embodiment of a method of splitting uncompressed data among a plurality of parallel compression engines to produce compressed data. The plurality of compression engines may each implement a parallel lossless data compression algorithm. Uncompressed data 230A may be received and split into a plurality of portions as indicated at 600. Assuming there are N parallel compression engines available, the uncompressed data may be split into N portions. Each of the portions of the uncompressed data may then be provided to a different one of the N parallel compression engines as indicated at 602. Each of the N parallel compression engines then compresses its portion of the uncompressed data as indicated at 604. The N compression engines thus compress the N portions of uncompressed data to produce N portions of compressed data. The N portions of compressed data are then merged to produce the compressed data 270 as indicated at 606. This operation may repeat one or more times until all uncompressed data 240A has been compressed.

Figure 4:
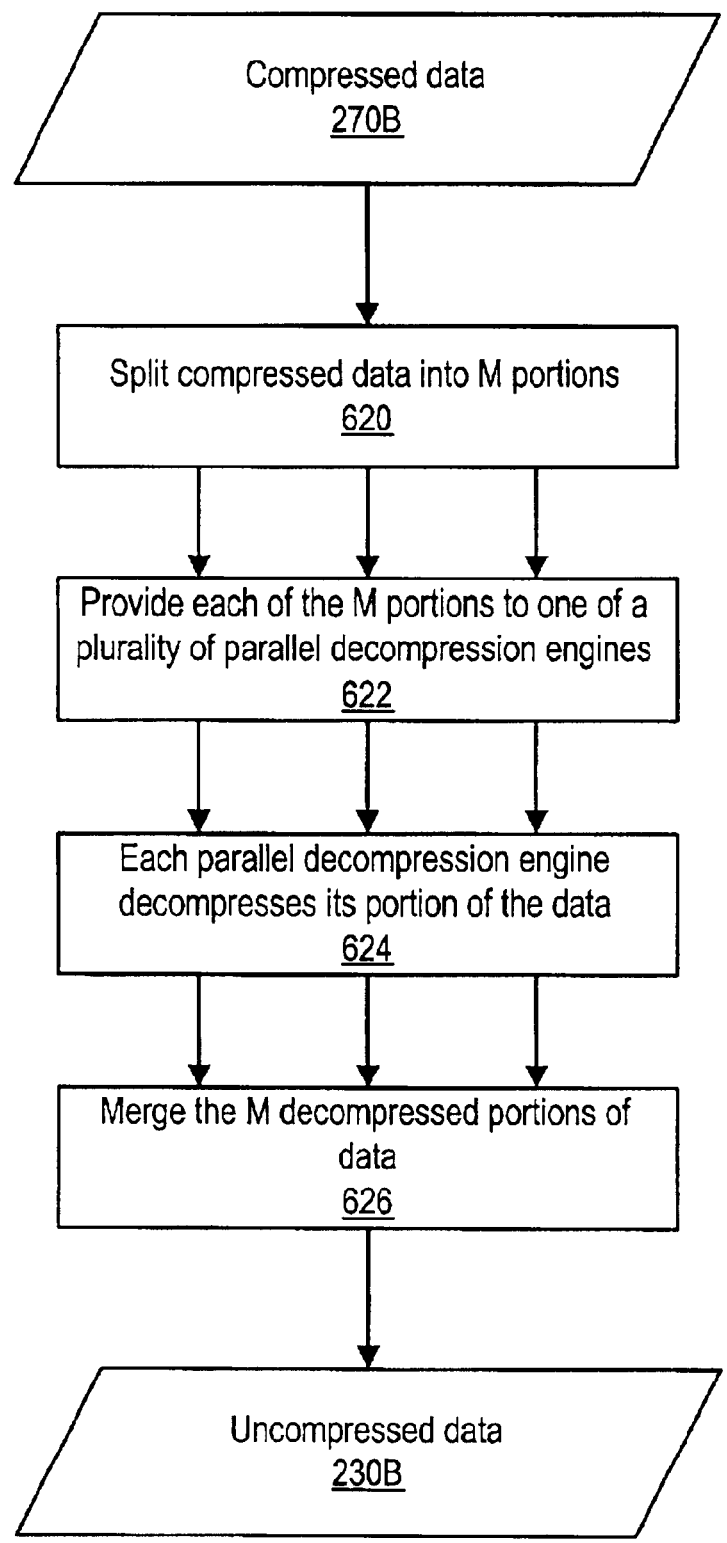
FIG. 4 is a flowchart illustrating one embodiment of a method of splitting compressed data among a plurality of parallel decompression engines to produce uncompressed data.

FIG. 4 is a flowchart illustrating one embodiment of a method of splitting compressed data among a plurality of parallel decompression engines to produce uncompressed data. The plurality of decompression engines 570 may each implement a parallel lossless data decompression algorithm. Compressed data 270A may be received and split into a plurality of portions as indicated at 620. Assuming there are M parallel decompression engines available, the compressed data may be split into M portions. Each of the portions of the compressed data may then be provided to a different one of the M parallel decompression engines as indicated at 622. Each of the M parallel decompression engines then decompresses its portion of the compressed data as indicated at 624. The M decompression engines thus compress the M portions of compressed data to produce M portions of uncompressed data. The M portions of uncompressed data are then merged to produce the uncompressed data 270 as indicated at 626. This operation may repeat one or more times until all compressed data 270B has been decompressed.

Figure 5:
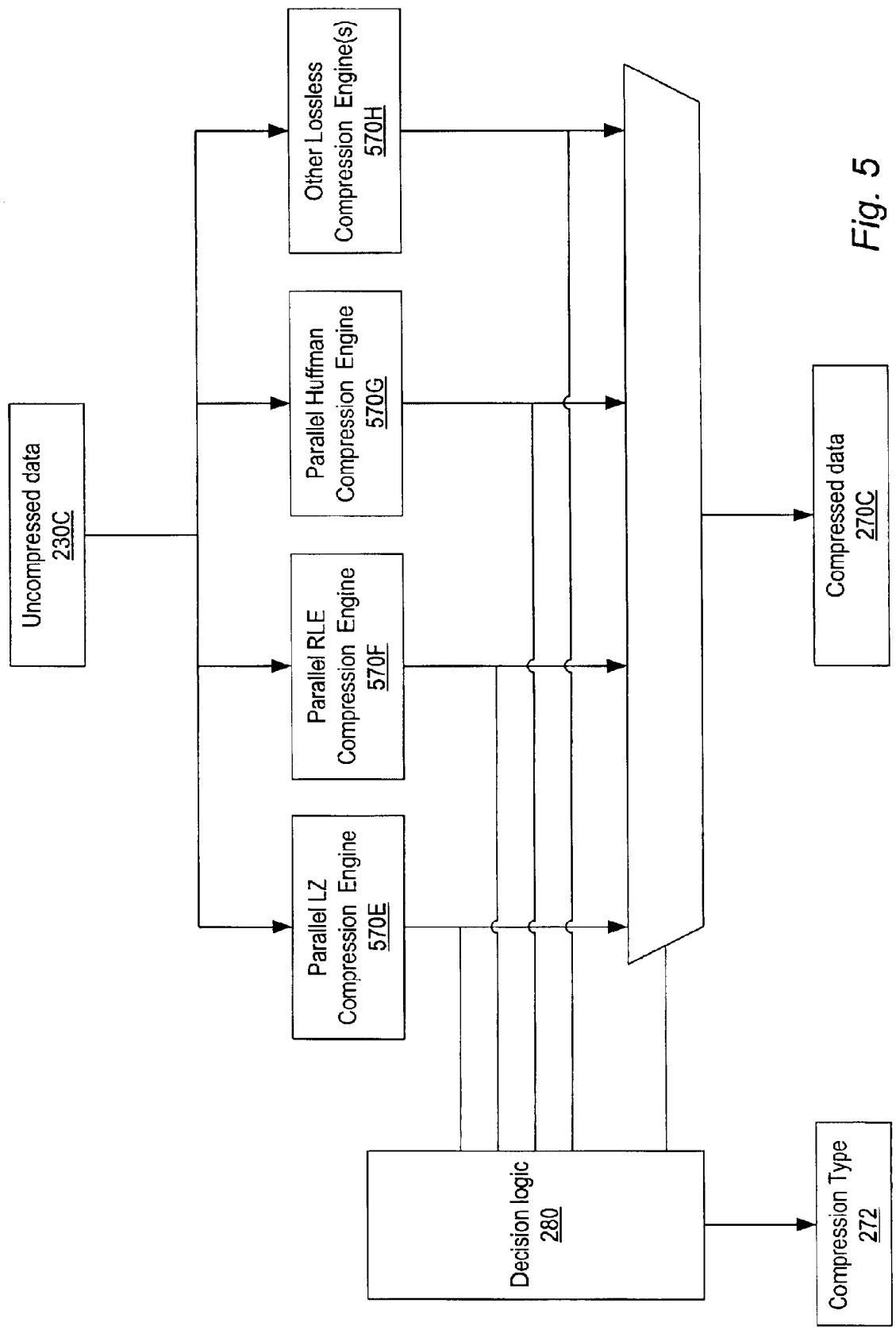
FIG. 5 illustrates the concurrent compression of uncompressed data by a plurality of compression engines implementing different lossless data compression algorithms and the selection of one of the compressed outputs as the optimal compressed data based on one or more criteria according to one embodiment.

Compressing Data with Different Engines in Parallel to Determine Best Compression FIG. 5 illustrates the concurrent compression of uncompressed data by a plurality of compression engines implementing different lossless data compression algorithms and the selection of one of the compressed outputs as the "best" or "selected" compressed data based on one or more criteria or metrics according to one embodiment. The plurality of compression engines 570 may include one or more compression engines implementing different parallel compression algorithms. These engines may include, but are not limited to, a parallel Lempel-Ziv (LZ) compression engine, a parallel run-length encoding (RLE) compression engine, and a parallel Huffman compression engine, among others. An example of a compression engine that implements a parallel lossless data compression algorithm and that may be used in one embodiment is illustrated in FIGS. 12–13 and further described in U.S. Pat. No. 6,208,273 titled "System and Method for Performing Scalable Embedded Parallel Data Compression", which was previously incorporated herein by reference.

In one embodiment, each of the parallel compression engines may implement a different type of parallel dictionary based (or LZ-based) compression. For example, a first parallel compression engine may implement a parallel LZ compression scheme according to or similar to U.S. Pat. No. 6,208,273 using tag-based encoding techniques, wherein tag bits are used to differentiate among compressed and "raw" (uncompressed) data characters or symbols. In this example, a second parallel compression engine may implement a parallel LZ compression scheme according to or similar to U.S. Pat. No. 6,208,273 using an escape character (or sequence) to indicate the beginning of (or differentiate between) compressed and "raw" data streams (and not using tag-based encoding techniques), etc. A third parallel compression engine may implement a parallel LZ compression scheme according to or similar to U.S. Pat. No. 6,208,273, wherein the history buffer is pre-loaded with all 256 possible symbols, and thus all received data is compressed (with a pointer to a previous entry in the history buffer). In this third parallel compression engine, tags or escape characters are not required to differentiate among compressed and raw data characters, as all characters or symbols are compressed (with a pointer to a previous entry in the history buffer).

In one embodiment, the plurality of compression engines 570 may include one or more compression engines implementing different serial data compression algorithms. In another embodiment, at least one of the plurality of compression engines may be a data compression system as illustrated in FIG. 1 for performing parallel data compression using a plurality of parallel compression engines operating concurrently or in parallel. In another embodiment, at least one of the plurality of compression engines may comprise a plurality of serial compression engines operating concurrently or in parallel.

In one embodiment, data compression system or logic may comprise a plurality of compression engines 570 and decision logic 280 coupled to outputs of the plurality of compression engines 570. In one embodiment, the data compression logic may be comprised as a single unit or system. In another embodiment, the plurality of compression engines 570 and decision logic 280 may be comprised in different components of a computer system or computing appliance. The components shown in FIG. 5 may be implemented in hardware, in software or in a combination of hardware and software. In one embodiment, the data compression logic may further include one or more data decompression engines and may be referred to as compression/decompression (codec) logic.

A system that includes the data compression logic as illustrated in FIG. 5 may have uncompressed data 230C that needs to be compressed. Uncompressed data 230C may come from any of various sources, for example, from system memory, from non-volatile storage (e.g. a hard drive) or from another device or Input/Output (I/O) port (e.g. a network interface). Uncompressed data 230C may be a unit of data (such as a page of memory or a file) or a stream of data.

Uncompressed data 230C may be provided to the data compression logic for compression. The data compression logic may send uncompressed data 230C to each of the plurality of data compression engines 570. Each of the plurality of data compression engines 570 may compress the uncompressed data 230C according to its respective compression algorithm to produce and output a compressed version of uncompressed data 230C. Each compression engine 570E, 570F, 570G and 570H may receive and compress the same data 230C. Also, each compression engine 570E, 570F, 570G and 570H may use a different compression algorithm. Decision logic 280 may then select one of the versions to be the compressed data 230C output by the data compression logic.

In one embodiment, decision logic 280 may examine one or more metrics related to the plurality of compressed versions of uncompressed data 230C to determine which of the versions of uncompressed data 230C is the "best" or "most qualified" version. The determined most qualified compressed version of the uncompressed data 230C may then be output as the compressed data 270C. In one embodiment, the metric that decision logic 280 examines may be the compression ratio of each of the plurality of compressed versions of the uncompressed data 230C. The version with the highest compression ratio may be selected as the "best" or most qualified version. In another embodiment, the decision logic 280 selects the compression engine that completes first (i.e., the first engine to finish compressing the data), regardless of compression ratio. Thus, in this embodiment the metric is compression time. In another embodiment, the decision logic 280 considers both compression ratio and compression time in selecting the compression algorithm to be used.

To decompress the compressed data 270C, it is necessary to know the compression algorithm that was used to compress the data. Therefore, in one embodiment, decision logic 280 may also output compression information that may indicate the compression type 272. In one embodiment, compressed data 270C may include one or more headers, and the compression type 272 may be written to at least one of the headers. In one embodiment, if the compressed data is a page of memory, then a page translation entry associated with the compressed page may be marked to indicate the particular compression algorithm used in compressing the page.

Depending upon the particular function for which the data compression logic is being used, compressed data 270C, along with compression type 272, may be written to volatile memory (e.g. system memory), non-volatile memory (e.g. a disk drive), or alternatively may be written to a bus, device, or I/O port (e.g. a network interface).

In some cases, the entire uncompressed data 230 (whether a unit or a stream) may not be compressed in one pass using the data compression logic. The data compression logic may receive a first part of uncompressed data 230, pass the first part to each of the plurality of compression engines, and compressed using the plurality of different compression algorithms implemented by the different compression engines. A most qualified compressed first part of uncompressed data 230 may then be selected. In one embodiment, the data compression logic may learn and remember the particular compression algorithm used to compress the first part of the uncompressed data 230. Subsequent parts of the uncompressed data 230, when received, may be routed to a compression engine implementing the same compression algorithm, and not to the other compression engines implementing other compression algorithms. Thus, all of the parts of the uncompressed data 230 may be compressed using the same compression algorithm. In one embodiment, the parts of uncompressed data 230 may be received and decompressed in a pipelined fashion.

Figure 6:
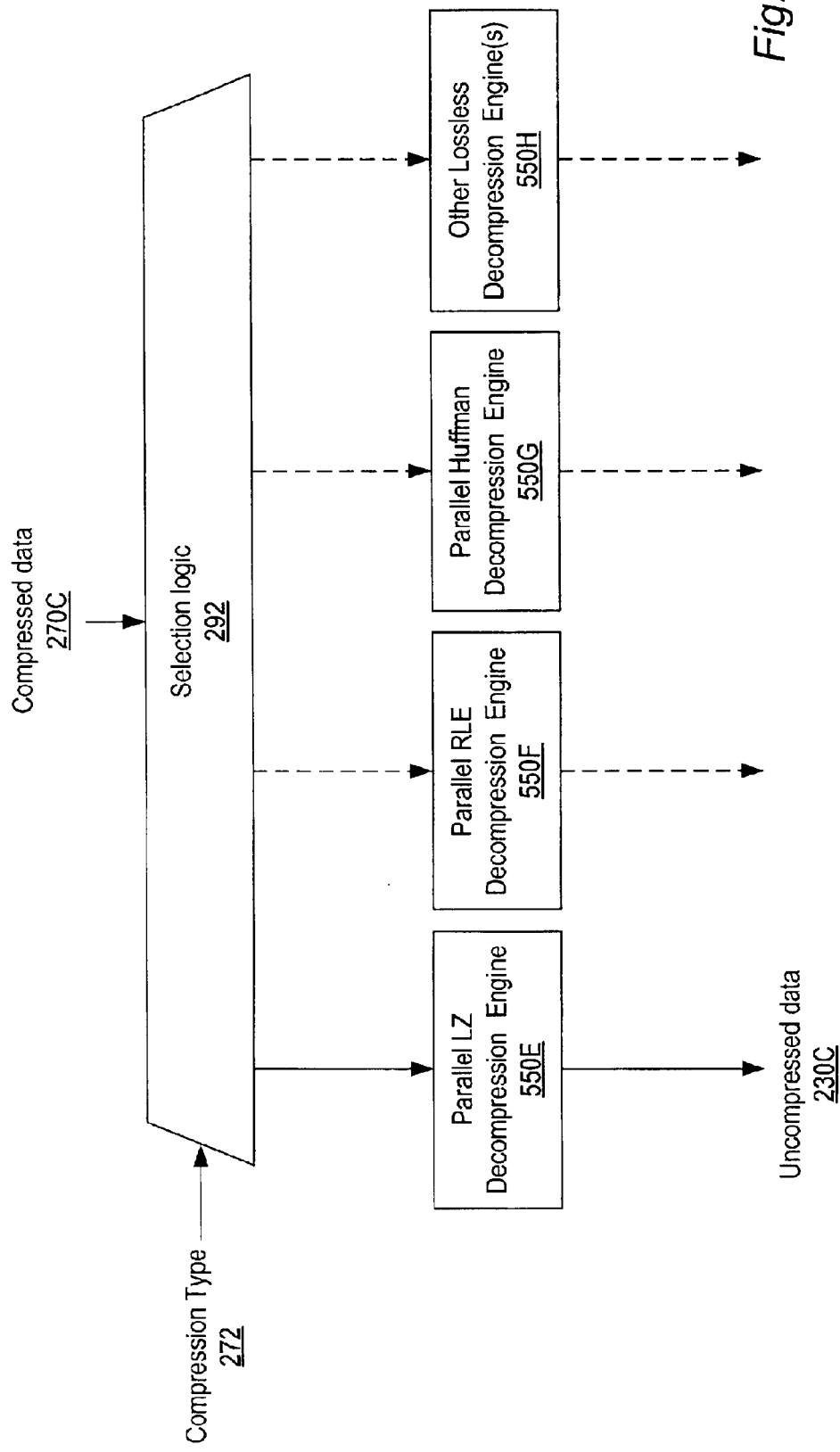
FIG. 6 illustrates the decompression of compressed data by one of a plurality of decompression engines implementing different data decompression algorithms according to one embodiment.

FIG. 6 illustrates the decompression of compressed data by one of a plurality of decompression engines 550 implementing different data decompression algorithms according to one embodiment. For the decompression operation, the choice of decompression engine and associated decompression algorithm to be used is directly determined by the compression format of the compressed data stream 270C. For example, the choice of decompression engine and associated decompression algorithm may be determined by the choice of compression engine and associated compression algorithm in FIG. 5.

The plurality of decompression engines 550 may include one or more decompression engines implementing different parallel decompression algorithms. These engines may include, but are not limited to, a parallel Lempel-Ziv (LZ)

decompression engine, a parallel run-length encoding (RLE) decompression engine, and a parallel Huffman decompression engine, among others. An example of a decompression engine that implements a parallel lossless data decompression algorithm that may be used in one embodiment is illustrated in FIGS. 14–23*f*.

In one embodiment, each of the parallel decompression engines may implement a different type of parallel dictionary based (or LZ-based) decompression. For example, a first parallel decompression engine may implement a parallel LZ decompression scheme for decompressing a compressed stream that was compressed using tag-based encoding techniques, wherein tag bits are used to differentiate among compressed and "raw" (uncompressed) data characters or symbols. In this example, a second parallel decompression engine may implement a parallel LZ decompression scheme for decompressing a compressed stream that was compressed using an escape character to indicate the beginning of (or differentiate between) compressed and "raw" data sequences or streams (and not using tag-based encoding techniques), etc. The escape character may be any one or more characters or symbols. A third parallel decompression engine may implement a parallel LZ decompression scheme for decompressing a compressed stream wherein all tokens in the compressed stream are compressed, i.e., wherein the history buffer is pre-loaded with all 256 possible symbols, and thus all received data is compressed (with a pointer to a previous entry in the history buffer). In this third parallel decompression engine, tags or escape characters are not contained in the compressed stream to differentiate among compressed and raw data characters, as all characters or symbols in the compressed stream are compressed (with a pointer to a previous entry in the history buffer).

In one embodiment, data decompression logic may comprise a plurality of decompression engines 550 and selection logic 292 coupled to inputs of the plurality of decompression engines 550. In one embodiment, the data decompression logic may comprise a single system. In another embodiment, the plurality of decompression engines 550 and selection logic 292 may be comprised in different components of a computer system or computing appliance. The components shown in FIG. 6 may be implemented in hardware, in software or in a combination of hardware and software. In one embodiment, the data decompression logic may further include one or more data compression engines and may be referred to as compression/decompression (codec) logic.

A system that includes the data decompression logic as illustrated in FIG. 6 may have compressed data 270C that needs to be decompressed. Compressed data 270C may come from any of various sources, for example, from system memory, from non-volatile storage (e.g. a hard drive) or from another device or Input/Output (I/O) port (e.g. a network interface). Compressed data 270C may be a unit of data (such as a page of memory or a file) or a stream of data.

Compressed data 270C may be provided to an input of selection logic 292. To choose the appropriate decompression engine 550 to decompress the compressed data 270C, it is necessary to know the compression algorithm that was used to compress the data. Therefore, in one embodiment, compression information that may indicate the compression type 272 may be input into selection logic 292. In one embodiment, compressed data 270C may include one or more headers, and the compression type 272 may be included in at least one of the headers. When the data 270C is received, the header may be examined to determine the compression algorithm used. In one embodiment, if the compressed data is a page of memory, then a page translation entry associated with the compressed page may be marked to indicate the particular compression algorithm used in compressing the page. Selection logic may examine the compression type 272 to determine the compression algorithm used to compress the data 270C, and route the compressed data 270C to one of the plurality of decompression engines 550 that implements a decompression algorithm corresponding to the compression algorithm.

The appropriate decompression engine 550 may then decompress the compressed data 270C that was routed to it by selection logic 292 to produce uncompressed data 230C. Thus only one decompression engine 550 (the selected decompression engine) operates to decompress the data. As noted above, the decompression engine 550 is preferably selected based on the compression format of the received compressed data.

Depending upon the particular function for which the data decompression logic is being used, uncompressed data 230C may be written to volatile memory (e.g. system memory), non-volatile memory (e.g. a disk drive), may be provided to a processor such as a Central Processing Unit (CPU), or alternatively may be written to a bus, device, or I/O port (e.g. a network interface).

In some cases, the entire compressed data 270 (whether a unit or a stream) may not be decompressed in one pass using the data decompression logic. In one embodiment, parts of the compressed data 270 may be decompressed by the data decompression logic in a pipelined fashion. In other words, the data decompression logic may receive a first part of compressed data 270, route the first part of the compressed data 270 to the appropriate decompression engine determined by the input compression type, and output a first part of uncompressed data 230. While the first part of compressed data 270 is being decompressed, a second part of the compressed data 270 may be received. This process may continue until the entire compressed data 279 is decompressed.

The embodiments described in FIGS. 5 and 6 are described as including compression and decompression engines implementing lossless compression/decompression algorithms, including parallel lossless compression/decompression algorithms. Note that other embodiments are possible and contemplated that may include multiple compression and/or decompression engines implementing one of several lossy compression algorithms for image, video, sound, or other types of data, including parallel lossy compression algorithms.

Figure 7:
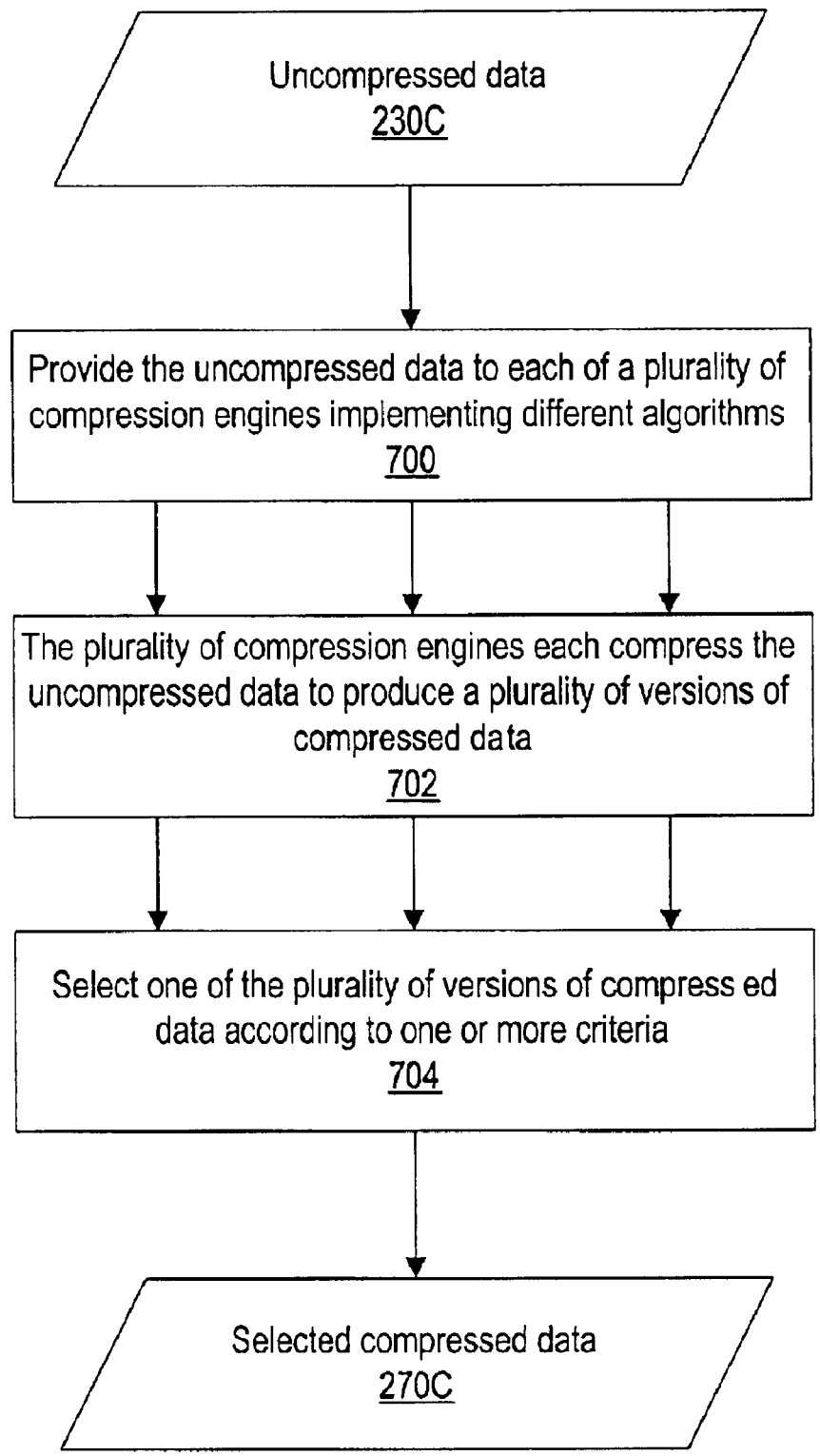
FIG. 7 is a flowchart illustrating one embodiment of a method of compressing uncompressed data using a plurality of compression engines in parallel to determine an optimal output compressed data.

FIG. 7 is a flowchart illustrating one embodiment of a method of compressing uncompressed data using a plurality of compression engines in parallel to determine a "best" or "most qualified" output compressed data. Each of the plurality of compression engines may implement a different lossless data compression algorithm. At least one of the data compression engines may implement a parallel lossless data compression algorithm. Uncompressed data 230C may be received and provided to each of a plurality of compression engines as indicated at 700. The plurality of compression engines may then each compress the uncompressed data to produce a plurality of versions of compressed data as indicated at 702. The plurality of versions of compressed data may then be examined, and one of the versions may be selected as the most qualified version of compressed data 270C according to one or more criteria as indicated at 704. In one embodiment, the version with the highest compression ratio will be selected. In another embodiment, the version which compresses the fastest will be selected.

Devices including a Codec System

A wide variety of devices may include embodiments of the compression decompression (codec) system including a plurality of compression and/or decompression engines as described herein. In this document, the term "codec system" may be used to describe any one, or a combination of two or more, of the embodiments of data compression logic, data decompression logic, and data compression/decompression logic as described for FIGS. 1–6.

Devices that may include a codec system may be implemented as integrated chips (ICs), computer boards or cards, computer peripheral devices, plug-and-play devices and/or stand-alone devices. These types of devices may include, but are by no means limited to, processors, bus bridges, memory controllers including cache memory controllers, storage devices including solid-state storage devices, adapters, intelligent devices, network devices, modems, cable modems, network appliances, set-top boxes, digital-to-analog and analog-to-digital conversion devices, Compact Disk reader/recorder devices, Digital Versatile Disk (DVD) devices, Digital Audio Tape (DAT) devices. The term "intelligent device" includes the notion of any device that is processor-enabled. Intelligent devices may include, but by no means are limited to, processor-enabled switches, smart appliances, printers, scanners, personal digital assistants (PDAs), cellular/mobile phones, notebook computers, laptops, desktop computers, workstations, more powerful computer systems such as mainframes and high-end servers, even supercomputers. An "adapter" as used herein may include the notion of a physical device that allows one hardware or electronic interface and/or protocol to be adapted (accommodated without loss of function) to another hardware or electronic interface and/or protocol. Adapters may include, but are not limited to, Integrated Services Digital Network (ISDN) adapters, Asynchronous transfer mode (ATM) adapters, and Digital Subscriber Line (DSL) adapters. Network devices may include, but by no means are limited to, hubs, switches, bridges, routers, brouters, multiplexers, demultiplexers, terminal servers, and network interface cards (NICs).

A device may include both a codec system that performs both compression and decompression. Alternatively, a device may include a codec system that performs only compression or decompression. For example, a device may include a codec system with a plurality of compression engines in parallel, or alternatively a plurality of decompression engines in parallel. As another alternative, a device may include two or more codec systems of the same or different types. For example, a device may include one or more codec systems to perform compression and one or more codec systems to perform decompression.

Example Computer Architecture with a Codec System

Figure 8A:
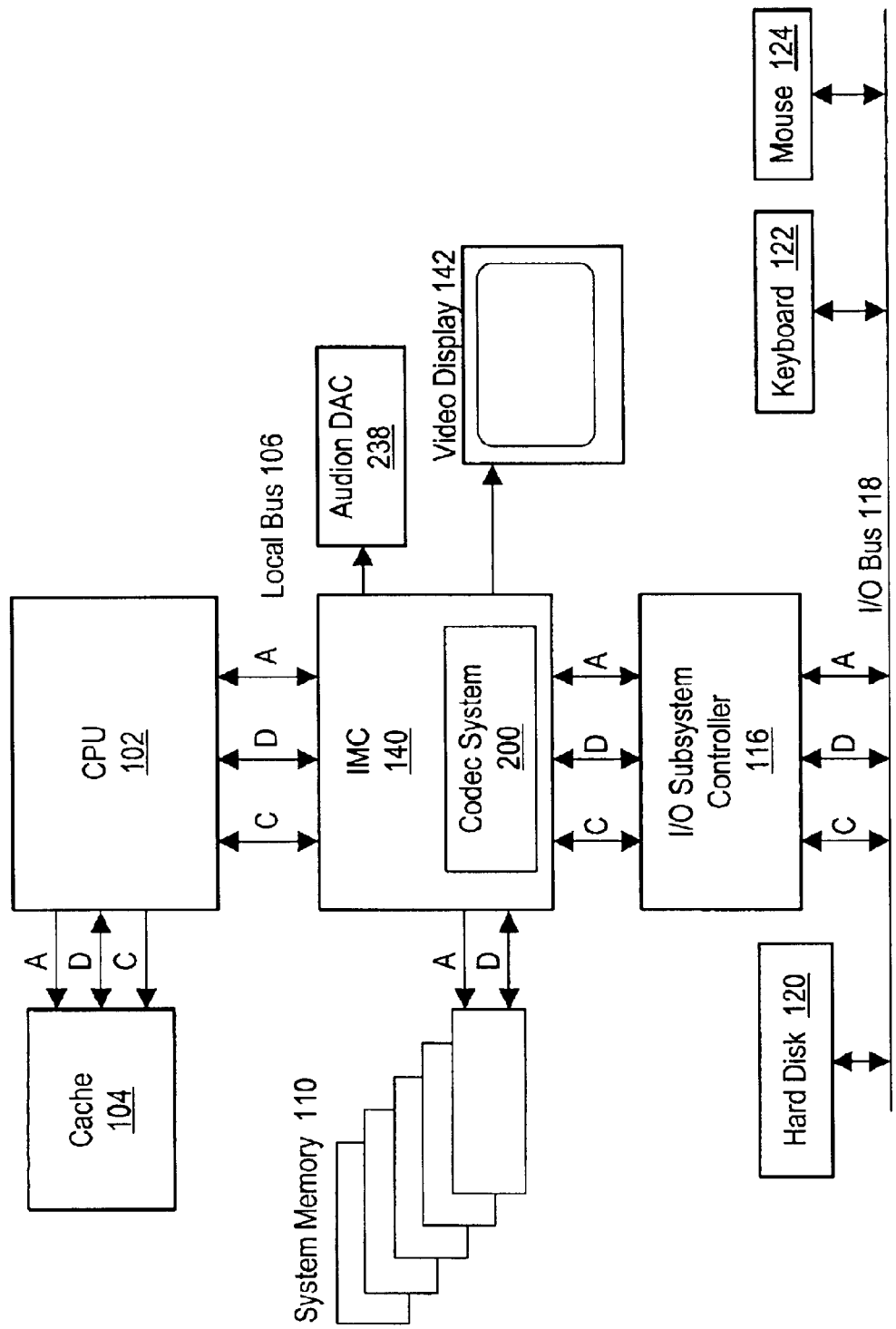
FIG. 8a illustrates a computer system having an integrated memory controller (IMC) including a compression/decompression engine (codec) system according to one embodiment.

FIG. 8a is a block diagram illustrating one embodiment of a computer system incorporating an embodiment of a codec system as described herein. FIG. 8a is an example of one embodiment, and it is noted that embodiments of the codec system as described herein may be included in any of various systems or architectures. For example, one or more codec systems may be included in a computer system, a television system (such as HDTV), a set top box, Internet appliance, PDA (Personal Digital Assistant), or other systems which transfer data or include memory for storing data. The technology of the present invention is described below with reference to a computer system architecture, which is one example of the use of one embodiment of a codec system.

As shown, the computer system includes a CPU 102 which may be coupled to a cache system 104. The CPU 102 may include an internal first level cache system and the cache 104 may comprise a second level cache. Alternatively, the cache system 104 may be a first level cache system or may be omitted as desired. The CPU 102 and cache system 104 are coupled to a Local bus 106. The CPU 102 and cache system 104 are directly coupled through the Local bus 106 to an integrated memory controller (IMC) 140 according to one embodiment of the present invention.

The integrated memory controller (IMC) 140 performs memory control functions and may include a codec system 200 for improving the performance of the computer system. It is noted that the IMC 140 can be used as the controller for main system memory 110 or can be used to control other memory subsystems as desired. The IMC 140 couples to system memory 110, wherein the system memory 110 comprises one or more banks of DRAM memory and may comprise a plurality of different type memory devices. The IMC 140 may include the codec system 200. The IMC 140 may also include a data movement engine (DME) which is used with the codec system 200. The codec system 200 may be embedded in the IMC 140, but alternately may be external to the IMC or may be comprised in the CPU 102. The entire IMC 140 may also be integrated with the CPU 102. In another embodiment, the codec system 200 may be comprised in a North Bridge 108 (FIG. 8b), i.e., the codec system 200 may be embedded in standard chipset logic. The codec system 200 may perform memory compression and decompression, system memory control, compression format, cache directory, data cache control and data multiplexing to improve the effective data bandwidth and efficiency of system memory data transfers.

The IMC 140 may couple to any of various types of memory, as desired. In one embodiment, the IMC 140 couples to the system memory 110 through a RAMBUS implementation. For more information on the RAMBUS memory architecture, please see the RAMBUS references mentioned above, which were incorporated by reference. In another embodiment, the system memory 110 comprises SGRAM or single in-line memory modules (SIMMs). As noted above, the IMC 140 may couple to any of various types of memory, as desired.

The IMC 140 may also generate appropriate video signals for driving video display device 142. The IMC 140 may generate red, green, blue (RGB) signals as well as vertical and horizontal synchronization signals for generating images on the video display 142. Therefore, the integrated memory controller 140 may integrate memory controller and video and graphics controller capabilities into a single logical unit. This greatly reduces bus traffic and increases system performance. In one embodiment, the IMC 140 also generates appropriate data signals that are provided to Audio DAC 238 for audio presentation. Alternatively, the IMC 140 integrates audio processing and audio DAC capabilities and provides audio signal outputs that are provided directly to speakers.

The IMC 140 may be situated either on the main CPU bus or a high speed system peripheral bus. The IMC 140 may also be closely or directly integrated with the CPU 102, e.g., comprised on the same chip as the CPU 102. In the embodiment shown in FIGS. 8a and 9a, the IMC 140 may be coupled directly to the Local bus 106 or CPU bus, wherein the IMC 140 interfaces through a L2 cache system 104 to the CPU 102. In an alternate embodiment, the L2 cache and controller 104 may be integrated into the CPU 102 or into the IMC 140, or not used.

An I/O subsystem controller 116 may be coupled to the Local bus 106. The I/O subsystem controller 116 in turn is coupled to an optional I/O bus 118. Various I/O devices are coupled to the I/O bus including a non-volatile memory, e.g., hard disk 120, keyboard 122, and mouse 124, as shown. In one embodiment the I/O bus is the PCI bus, and the I/O subsystem Controller 116 is coupled to the PCI bus.

The IMC 140 may include a novel system architecture that may help to eliminate system bandwidth bottlenecks and to remove extra operations required by the CPU 102 to move and manipulate application data and/or program code. According to one embodiment, the IMC 140 includes a codec system 200 which allows application data and/or program code, i.e., any data in the system, to move about the system in a compressed format. The operation of the codec system 200 in the IMC 140 is discussed in greater detail below.

The codec system 200 may operate in conjunction with a compressed memory management unit, or with compression-enabled software drivers, to manage compressed and uncompressed data in system memory 110.

FIGS. 8b–8e: Alternate Embodiments

Figure 8B:
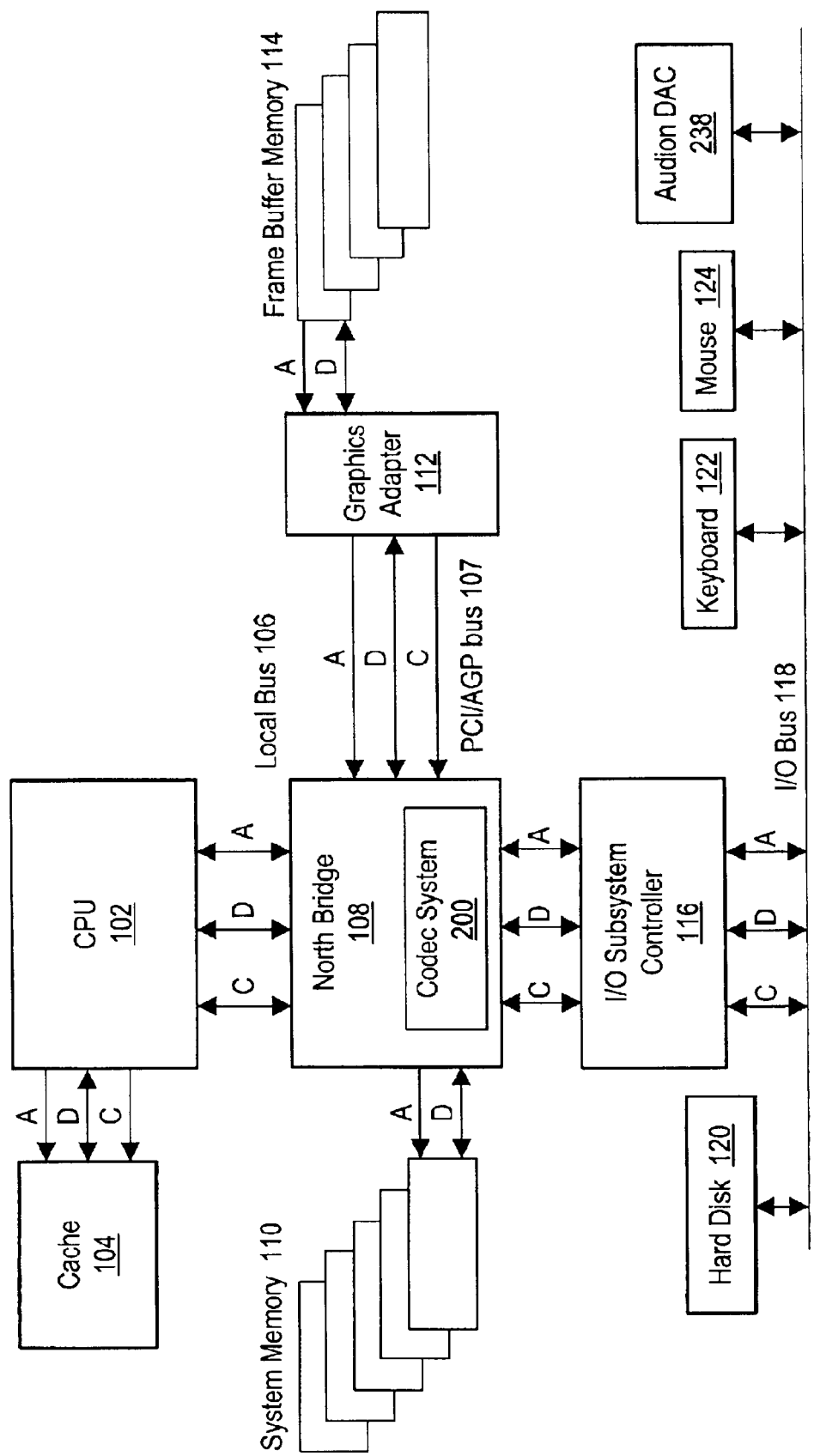
FIG. 8b illustrates a computer system having a North Bridge memory controller including the codec system according to one embodiment.

FIG. 8b is a block diagram illustrating one embodiment of a system incorporating the present invention. In the embodiment of FIG. 8b, the codec system 200 is comprised in the North Bridge 108, i.e., the codec system 200 is embedded in standard chipset logic.

Figure 8C:
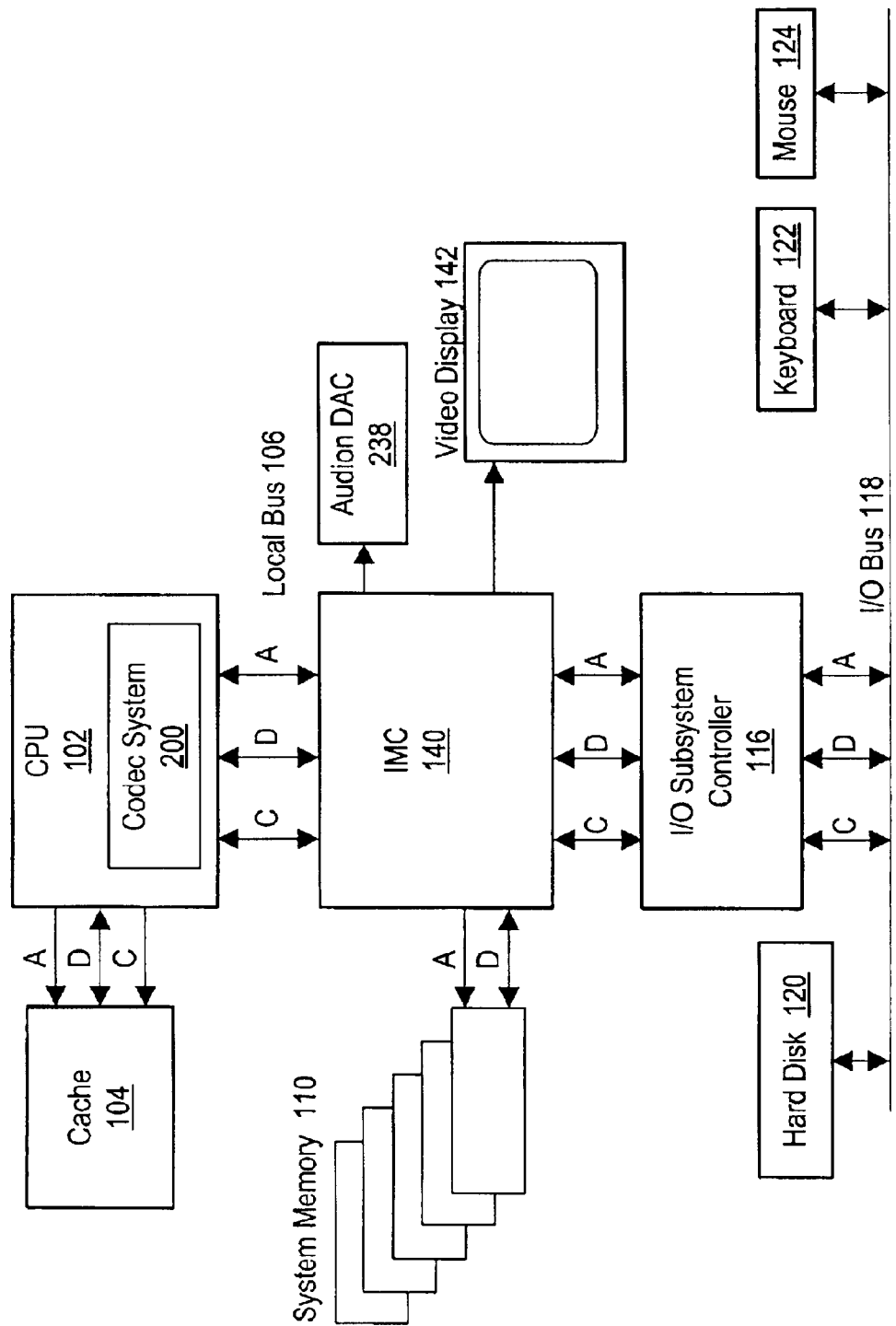
FIG. 8c illustrates a computer system having a CPU including the codec system according to one embodiment.

FIG. 8c is a block diagram illustrating one embodiment of a system incorporating the present invention. In the embodiment of FIG. 8c, the codec system 200 is comprised in the CPU 102. The codec system 200 may be comprised in various locations in the CPU and/or CPU L1 or L2 cache controller, as desired.

Figure 8D:
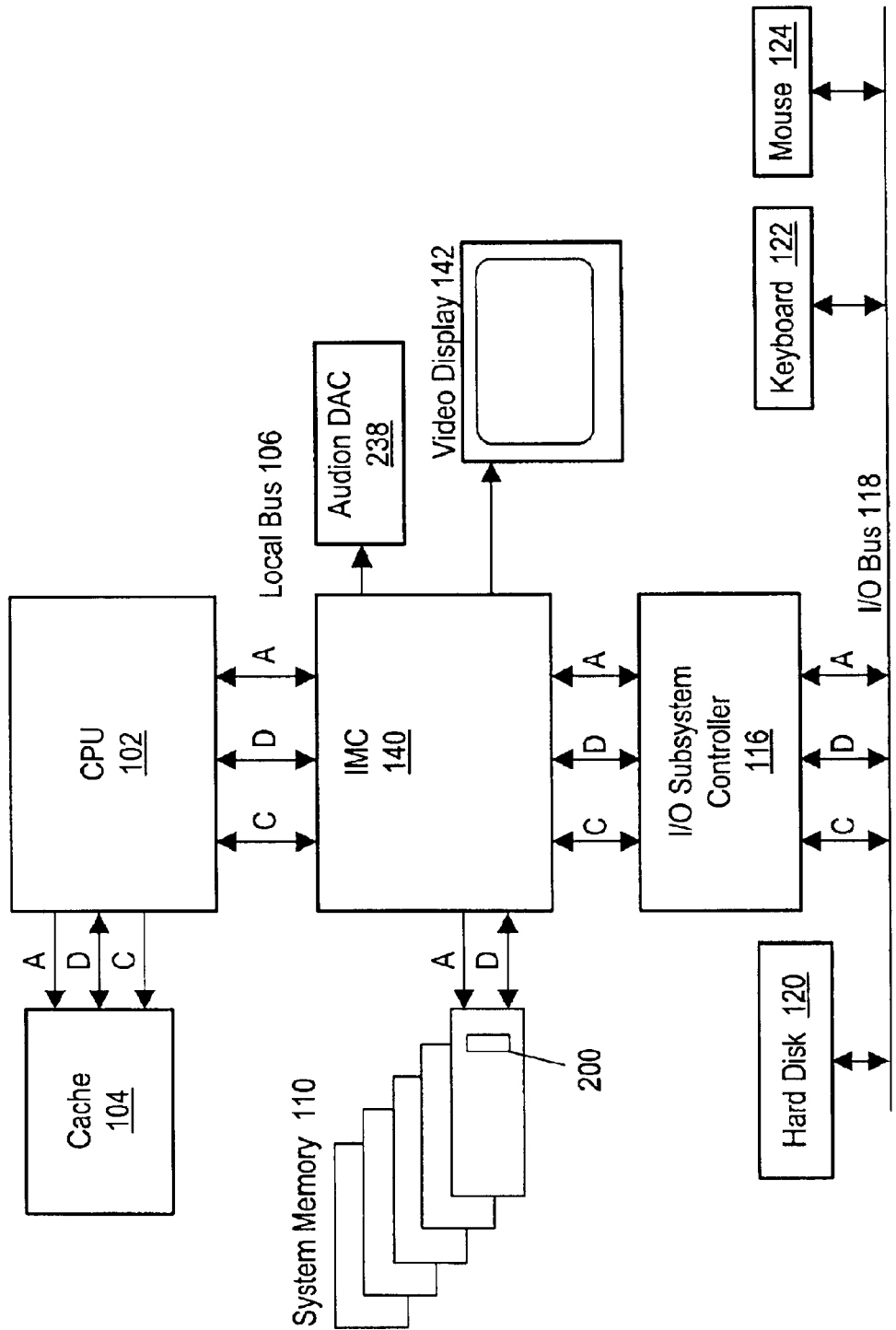
FIG. 8d illustrates a computer system having at least one memory module including the codec system according to one embodiment.

FIG. 8d is a block diagram illustrating one embodiment of a system, wherein the codec system 200 is comprised on at least one memory module 110. One or more of the system memory modules 110 thus may comprise memory components or devices as well as the codec system 200, which includes one or more parallel compression/decompression engines. The codec system 200 is operable to compress/decompress data as it is transferred to/from the memory components or devices comprised on the module. The IMC 140 may include a data movement engine (DME), such as a DMA controller, to move compressed and uncompressed data to/from the codec 200 in the system memory 110.

One or more of the frame buffer memory modules 114 in FIG. 8b may also include the codec system 200 of the present invention. In a similar manner the one or more frame buffer memory modules 114 may comprise memory components or devices as well as the codec system 200.

The memory components or devices comprised on the memory modules 110 and/or 114 may be any of various types, such as an SDRAM (static dynamic random access memory) DIMM (dual in-line memory module) or other types of memory components. In addition, specialty technology such as RAMBUS can be used both in the memory device and memory control unit to supply high bandwidth at low pin count. For more information on the RAMBUS memory architecture, please see "RAMBUS Architectural Overview," version 2.0, published July 1993 by RAMBUS, Inc., and "Applying RAMBUS Technology to Desktop Computer Main Memory Subsystems," version 1.0, published March 1992 by RAMBUS, Inc., which are both hereby incorporated by reference.

In another embodiment of the present invention, the codec system 200 may be distributed between the memory controller, e.g., the North Bridge 108 or the IMC 140, and one or more of the memory modules 110.

FIG. 8e is a block diagram illustrating one embodiment of a system, wherein the codec system 200 is comprised on a network interface device or card 121. Thus the network interface device 121 is operable to compress/decompress data as data is transferred to/received from a network, such as the Internet, a local area network (LAN) or another type of wide area network (WAN).

FIGS. 9a and 9b—Memory Module Embodiment

FIGS. 9a and 9b show a board assembly drawing of one embodiment of a memory module 571 which includes a codec system 200. As shown, the memory module 571 includes a plurality of memory devices 573 as well as a codec system 200. In one embodiment, the codec system 200 may include virtual memory logic for implementing improved virtual memory functions using the parallel compression/decompression technology described herein.

FIG. 9a illustrates the front side of the module and FIG. 9b illustrates the back side of the module. FIGS. 9a and 9b illustrate one embodiment of the memory module design, which is a 256 MB registered DIMM, which is compliant with the Intel PC100 or PC133 specification. Alternatively, other embodiments may be designed for larger and/or smaller registered DIMMs or different form factors or specifications. Embodiments of codes system 200 may of course be included in other memory module designs. Additionally, the codec system 200 or variations of the codec system 200 may be used with Rambus or Double Data Rate DRAM devices. Other alternate embodiments may include different DRAM population options, memory types such as those proposed in the Joint Electron Device Engineering Council (JEDEC) standard. Also, alternate embodiments may include a mix of these memory types on multiple different memory module standards.

Figure 10:
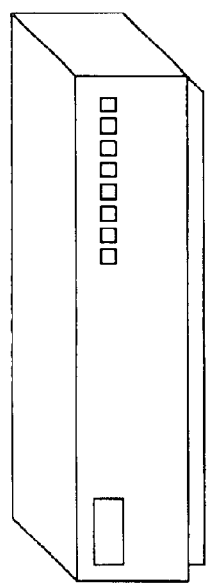
FIG. 10 illustrates a network device including the codec system according to one embodiment.

FIG. 10—Network Device

FIG. 10 illustrates a network device 130 that includes a codec system 200 according to one embodiment. In a similar manner to the network interface device 121, the network device 130 is operable to compress/decompress data as data is transferred to/received from a network, such as the Internet, a local area network (LAN) or another type of wide area network (WAN). Thus the present invention may provide the infrastructure wherein most or all data transferred over the Internet or other networks may be transferred in a compressed format. Network devices that may include the codec system 200 include, but by no means are limited to, hubs, switches, bridges, routers, brouters, multiplexers, demultiplexers and terminal servers.

FIG. 11—PDA

Figure 11:
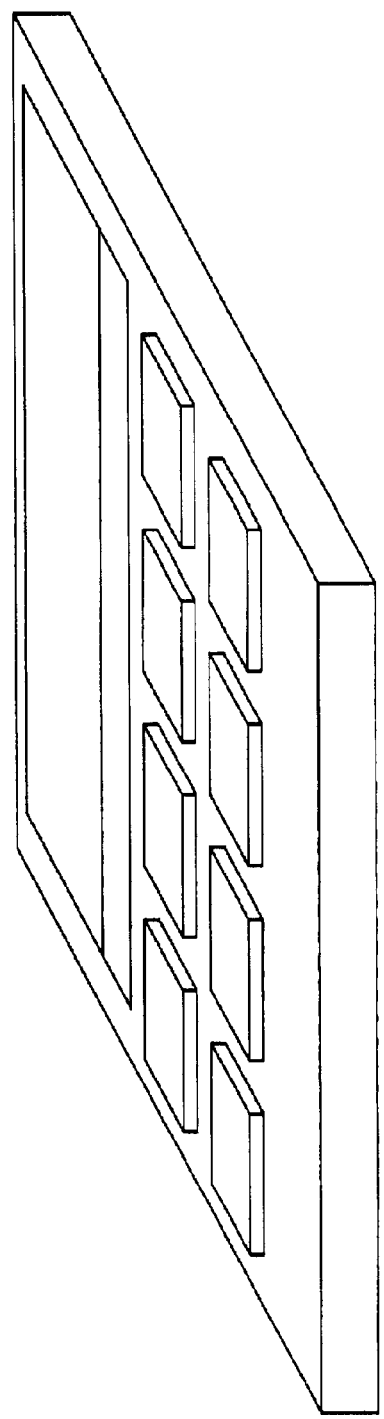
FIG. 11 illustrates a personal digital assistant including the codec system according to one embodiment.

FIG. 11 illustrates a personal digital assistant (PDA) or Internet appliance 132 which includes the codec system 200. In a similar manner to the network interface device 121 and the network device 130, the PDA 132 may be operable to compress/decompress data as data is transferred to/received from internal memory or to a network, such as the Internet, a local area network (LAN) or another type of wide area network (WAN).

Parallel Lossless Compression and Decompression

The parallel compression/decompression unit or engine 251, which performs parallel compression and decompression functions, is now discussed. This engine may also be referred to as a parallel codec engine 251. In one embodiment, the parallel codec engine 251 is a dedicated codec hardware engine, e.g., the engine is comprised of logic circuitry. In one embodiment, the parallel codec engine 251 comprises a programmable DSP or CPU core, or programmable compression/decompression processor, with one or more ROMs or RAMs which store different sets of microcode for certain functions, such as compression, decompression, special types of graphical compression and decompression, and bit blit operations, as desired. In this embodiment, the parallel codec engine 251 dynamically shifts between the different sets of microcode in the one or more memories, depending on the function being performed. The compression/decompression engine may also be implemented using reconfigurable or programmable logic, e.g., one or more FPGAs.

In one embodiment, the parallel codec engine 251 may include an embedded lossless parallel data compression engine 570 and parallel decompression engine 550 designed to compress and decompress data as data is transferred to/from system memory 110. The compression engine 570 and decompression engine 550 may be constructed using any of the techniques described with reference to the parallel codec engine 251, including hardware engines comprised of logic circuitry, programmable CPUs, DSPs, a dedicated compression/decompression processor, or reconfigurable or programmable logic, to perform the parallel compression and decompression method of the present invention. Various other implementations may be used to embed a compression/decompression within the memory controller according to the present invention. In one embodiment, the compression engine 570 and decompression engine 550 comprise hardware engines in the IMC 140, or alternatively use pieces of the same engine for compression and decompression. In the following description, the parallel compression and decompression unit is described as having separate compression and decompression engines 570 and 550.

For a general overview of the benefits and methods for using compression and decompression engines in the main system memory controller, refer to US patent disclosure titled "Memory Controller Including Embedded Data Compression and Decompression Engines", filed Jun. 5, 1995, Ser. No. 08/463,106, whose inventor is Thomas A. Dye.

Thus, the IMC 140 includes two data formats referred to as "compressed" data and "non-compressed" data. The compressed data format requires less storage and thus is less expensive. The compressed format also requires less system bandwidth to transfer data between system memory 110 and I/O subsystems. The decompression from compressed data format to normal data format results in a small performance penalty. However, the compression of non-compressed data format to compressed data format does not have an associated penalty, although there may be an added latency which would normally be hidden. However, if the data doesn't compress well, and there is a long series of stores which need to be compressed, the bus could be backed up causing read and snoop delays to the processor. In one embodiment, the compression engine 570 is implemented in software by the CPU 102.

In one embodiment, the compression engine 570 and decompression engine 550 in the IMC 140 may comprise one or more hardware engines that perform a novel parallel lossless compression method. In one embodiment, the parallel lossless compression method may be a "parallel" dictionary based compression and decompression algorithm. The parallel algorithm may be based on a serial dictionary based algorithm, such as the LZ77 (preferably LZSS) dictionary based compression and decompression algorithm. The parallel algorithm may be based on any variation of conventional serial LZ compression, including LZ77, LZ78, LZW and/or LZRW1, among others. In other embodiments, the parallel algorithm may be based on Run Length Encoding (RLE), Predictive Encoding, Huffman, Arithmetic, Differential or any other lossless compression algorithm.

As a base technology, any of various lossless compression methods may be used as desired. As noted above, in one embodiment, a parallel implementation of LZSS compression is used, although other lossless compression methods may allow for fast parallel compression and decompression specifically designed for the purpose of improved memory bandwidth and efficiency.

For more information on a data compression and decompression system using serial LZ compression, please see U.S. Pat. No. 4,464,650 which is hereby incorporated by reference. The above patent presents implementations of the LZ77 data compression method described by Lempel and Ziv in "Compression of Individual Sequences Via Variable-Rate Coding," IEEE Transactions on Information Theory, IT-5, September 1977, pages 530–537, and "A Universal Algorithm for Sequential Data Compression," IEEE Transactions on Information Theory, Volume 23, No. 3 (IT-23-3), May 1977, pages 337–343, wherein the above two articles are both hereby incorporated by reference. U.S. Pat. No. 4,701,745, titled "Data Compression System," which issued Oct. 20, 1987, describes a variant of LZ77 called LZRW1, and this patent is hereby incorporated by reference in its entirety. A modified version of the LZ78 algorithm is referred to as LZW and is described in U.S. Pat. No. 4,558,302. Another variant of LZW compression is described in U.S. Pat. No. 4,814,746.

The IMC 140 may also utilize parallel data compression/decompression techniques of the present invention based on various types of parallel or serial data compression/decompression methods.

FIG. 12—High Level Flowchart of the Parallel Compression Algorithm

FIG. 12 is a high-level flowchart diagram illustrating operation of the parallel compression algorithm in the preferred embodiment. Steps in the flowchart may occur concurrently or in different orders.

In step 402 the method maintains a history table (also called a history window) comprising entries, wherein each entry may comprise one symbol. In one embodiment, the history table may be a sliding window which stores the last n symbols of the data stream.

In step 404 the method maintains a current count of prior matches which occurred when previous symbols were compared with entries in the history table. A current count may be maintained for the present data stream, and each entry may maintain a Maximum Count Flag to indicate that this entry is the starting point of the match. In an alternate and less preferred embodiment, separate counts may be maintained for each entry in the history table. The currently preferred embodiment maintains a single current count and maintains separate count flags for each entry in the history table, since this requires less logic than maintaining a separate count for each entry in the history table.

In the present disclosure, the term "count information" is intended to include the count of prior matches and a count flag that is maintained for each entry in the history table. The term "count information" is also intended to include a plurality of current counts that are maintained for each entry in the history table.

It is noted that maintenance of the history table and the current count flags are performed throughout the algorithm based on previously received symbols, preferably starting when the first plurality of symbols are received for compression.

In step 406 the method receives uncompressed data, wherein the uncompressed data comprises a plurality of symbols. Thus the parallel compression algorithm operates on a plurality of symbols at a time. This is different than conventional prior art serial algorithms, which operate in a serial manner on only one symbol at a time. The plurality of symbols comprises 2 or more symbols, preferably a power of 2. In the preferred embodiment, the parallel compression algorithm operates on 4 symbols at a time. However, implementations using 8, 16, 32 or more symbols, as well as other non-power of 2 numbers, may be readily accomplished using the algorithm described herein.

In step 408 the method compares the plurality of symbols with each entry in the history table in a parallel fashion. This comparison produces compare results. Each entry in the history table preferably compares with each of the plurality of symbols concurrently, i.e., in a parallel fashion, for improved speed. The parallel compression method thus may operate to compare each of the plurality of symbols with each entry in the history table (or history buffer) concurrently, e.g., in a single clock cycle.

In step 410 the method determines match information for each of the plurality of symbols based on the current count flag, and the compare results. Step 410 of determining match information includes determining zero or more matches of the plurality of symbols with each entry in the history table. More specifically, step 410 may include determining a longest contiguous match based on the current count and the compare results, and then determining if the longest contiguous match has stopped matching. If the longest contiguous match has stopped matching, then the method updates the current count flags and maximum count.

In step 412 the method outputs compressed data information in response to the match information. Step 412 may involve outputting a plurality of sets of compressed data information in parallel, e.g., for different matches and/or for non-matching symbols. Step 412 includes outputting compressed data information corresponding to the longest contiguous match that stopped matching, if any. The contiguous match may involve a match from a prior plurality of symbols. Step 412 may also include outputting compressed data information solely from a prior match. Step 412 also includes, for non-matching symbols that do not match any entry in the history table, outputting the non-matching symbols in an uncompressed format.

For a contiguous match, the compressed data information includes a count value and an entry pointer. The entry pointer points to the entry in the history table that produced the contiguous match, and the count value indicates a number of matching symbols in the contiguous match. In one embodiment, an encoded value is output as the count value, wherein more often occurring counts are encoded with fewer bits than less often occurring counts.

Steps 402–412 are repeated one or more times until no more data is available. When no more data is available, then, if any current counts are non-zero, the method outputs compressed data for the longest remaining match in the history table.

Since the method performs parallel compression, operating on a plurality of symbols at a time, the method preferably accounts for symbol matches comprised entirely within a given plurality of symbols, referred to as the "special case". Here presume that the plurality of symbols includes a first symbol, a last symbol, and one or more middle symbols. Step 410 of determining match information includes detecting if at least one contiguous match occurs with one or more respective contiguous middle symbols, and the one or more respective contiguous middle symbols are not involved in a match with either the symbol before or after the respective contiguous middle symbols. If this condition is detected, then the method selects the one or more largest non-overlapping contiguous matches involving the middle symbols. In this instance, step 412 includes outputting compressed data for each of the selected matches involving the middle symbols.

FIG. 13—Detailed Flowchart of the Parallel Compression Algorithm

FIG. 13 is a more detailed flowchart diagram illustrating operation of the parallel compression algorithm in the preferred embodiment. Steps that are similar or identical to steps in FIG. 12 have the same reference numerals for convenience.

In the flowchart of FIG. 13, it is presumed that the method maintains a history table comprising entries, wherein each entry comprises one symbol. The history table is preferably a sliding window which stores the last n symbols of the data stream. It is also presumed that the method maintains a current count of prior matches that occurred when previous symbols were compared with entries in the history table. A count flag may be maintained for each entry in the history table. As noted above, the maintenance of the history table and the current count flags is performed throughout the algorithm, preferably starting when the first plurality of symbols are received for compression.

In step 406 the method receives uncompressed input data, wherein the uncompressed data comprises a plurality (or group) of symbols. Thus the parallel compression algorithm operates on a plurality of symbols at a time. This is different than conventional prior art algorithms, which operate in a serial manner on only one symbol at a time. The plurality of symbols comprises 2 or more symbols, preferably 4 symbols. As noted above, the parallel compression algorithm can operate on any number of symbols at a time. The input data may be the first group of symbols from a data stream or a group of symbols from the middle or end of the data stream.

In step 408 the method compares the plurality of symbols with each entry in the history table in a parallel fashion. This comparison produces compare results. Each entry in the history table preferably compares with each of the plurality of symbols concurrently, i.e., in a parallel fashion, for improved speed.

In step 422 the method determines zero or more matches of the plurality of symbols with each entry in the history table. In other words, in step 422 the method determines, for each entry, whether the entry matched any of the plurality of symbols. This determination is based on the compare results.

If no matches are detected for the plurality of symbols in step 422, then in step 432 the method determines if any previous matches existed. In other words, step 432 determines if one or more ending symbols from the prior group of symbols matched entries in the history table, and compressed information was not yet output for these symbols since the method was waiting for the new plurality of symbols to possibly determine a longer contiguous match. If one or more previous matches existed as determined in step 432, then in step 434 the method outputs the previous compressed data information. In this case, since the prior matches from the prior group of symbols are not contiguous with any symbols in the current group, the previous compressed data information is output. After step 434, operation proceeds to step 436.

If no previous matches existed as determined in step 432, or after step 434, then in step 436 the method outputs each symbol of the plurality of symbols as uncompressed symbols. Since each of the plurality of symbols does not match any entry in the history table, then each of the plurality of symbols are output in an uncompressed format. After step 436, in step 438 all count flags are reset to 0. In step 472 the uncompressed symbols are added to the history window, and operation returns to step 406 to receive more input data, i.e., more input symbols.

If one or more matches are detected for the plurality of symbols in step 422, then in step 442 the method determines if all of the plurality of symbols are comprised in one match. If so, then in step 444 the method increases the match count by the number of matching symbols, e.g., 4 symbols, and sets the maximum count flag for the respective entry. In step 474 the uncompressed symbols are added to the history window, and operation returns to step 406 to receive more input data, i.e., more input symbols. In this case, the method defers providing any output information in order to wait and determine if any symbols in the next group contiguously match with the current matching symbols.

If all of the plurality of symbols are not comprised in one match as determined in step 442, then in step 452 the method determines if any previous matches existed. The determination in step 452 is similar to the determination in step 432, and involves determining if one or more ending symbols from the prior group of symbols matched entries in the history table, and compressed information was not yet output for these symbols since the method was waiting for the new plurality of symbols to possibly determine a longer contiguous match.

If one or more previous matches existed as determined in step 452, then in step 454 the method selects the largest contiguous match including the previous match. In step 456 the method outputs compressed data information regarding the largest contiguous match. This compressed data information will include previous compressed data information, since it at least partly involves a previous match from the previous group of symbols. If the first symbol in the current plurality of symbols is not a contiguous match with the previous match, then the compressed data information will comprise only the previous compressed data information. After step 456, operation proceeds to step 462.

Steps 462–470 may be performed for each input symbol in a parallel fashion. In other words, steps 462–470 may be performed concurrently for each input symbol. Steps 462–470 are shown in a serial format for ease of illustration.

In step 462 the method determines if the respective symbol is included in any match. If not, then in step 464 the method outputs the uncompressed symbol. In this case, the respective symbol does not match any entry in the history table, and thus the symbol is output uncompressed.

If the respective symbol is included in a match as determined in step 462, then in step 466 the method determines if the match includes the last symbol. If not, then in step 468 the method outputs compressed data information for the match. It is noted that this may involve a "special case" involving a match comprising only one or more middle symbols.

If the match does include the last symbol as determined in step 466, then in step 470 the method resets the counter to the number of symbols not included in the match. In this case, compressed information is not output for these symbols since the method waits for the new plurality of symbols to possibly determine a longer contiguous match.

Once steps 462–470 are performed for each input symbol in parallel, then in step 472 the uncompressed symbols are added to the history window. Operation then returns to step 406 to receive more input data, i.e., a new plurality or group of input symbols. If no more input data is available or is received, then in step 480 the method flushes the remaining previous matches, i.e., provides compressed information for any remaining previous matches.

The method of FIG. 13 also accounts for matches within the middle symbols as described above.

Lossless Decompression

One embodiment of the parallel decompression engine 550 for the lossless decompression of compressed data is now disclosed. Data compression methods may include serial compression methods, where only one symbol from the uncompressed data is examined and compressed at a time, and the novel parallel compression methods described above, where a plurality of symbols from the uncompressed data may be examined and compressed at a time. In one embodiment, the parallel decompression engine 550 may be able to decompress data compressed by serial or parallel decompression methods. Likewise, decompression of compressed data using the parallel decompression technologies of the present invention produces the same uncompressed data stream as decompression of the same compressed data using prior art serial decompression techniques. The compressed data created using the parallel compression methods described above is designed to be identical to compressed data created using serial compression algorithms; therefore, decompressing data compressed with the parallel method described above by either serial or parallel decompression engines will result in the same uncompressed data. Preferably, decompression is performed as fast as the compression operation or faster. Also, in alternate embodiments, decompression engines 550/555 may be placed in a plurality of locations within the system or circuit. Multiple decompression engines allow for a custom operation of the decompression process and a custom bandwidth or throughput may be designed depending on the number of stages used in the decompression engine 550. Therefore, below is a parallel decompression algorithm for the parallel decompression engine 550 that yields higher bandwidth than prior art serial algorithms.

FIGS. 14–23—An Embodiment of a Parallel Decompression Engine

Figure 15:
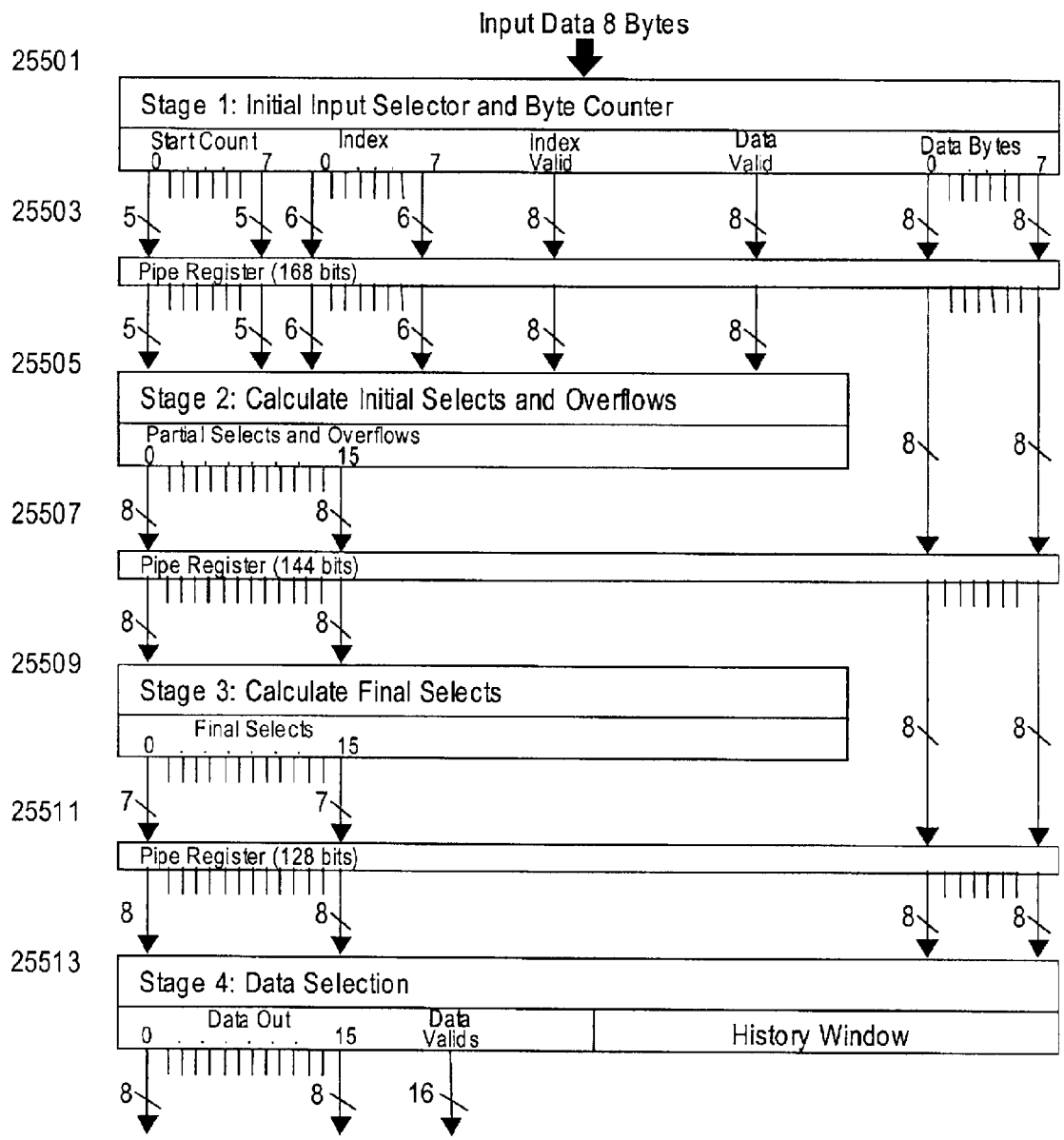
FIG. 15 illustrates four stages used for the parallel lossless decompression algorithm according to one embodiment.

The parallel decompression engine 550 may be divided into a series of stages, preferably pipelined stages. The stages of the decompression engine 550 are illustrated in FIG. 15. As shown, the decompression engine 550 may include a first stage 25501 comprising decoders, a second stage 25505 comprising preliminary (also called initial or primary) select generation logic, a third stage 25509 comprising final select generation logic, and a fourth stage 25513 comprising data selection and output logic. A pipe register 25503 may be coupled to the first stage 25501 and the second stage 25505. A pipe register 25507 may be coupled to the second stage 25505 and the third stage 25509. A pipe register 25511 may be coupled to the third stage 25509 and the fourth stage 25513. According to one embodiment, the pipelined design is expected to utilize four stages to run at 133 MHz using a 0.25$\mu$ CMOS technology. These stages are preferably divided up, or alternatively combined, as the silicon process technology requires. Only the last stage in this pipeline 25513 uses the history window, and that final stage contains minimum logic. Based on this, this function may be extended to more than four stages if a significantly faster clock is available. Thus, in alternate embodiments, as processing improves and clock rates increase, the stages of the decompression engine 550 may increase to raise the decompression rate with the same input compression stream. However, for the preferred embodiment the four stages shown are the logical divisions of the function. Other embodiments may include fewer than four stages. For example, a three-stage embodiment may combine the second and third stage into one stage.

In the preferred embodiment, the decompression engine 550 includes a pipelined, multi-stage design. The pipelined, multi-stage design of the decompression engine 550 enables the substantially simultaneous or concurrent processing of data in each stage. As used herein, the term "decompression cycle" includes operation of all stages of the pipeline on a set of data, from analysis of tokens in an input section of data in the first stage to production of output uncompressed data in the last stage. Thus, multiple "decompression cycles" may be executing substantially concurrently, i.e., different stages of multiple "decompression cycles" may be executing substantially concurrently.

For example, the first stage 25501 may receive a first plurality of codes (also called tokens), and load the first tokens into the decoders at the start of a first decompression cycle. The decoders may extract various first decoded information from the first tokens, and this first decoded information may be latched into pipe register 25503. The first decoded information may then be loaded into the preliminary select logic of the second stage 25505. While the preliminary select logic of the second stage 25505 is operating on the first decoded information, a next plurality of tokens (second tokens) may be received by the first stage 25501 and loaded into and processed by the decoders at the start of a second decompression cycle, substantially simultaneously, to produce second decoded information. When stage two has completed generating preliminary selects from the first decoded information in the first decompression cycle, the preliminary selects are latched into pipe register 25507 in the second decompression cycle. Similarly, when stage one has completed generating the second decoded information in the second decompression cycle, this second decoded information may be latched into pipe register 25503. The preliminary selects may then be loaded into the third stage 25509 for resolution into final selects, while the second decoded information generated in the first stage 25501 for the second decompression cycle is loaded into the second stage 25505, and a next (third) plurality of tokens is received by the first stage 25501 and loaded into the decoders to begin a third decompression cycle. Thus, in the four-stage embodiment of decompression engine 550, four decompression cycles may be active in the decompression engine 550 substantially simultaneously.

As used herein, in the context of the first stage examining a plurality of tokens from the compressed data in parallel in a current decompression cycle, the term "in parallel" includes the notion that a plurality of tokens may be operated on by the logic during a single pipeline stage of the decompression engine 550. The term "in parallel" also may include the notion that a plurality of decoders operate on a plurality of tokens during a single pipeline stage of the decompression engine 550. The plurality of tokens may actually be extracted from the input data section serially or consecutively. The plurality of tokens may then be assigned to available decoders as they are extracted from the input data section. Once tokens have been assigned to available decoders, portions of the processing of the tokens by the decoders may be performed in parallel. In addition, the term "in parallel" may also include the notion that a plurality of decoders output decoded information in parallel to the next stage of the pipeline.

As used herein, in the context of generating a plurality of selects in parallel, the term "in parallel" includes the notion that the select logic (stages 2 and/or 3) may concurrently process decoded information corresponding to a plurality of tokens substantially concurrently and/or the select logic may operate to generate selects for a plurality of output uncompressed symbols substantially concurrently. As described below, the select logic shares information regarding the selects that are being generated in parallel for different output uncompressed symbols.

Therefore, in general, information for decompressing more than one token may be loaded into a stage, operations of the stage performed on the tokens, and the results for all the tokens may then be latched out of the stage into a pipe register for processing in the next stage. In each stage, there may be copies of the logic for performing substantially simultaneous operations "in parallel" on a plurality of inputs.

For example, in the first stage 25501, an extracted token is assigned to one decoder. In the second, third, and fourth stages, there may be one copy of the logic for performing the operations of the stage for each potential output byte. Note that some operations in some stages may have dependencies that may utilize sequential processing. For example, loading a second token in a second decoder of the first stage 25501 may utilize count and other information generated by the loading of a first token in a first decoder.

To understand this novel decompression, the table of FIG. 14 illustrates the compression mask and index-coding algorithm for a sample code. In alternate embodiments, other codes may alter the design of the decompression unit. One embodiment may include all the codes included in FIG. 14 except the code for compressing one byte that uses 8 bits. In compressed input data, a code may also be referred to as a "token."

Figure 16:
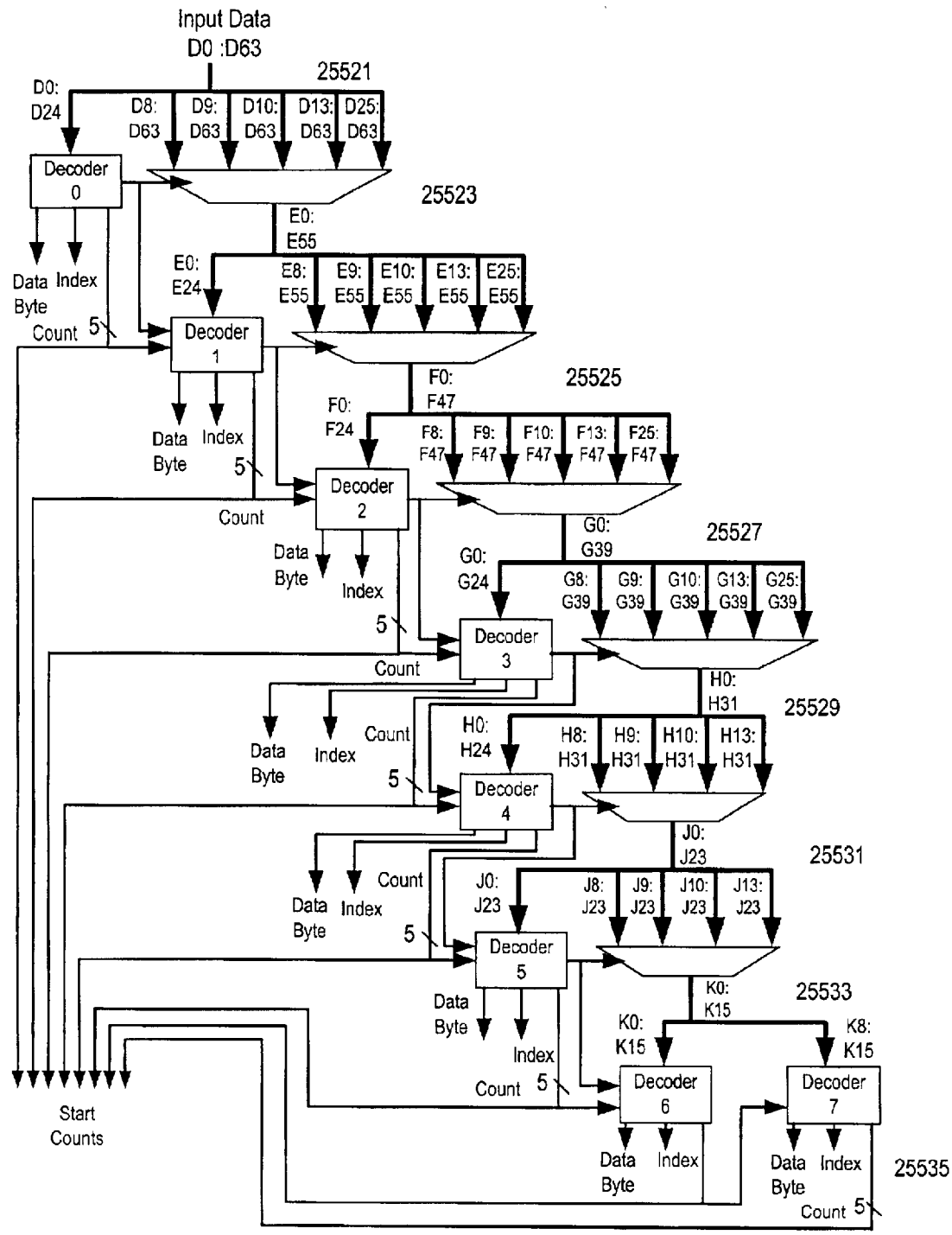
FIG. 16 illustrates eight decoder stages used to generate the start counts used for the parallel decompression process according to one embodiment.

With the codes shown in the table of FIG. 14, the decompression tree in FIG. 16 allows decoding of at most 8 bytes of the input in one cycle. In this example, at most 8 bytes (64 bits) are extracted from the compressed data as input data to the decompression engine of FIG. 15 for each decompression cycle. The smallest encoded data is 8 bits, so the minimum number of decoders (25521–25535), indicated in FIG. 16, for 8 bytes is 8 (64 bits/8 bits). Each of these decoders could see one of many data inputs depending on the prior compressed data.

FIG. 16 illustrates the decoder stage 25501, which is the first stage of the decompression engine of FIG. 15. The decompression tree, shown in FIG. 16, utilizes very fast decoding at each stage to determine the proper data for the next stage. The Window Index, Start Count and Data Byte output (FIG. 14) are preferably latched for the next stage of the decode pipeline of FIG. 15. This decode pipeline requires the assembly of the output data. More detail of the preferred Decode block can be seen in FIG. 17.

Figure 17:
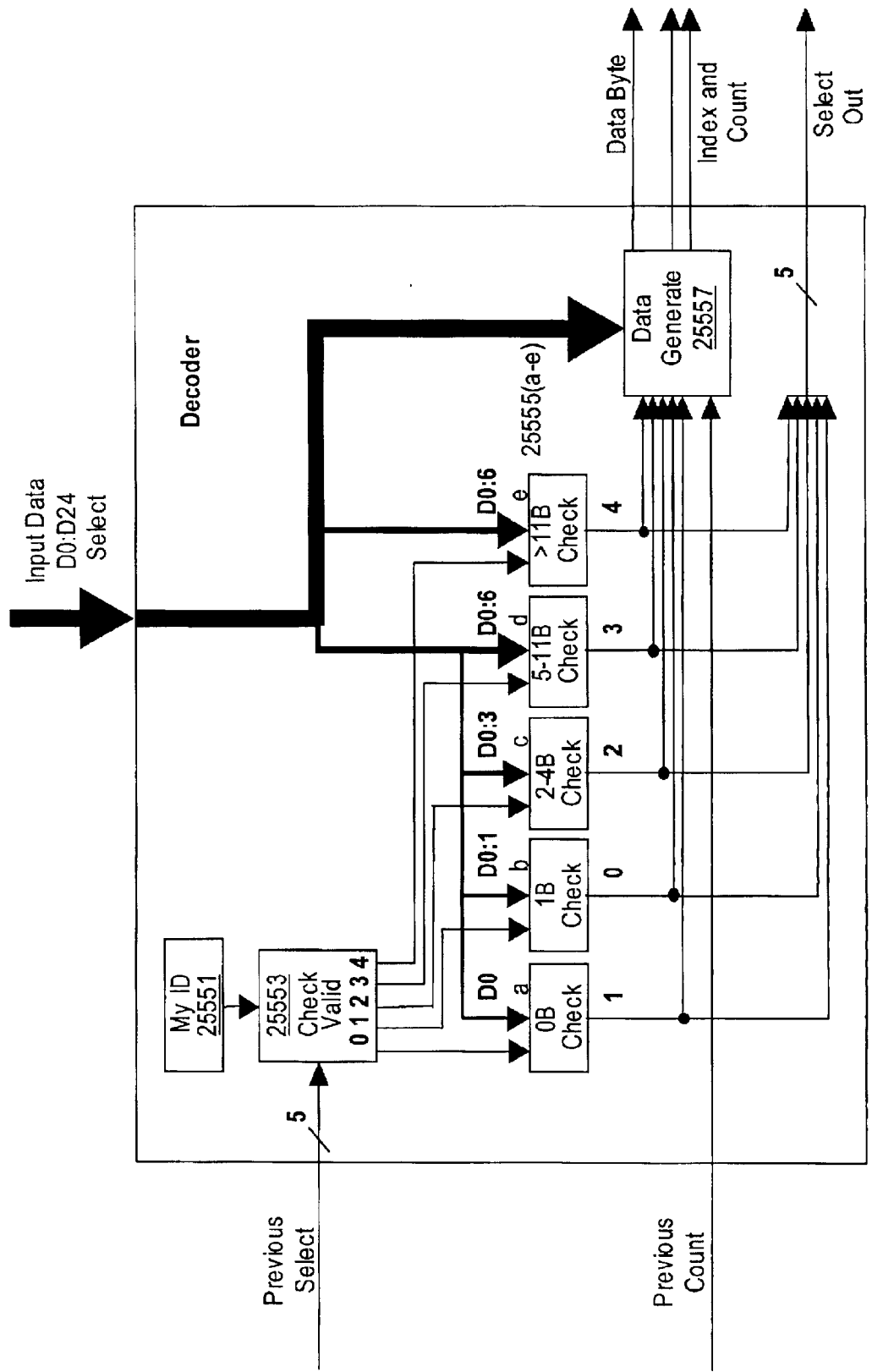
FIG. 17 illustrates a single decoder block used by the stage one input selector and byte counter of FIG. 15 according to one embodiment.

FIG. 17 illustrates the logic of one of the first stage decoders of FIG. 16. In FIG. 17, the Check Valid block 25553 verifies that enough bits are available for the checker 25555(*a–e*). After extracting one or more codes from the input data to be decoded by one or more decoders, there may not be enough bits in the input data to construct a complete token. For example, in the decompression engine described above that accepts 8 bytes (64 bits) of input data in a cycle, if six 10-bit codes are loaded into the first six decoders, four bits would be left in the input data, not enough to construct a complete token. In another example using 64-bit input data, if four 10-bit codes and one 13-bit code are loaded into the first five decoders, 11 bits are left in the input data. The Check Valid block 25553 may then check the flag information in the 11 bits to determine if there is a complete code in the 11 bits (an 8, 9 or 10 bit code). If there is a complete code, then the code is loaded in the next decoder. If the flag information indicates that the 11 bits are an incomplete code longer than 11 bits (a 13 or 25 bit code), then the bits are not loaded and examined until a later decode cycle. In the preferred embodiment, the longest path through Check Valid 25553 should be three gates, and the Byte Check 25555(*a–e*) will only add one gate because the check is an output enable. The outputs from the Check Valid logic 25553, and the Byte Check logic 25555 in FIG. 17 show 0 as the most significant bit, and 6 as the least significant bit.

The data generate logic 25557 is a multiplex of the input data based on the check select 25555 input. At most, one Byte Check 25555 should be active for valid data. An alternate embodiment may include a checker that is added to this decoder to verify that one byte check is active for valid data.

Referring again to FIG. 15, the second stage 25505 of the decompression engine 550 begins calculating pointers (also called "selects") to the appropriate bytes from the history window for compressed data that have been latched in the 168-bit pipe register 25503. For each decoder, stage two receives an index, a start count, an index valid bit, a data byte and a data byte valid bit. In the embodiment of FIG. 15, stage two would receive eight indexes, eight start counts, eight index valid bits, eight data bytes, and eight data byte valid bits, one from each of the eight decoders in stage one. In one embodiment, the data byte is passed through without being used by stage two. In one embodiment, the indexes, start counts, index valid bits, and data byte valid bits from each of the decoders are duplicated to the preliminary select logic for each of the output bytes of stage two. Thus, in the embodiment of FIG. 15, the preliminary select logic for each of the 16 output bytes receives the index, start count, index valid bit, and data byte valid bit from each of the eight decoders in stage one.

With minimal logic, a preliminary select may be calculated for each of the 16 output bytes of stage four 25513. The preliminary selects are latched in the 144-bit pipe register 25507. Each select latched into 25507 is a 7 bit encode (for a 64-entry window) with a single bit overflow. These signals are latched 25507 and used by the next unit 25509 in stage three. In one embodiment, the selects will have the values of 0–63 if a window value is to be used for this output byte, 64–71 if one of the eight data bytes is to be used for this output byte, and an overflow if the data for this output byte is a result of one or more of the other parallel decodes occurring with this data. The third stage 25509 checks each of the overflows from the previous stage 25505. If inactive, the 7 bit select is passed on unchanged. If active, the select from the correct stage two decoder 25505 is replicated on the select lines for this output byte.

The final stage of the decompression, stage four 25513 as illustrated in FIG. 15, selects the data from the history window or the data bytes passed from the first stage to build the output data. The output bytes that are assembled are then added to the history window for the next decode cycle.

In one embodiment, the first stage may consider the number of output bytes when decoding codes from the input data in a cycle. For example, the maximum output of the embodiment of FIG. 15 is 16 bytes per cycle. If a first code being decoded in a first decoder represents more than 16 output bytes, then the first stage 25501 may leave the first code loaded in the first decoder for as many cycles as it take to decompress all of the output bytes represented by the first code. Other codes that may be loaded in the other decoders are not decoded until there are available output data bytes to serve as destinations for the uncompressed symbols to be generated from the tokens. For example, if the first code loaded in the first decoder represents 24 output bytes, then 16 of the 24 output bytes may be decoded in a first cycle, and the remaining 8 in a second cycle. This leaves 8 output bytes for the other codes in the other decoders. Additionally, the last stage 25513 may include data valid bits so that the proper output data assembly can occur if fewer than 16 bytes can be decoded for any one cycle.

Figure 18:
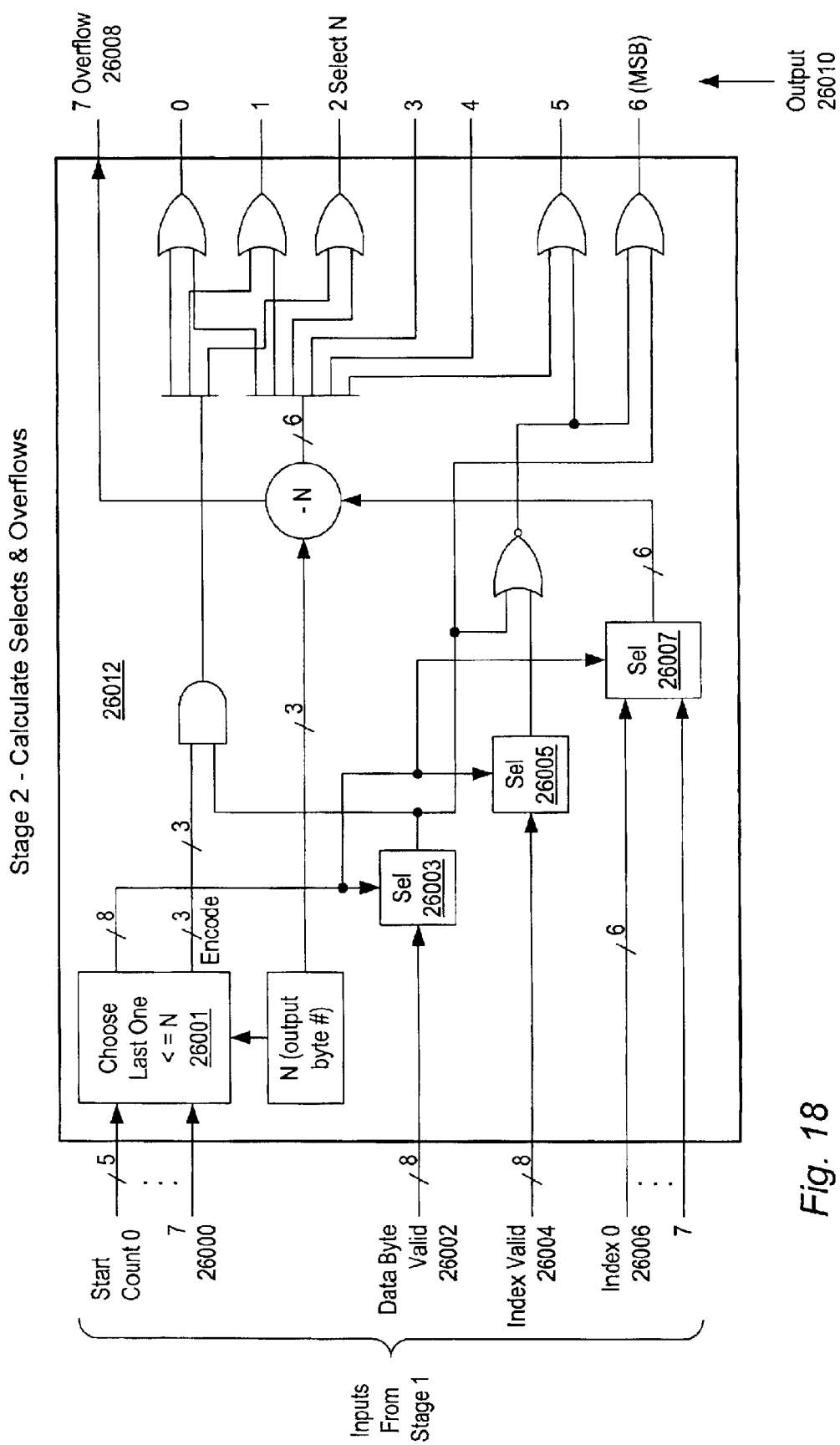
FIG. 18 illustrates a portion of the second of the four stages illustrated in FIG. 15 for calculating selects and overflows according to one embodiment.

FIG. 18—Calculating Initial Selects and Overflows According to One Embodiment of the Invention FIG. 18 illustrates logic 26012 for calculating initial selects and overflows according to one embodiment of the invention. In one embodiment, this logic is included in the second stage 25505 of the decompression engine as illustrated in FIG. 15. In one embodiment, there is one logic 26012 in the second stage for each output byte in the decompression engine 550. For example, in the decompression engine illustrated in FIG. 15, there would be 16 of the logic 26012 in stage two, one for each output byte. Logic 26012 begins the calculation of pointers to the appropriate bytes from the history window for compressed data which have been latched in the 168-bit pipe register 25503 from the first stage in FIG. 15. In the embodiment shown in FIG. 18, each logic 26012 in stage two receives a copy of the Index 26006 and Count 26000 from each decoder in stage one. Each logic 26012 in stage two also receives a Data Byte Valid bit 26002 and an Index Valid bit 26004 from each decoder.

With minimal logic, a preliminary select 26010 may be calculated in stage two for each of the output bytes, and the preliminary selects 26010 may then be latched in the 144-bit pipe register 25507 of FIG. 15. For example, each preliminary select may be a 7 bit encode (for a 64-entry window, plus eight data bytes) with a single bit overflow 26008. Embodiments with other sizes of history windows and/or other numbers of data bytes may require a different number of bits and a different numbering scheme for the preliminary selects. The preliminary selects 26010 are latched into 25507 and used by the next unit 25509 in stage three as shown in FIG. 15. The selects may have the values of 0–63 if a window value is to be used for this output byte or the values of 64–71 if one of the eight data bytes is to be used for this output byte. The overflow bit 26008 may be set if the data for the preliminary select 26010 is a result of one or more of the other parallel decodes occurring with this data. In this case, the index may be used in stage three to resolve the preliminary select by copying the appropriate select from another output byte to the select for this output byte.

Other embodiments may use history windows of various sizes, for example, from 32 entries to 4096 (or greater) entries. The size of the history window may be determined by the number of gates available for the design, the timing of stage four, and the compression ratio desired. More history window entries may typically yield a better compression ratio. As the history window size changes, the size of the index, preliminary and final selects may also change. For example, a history window with 2048 entries would require an 11-bit index, 13-bit preliminary select (11 bits for the index, one bit to indicate data byte, one bit to indicate overflow), and 12-bit final select (11 bits for the index, one bit to indicate data byte).

In one example of a decode where an overflow bit may be set, a first decoder may decode a first token and output a pointer to a first data byte, and a second decoder may decode a second token and output a pointer to a second data byte. A third decoder may decode a third token that represents a compressed string including the first and second data bytes from the first and second tokens. As these data bytes are not in the history window yet, the overflow bit 26008 is set to signify that the data for the third decoder's output byte is defined by one of the prior decoders in the current decode.

The preliminary select output of the second stage for the third decoder is resolved into a final select in the third stage. In this example, two preliminary selects may be generated for the third token; the first pointing to the first decoder's output byte, and the second pointing to the second decoder's output byte.

In FIG. 18, if the preliminary select is for a data byte, the overflow bit 26008 will not be set, the most significant bit (bit 6) will be set, and bits 0–2 may be used to specify which of the eight data bytes the output byte refers to. If the preliminary select is for a window byte, the overflow bit 26008 will not be set, the most significant bit (bit 6) will not be set, and bits 0–5 may be used to specify which of the 64 window bytes the output byte refers to. If the overflow bit is set for the preliminary select, then bits 0–6 may specify which of the preliminary selects prior to this preliminary select is to be used to locate the data for this preliminary select.

In FIG. 18, N is the output byte number for the logic 26012. In this example, there are 16 output bytes, so N is an integer between 0 and 15. In this example, there are eight decoders in the first stage. One start count 26000, one index 26006, and one data byte valid bit and one index valid bit are input from each decoder. The start count for a decoder is calculated in stage one by adding the number of output bytes to be generated on this decoder to the input number of output bytes to be generated on all previous decoders (i.e. the start count for the previous decoder). For example, suppose there are four decoders (0–3), and decoder 0 is loaded with a code to decode 1 output byte, decoder 1 is loaded with a code to decode 3 output bytes, decoder 2 is loaded with a code to decode 4 output bytes, and decoder 3 is loaded with a code to decode 2 output bytes. The start count for decoder 0 is (0+1)=1. The start count for decoder 1 is (1+3)=4. The start count for decoder 2 is (4+4)=8. The start count for decoder 3 is (8+2)=10.

Block 26001 of FIG. 18 compares the input start counts for the decoders with N (the output byte number for this logic 26012). Block 26001 chooses the last decoder with a start count <=N. For example, if the eight start counts 26000 in FIG. 18 from decoders 0–7 are (1,3,6,7,11,14,15,20), and N=9 (this is the $10^{th}$ output byte), then decoder 4 (start count=11) would be chosen. This serves to choose the decoder from which this output byte is to be generated.

In this example, block 26001 outputs a 3-bit encoded decoder number and an 8-bit decoded version of the decoder number. The 8-bit decoded version is output to selects 26003, 26005, and 26007, where it is used to select the data byte valid bit 26002, index valid bit 26004, and index 26006 for the decoder generating this output byte.

If the data byte valid bit 26002 for the selected decoder is set and the index valid bit 26004 for the selected decoder is clear, then the encoded 3-bit decoder number is output on bits 0–2 of the preliminary select 26010 (the least significant bits), and bit 6 (the most significant bit) is set to indicate that the preliminary select is for a data byte. Note that for the 64-entry history window and eight data byte embodiment previously described, the data byte select value is in the range 64–71 to select one of the eight data bytes.

If the index valid bit 26004 for the selected decoder is set and the data byte valid bit 26002 for the decoder is clear, then bit 6 (the MSB) of the preliminary select 26010 is cleared. The output byte number N is subtracted from the index 26006 from the selected decoder, and the resulting adjusted index is output on bits 0–5 of preliminary select 26010. By way of example, consider a decompression engine with eight input bytes, eight decoders (0–7), sixteen output bytes (0–15), and a 64-entry history window (0–63). If decoder 0 is decoding a code generating four output bytes, then logic 26012 for output byte 0 will generate the preliminary select for the first byte of the four output bytes being generated from the code on decoder 0. If the index 26006 from decoder 0 is 16, then 16−0=16. This means that the first byte of output from the code being decoded on decoder 0 is to come from entry 16 in the history window, where entry 0 is the most recent entry and entry 63 is the oldest entry. Logic 26012 for output byte 1 will generate the preliminary select for the second byte of the four output bytes being generated from the code on decoder 0. The second byte's preliminary select is 16−1=15. The second byte of output from the code being decoded on decoder 0 is to come from entry 15 in the history window. Continuing, the preliminary selects for the third and fourth output bytes, being generated on logic 26012 for output bytes 2 and 3, are 14 and 13, respectively.

It is possible for a preliminary select being generated in a logic 26012 to be for data being generated in the current decompression cycle, and thus the data for the output byte will not yet be in the history window. In this case, subtracting the output byte number N from the index will produce a negative result, and overflow bit 26008 will be set for the preliminary select. For example, if decoder 3 is decoding a code generating three output bytes, output byte 5 is the next available output byte, and the index for decoder 3 is 1, then logic 26012 for output byte 5 will generate a preliminary select of 1−0=1, logic 26012 for output byte 6 will generate a preliminary select of 1−1=0, and logic 26012 for output byte 7 will generate a preliminary select of 1−2=−1. The −1 preliminary select indicates that the data for the output byte is to come from the first output byte of the current decompression cycle. The overflow bit for output byte 7 will be set to indicate that this preliminary select is for data that is not yet in the history window. The preliminary select outputs on bits 0–5 will indicate which of the preliminary selects in the current decompression cycle points to the data for this preliminary select.

In one embodiment of logic 26012, data byte valid bit 26002 and index valid bit 26004 are NOR'd, and the output of the NOR is OR'd to bits 5 and 6 of the preliminary select. If both valid bits are 0 for a decoder, then bits 5 and 6 will be set for the preliminary select. Note that in the embodiment with 64 history window entries and eight data bytes, values above 71 are not valid selects. Thus, in this embodiment, a preliminary select for an output byte with bits 5 and 6 set may be used to indicate that no data is being generated for the output byte in this decompression cycle. Other embodiments with different history window sizes, number of data bytes, and/or number of output bytes may use other invalid select values to indicate that no data is being generated for an output byte in a decompression cycle.

Figure 19:
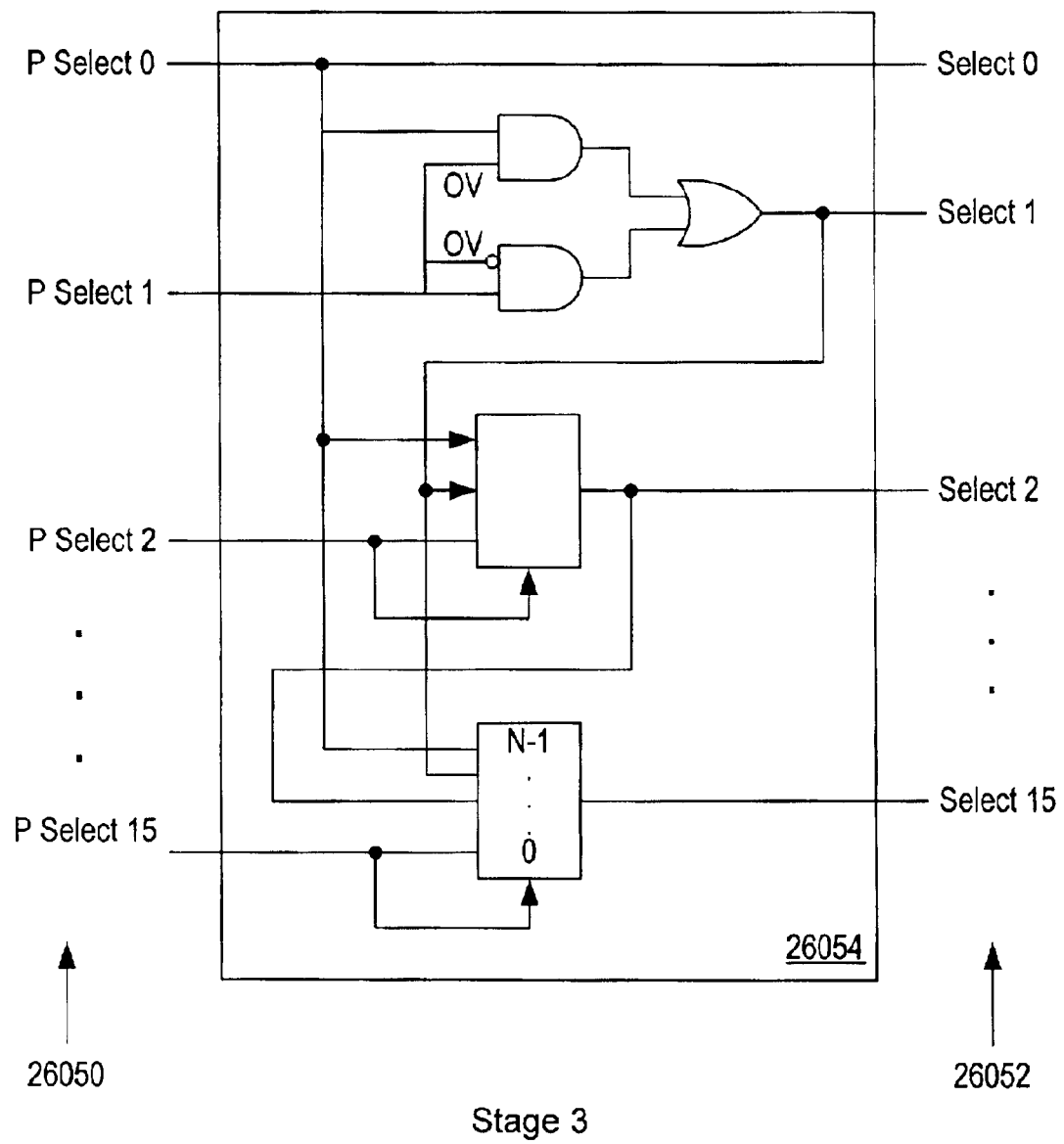
FIG. 19 illustrates a portion of the third of the four stages illustrated in FIG. 15 for converting preliminary selects generated in stage two into final selects according to one embodiment.

FIG. 19—Converting Preliminary Selects into Final Selects

FIG. 19 depicts one embodiment of a third stage of a decompression engine 550 such as stage three 25509 of FIG. 15. The third stage checks the preliminary selects 26050 for the output bytes from the previous stage. If the overflow bit (26008 of FIG. 18) of a preliminary select is not set, the 7-bit select for the output byte (bits 0–6 of preliminary select 26010 of FIG. 18) is passed to the next stage unchanged. If the overflow bit is set, this indicates that the data for this output byte is being generated in the current decompression cycle. The data for the preliminary select will be pointed to by one of the previous output byte selects in the current decompression cycle. The select for the previous output byte is replicated on the select lines for this output byte. Note that the overflow bit for the first select (preliminary select 0) will not be set, because there are no "prior" selects in the current decode for the select to refer to. Thus, preliminary select 0 passes through stage three unchanged as final select 0. Final select 0 is input into the logic for resolving each of the preliminary selects subsequent to select 0 (preliminary selects 1 through N−1). Final select 0 and preliminary select 1 are input into the logic for resolving preliminary select 1. If the overflow bit for preliminary select 1 is not set, then preliminary select 1 is passed through unchanged as final select 1. If the overflow bit is set, then the final select 0 is passed through as the final select for select 1. Final selects 0 and 1 and preliminary select 2 are input into the logic for resolving preliminary select 2. If the overflow bit for preliminary select 2 is not set, then preliminary select 2 is passed through as final select 2. If the overflow bit is set, then preliminary select 2 is used to determine which of the input final selects (0 and 1) is to be output as final select 2. In general, this procedure is followed for all of the N input preliminary selects. Thus, the input to the logic for resolving preliminary select N−1 includes the final selects for selects 0 through N−2, and preliminary select N−1. If the overflow bit is not set for preliminary select N−1, then preliminary select N−1 is passed through unchanged as final select N−1. If the overflow bit is set, then the contents of preliminary select N−1 are used to determine which of the input final selects is to be used as the value for final select N−1.

Figure 20:
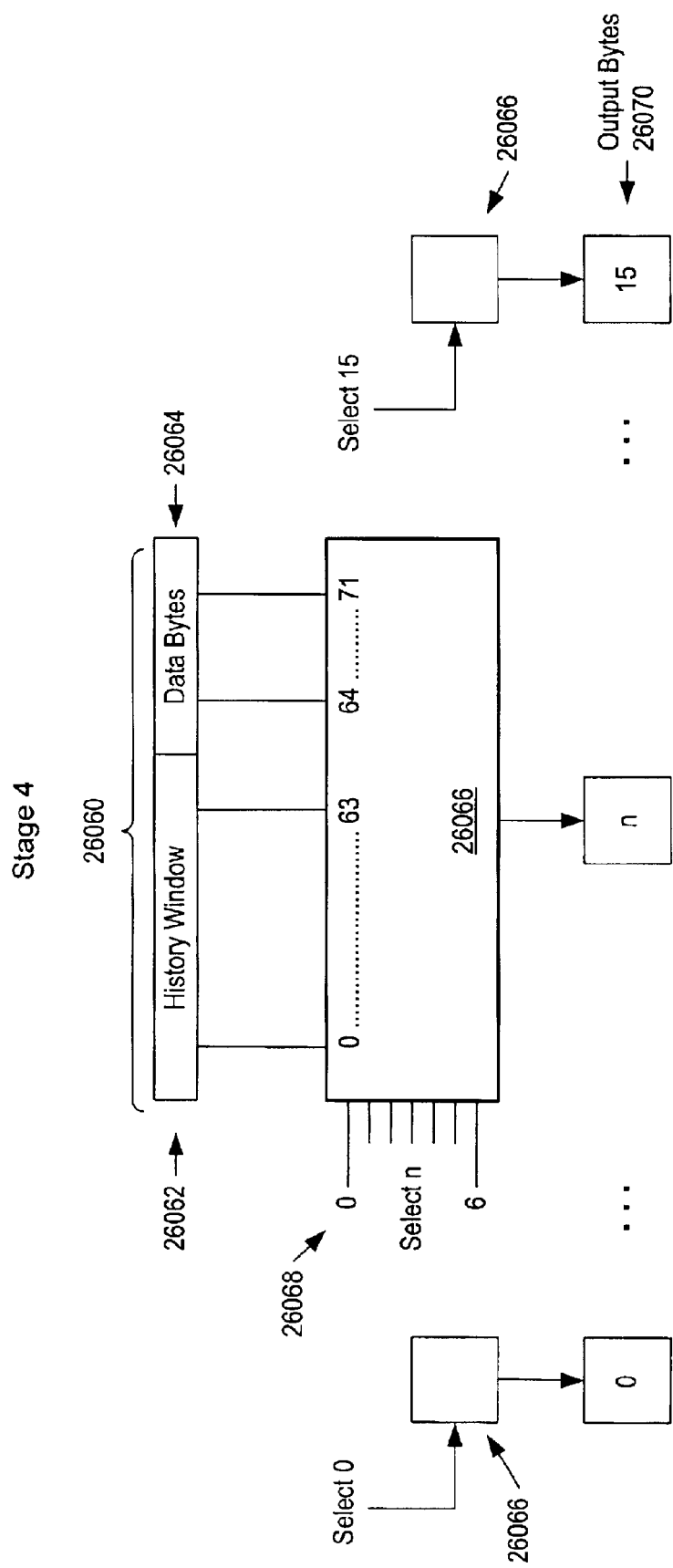
FIG. 20 illustrates a portion of the fourth of the four stages illustrated in FIG. 15 for generating uncompressed output bytes from selects generated in the first three stages according to one embodiment.

FIG. 20—Generating Uncompressed Output Bytes from Generated Selects

FIG. 20 depicts one embodiment of a fourth stage of a decompression engine 550 such as stage four 25513 of FIG. 15. In stage four, the final selects 26068 output from the third stage as depicted in FIG. 19 are used to assemble the output bytes 26070 by selecting bytes from the history window 26062 or the data bytes 26064 passed from the first stage. In this embodiment, each output byte selector 26066 may select from one of 64 bytes (0–63) in history window 26062 or from one of eight bytes (64–71) in data bytes 26064. In one embodiment history window 26062 and data bytes 26064 may be combined in a combined history window 26060. In other embodiments, the data bytes and history window may be maintained separately. The final selects 26068 are indexes into either the history window 26062 or the data bytes 26064 passed from stage one. The output bytes 26070 that are assembled may be sent to the output data stream (appended to the end of the output bytes from any previous decompression cycles) and may be inserted in the history window for the next decode cycle. Stage four may also include a data valid bit (not shown) for each of the output bytes 26070 so that the proper output data assembly may occur if fewer than the maximum number of bytes (16 in this embodiment) are to be decoded in a decode cycle. In one embodiment, an invalid index value in a final select for an output byte may clear the data bit to indicate that the output byte does not contain valid data in this decompression cycle. Output bytes that are not valid may not be sent to the output data or written in the history window.

Figure 21:
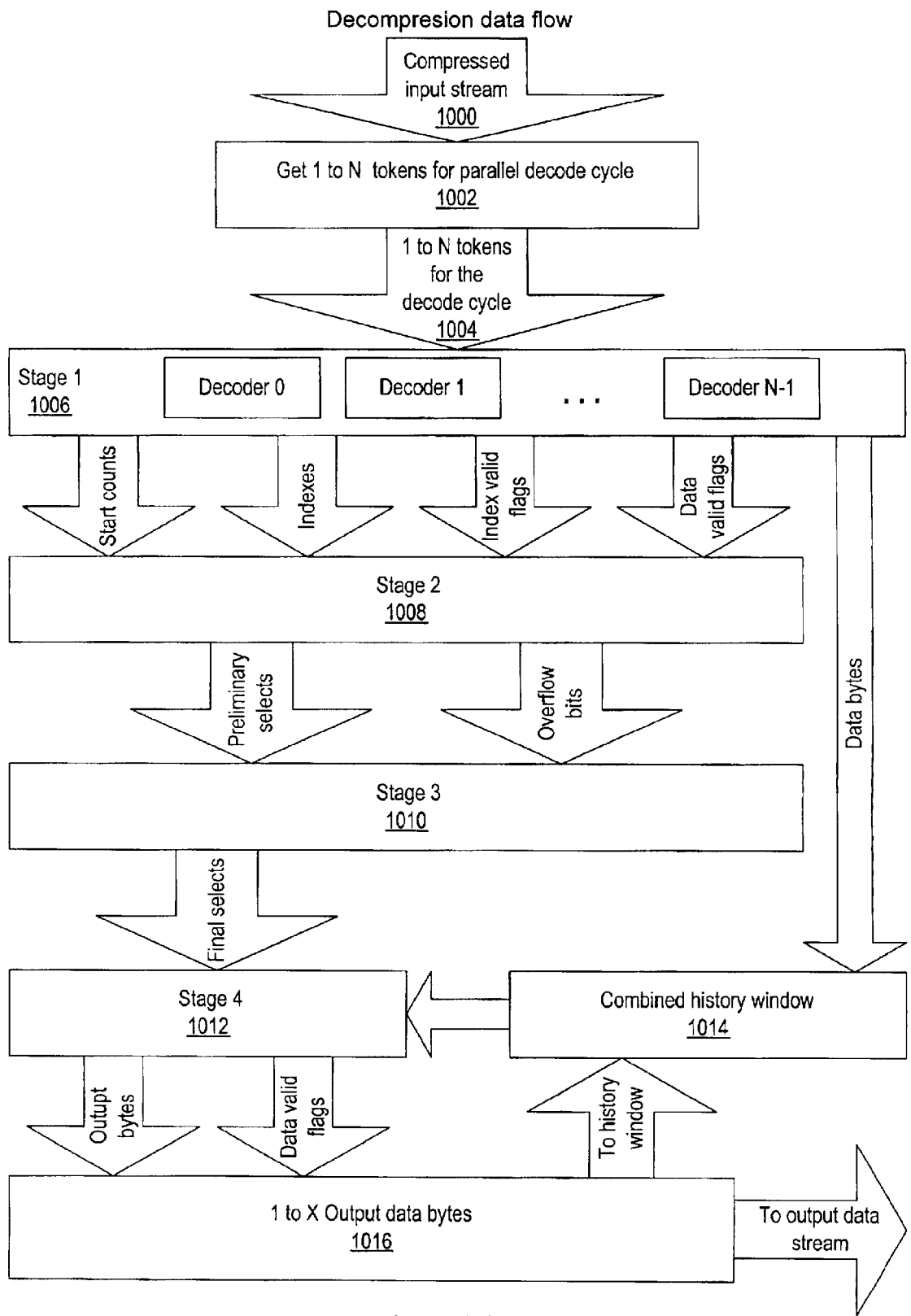
FIG. 21 illustrates the data flow through the parallel lossless decompression engine according to one embodiment.

FIG. 21—Data Flow Through a Decompression Engine

FIG. 21 illustrates data flow through one embodiment of a decompression engine 550. The decompression engine 550 receives a compressed input stream 1000. The compressed input stream 1000 is then decompressed in one or more decode (or decompression) cycles, resulting in a decompressed output stream.

As a first step 1002 of a decompression cycle, from 1 to N tokens from the compressed data stream 1000 may be selected for the decompression cycle and loaded in the decompression engine 550, where N is the maximum number of decoders in stage one. The tokens are selected serially from the first token in the data stream 1000. In one embodiment, a section may be extracted from the compressed data stream 1000 to serve as input data for a decompression cycle, and the tokens may be extracted from the extracted section. For example, in one embodiment, a section of four bytes (32 bits) may be taken, and in another embodiment, a section of eight bytes (64 bits) may be taken. In one embodiment, a token may be selected from the input data stream 1000 for the decompression cycle if 1) there is a decoder available (i.e., one or more decoders haven't been assigned a token to decode in the decompression cycle); and 2) the remaining bits in an input section of the compressed data comprise a complete token (after extracting one or more tokens from the input data, the remaining bits in the input data may not comprise a complete token). If any of the above conditions fails, then the decompression cycle continues, and the last token being examined (the one that failed one of the conditions) is the first token to be loaded in the next decompression cycle. Preferably, no correctly formatted token is ever totally rejected; i.e., any token presented to the decompression cycle as a first token considered for the decompression cycle will meet all the conditional requirements. In other words, 1) a decoder will always be available at the start of a decompression cycle; and 2) the input data size in bits is at least as big as the largest token size in bits.

Figure 22:
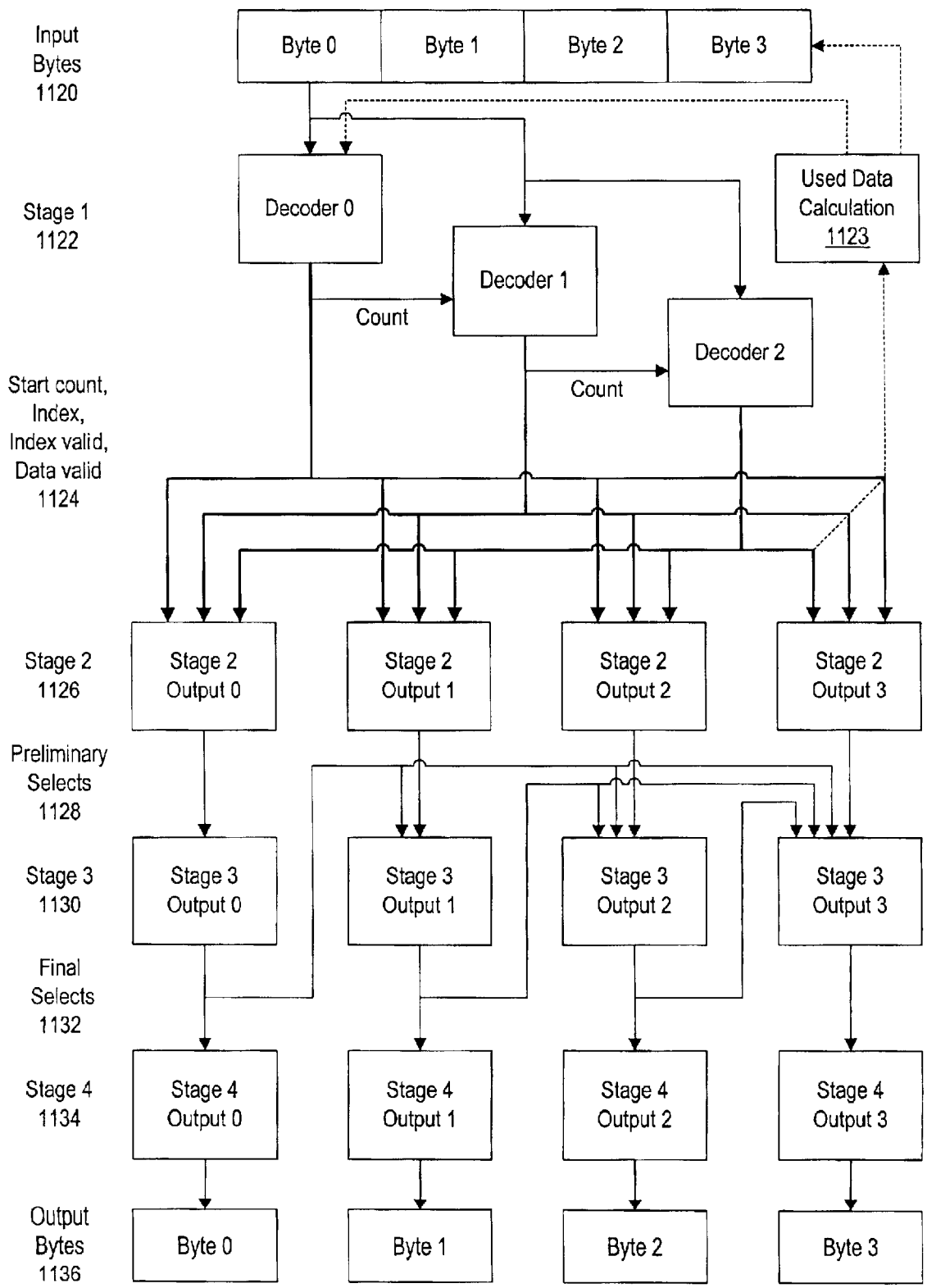
FIG. 22 illustrates a decompression engine with four input bytes, three decoders, and four output bytes according to one embodiment.

Once the 1 to N tokens for the decompression cycle are selected in the first step 1002, the 1 to N tokens are passed into stage one 1006 for decoding. In one embodiment, step 1002 may be performed as part of stage one of the decompression engine 550. In one embodiment, one token is assigned to one decoder, and one decoder may process one token in a decompression cycle. Stage one may include N decoders. There are preferably at least enough decoders to accept a maximum number of tokens that may be in the input data. For example, if the input data is 32 bits, and the minimum token size is 9 bits, then there are preferably at least three decoders. Preferably, the number of decoders equals the maximum number of tokens in the input data. FIG. 16 illustrates an embodiment of decompression engine 550 with eight decoders. FIG. 22 illustrates an embodiment of decompression engine 550 with three decoders. FIG. 17 illustrates an embodiment of a decoder. The decoders of stage one 1006 decode the input tokens into start counts, indexes, index valid flags, and data valid flags, with one copy of each from each decoder being passed to stage two 1008 for each of the X output bytes to be generated in the decompression cycle. The 1 to N original input data bytes are passed from stage one to the combined history window 1014. A data byte is valid only if the token being decoded on the decoder represents a byte that was stored in the token in uncompressed format by the compression engine that created the compressed data. In this case, the uncompressed byte is passed in the data byte for the decoder, the data byte valid bit for the decoder is set, and the index valid bit for the decoder is cleared.

Stage two 1008 takes the inputs from stage one 1006 and generates preliminary selects for 1 to X output bytes, where X is a maximum number of output bytes that may be decoded in one decompression cycle. Stage two 1008 also generates an overflow bit for each preliminary select. Stage two then passes the preliminary selects and overflow bits to stage three 1010. Stage three 1010 inspects the overflow bit for each of the preliminary selects. If the overflow bit of a preliminary select is not set, then the contents of the preliminary select point to one of the entries in the history window 1014 if the index valid bit is set for the output byte, or to one of the data bytes passed from stage one 1006 to the combined history window if the data byte valid bit is set for the output byte. Preliminary selects whose overflow bits are not set are passed to stage four 1012 as final selects without modification. If the overflow bit is set, then the contents of the preliminary select are examined to determine which of the other preliminary selects is generating data this preliminary select refers to. The contents of the correct preliminary select are then replicated on this preliminary select, and the modified preliminary select is passed to stage four 1012 as a final select. In one embodiment, a preliminary select with overflow bit set may only refer to prior preliminary selects in this decompression cycle. For example, if the overflow bit for the preliminary select for output byte 3 is set, then the preliminary select may refer to data being generated by one of preliminary selects 0 through 2, and not to preliminary selects 4 through (N–1). In one embodiment, stages two and three may be combined into one stage.

Stage four 1012 uses the final selects it receives from stage three 1010 to extract byte entries from the combined history window 1014. The final selects may point to either history window bytes or data bytes passed from stage one 1006. The number of bits in a final select are determined by the number of entries in the history window plus the number of data bytes. For example, a 64-byte history window plus eight data bytes totals 72 possible entries in the combined history window, requiring seven bits per final select. Other history window sizes and/or number of data bytes may require different final select sizes. Stage four 1012 extracts the data from the combined history window and constructs an output of between 1 and X uncompressed output data bytes 1016. Stage four 1012 may use a data valid flag for each of the X output data bytes to signal if a data byte is being output for this output data byte in this decompression cycle. The data valid flags are necessary because it may not always be possible to decompress the maximum amount of output bytes (X) in a decompression cycle. The output bytes 1016 may then be appended to the output data stream and written into the history window 1014. In one embodiment, if the history window is full, the oldest entries may be shifted out of the history window to make room for the new output bytes 1016, or alternatively the history window may be stored in a ring buffer, and the new entries may overwrite the oldest entries. The decompression cycle may be repeated until all of the tokens in the input stream 1000 are decompressed.

FIG. 22—A Decompression Engine With Four Input Bytes, Three Decoders, and Four Output Bytes FIG. 22 illustrates an embodiment of decompression engine 550 with four input bytes 1120 comprising 32 bits, three decoders in stage one 1122, and four output bytes 1136. This embodiment is suitable for decoding codes (tokens) similar to those depicted in FIG. 14, excluding the 8-bit code used to encode one compressed byte. FIG. 22 illustrates that in stage two 1126, stage three 1130, and stage four 1134, there is parallel logic for generating each of the output bytes (in this embodiment, four output bytes).

One or more tokens are extracted from input bytes 1120 and loaded into decoders in stage one 1122. The tokens are decoded by the decoders, and start count, index, index valid and data valid information 1124 is passed to stage two 1126. Data byte information (not shown) may also be produced for the decoders and passed through for use in stage four 1134. The information 1124 from each decoder is copied to the stage two logic for each output byte. Stage two 1126 generates preliminary selects 1128 from the information 1124 passed in from stage one 1122. Stage two 1126 passes the preliminary selects to stage three 1130. Stage three 1130 generates final selects 1132 from the preliminary selects 1128 passed from stage two 1126. As shown, the final select 1132 generated on a stage three logic 1130 for an output byte is passed to the stage three logic for all subsequent output bytes. This allows a preliminary select 1128 with overflow bit set indicating that the data for the output byte is being generated in the current decompression cycle to be resolved by copying the final select for the correct output byte to be used as the final select for this output byte. The final selects 1132 are passed to stage four 1134. Stage four 1134 uses index information in the final selects 1132 to select entries from the history window (not shown) or the data bytes passed from the decoders in stage one 1122 and copies the selected data into output bytes 1136. The output bytes 1136 may then be written to the output data (not shown), and may also be written into the history window as the latest history window entries.

Used Data Calculation logic 1123 in stage one may be used to maintain a count of output bytes being generated in the current decompression, and also to maintain a count of the number of tokens being decoded and decompressed in the current decompression cycle. This information is used in stage one for shifting the compressed data prior to extracting the input bytes 1120 in a later decompression cycle.

FIGS. 23a–23f—Flowcharts Describing a Parallel Decompression Engine

FIGS. 23a–23f illustrate flowcharts describing embodiments of parallel decompression processing in embodiments of decompression engine 550.

Figure 23A:
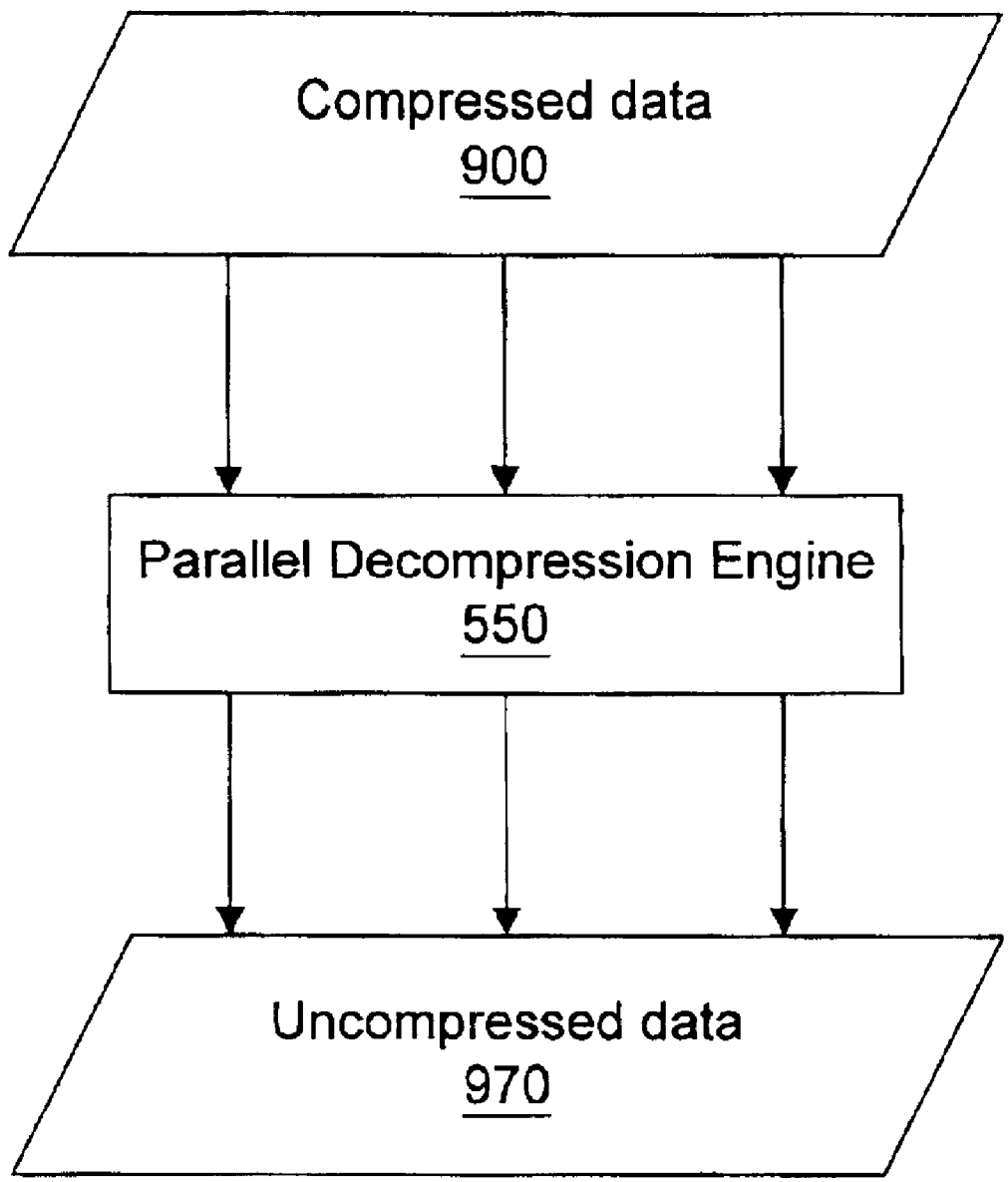
FIG. 23a is a high-level flowchart of the operation of a parallel decompression engine according to one embodiment.

FIG. 23a—The Operation of a Parallel Decompression Engine

Figure 23B:
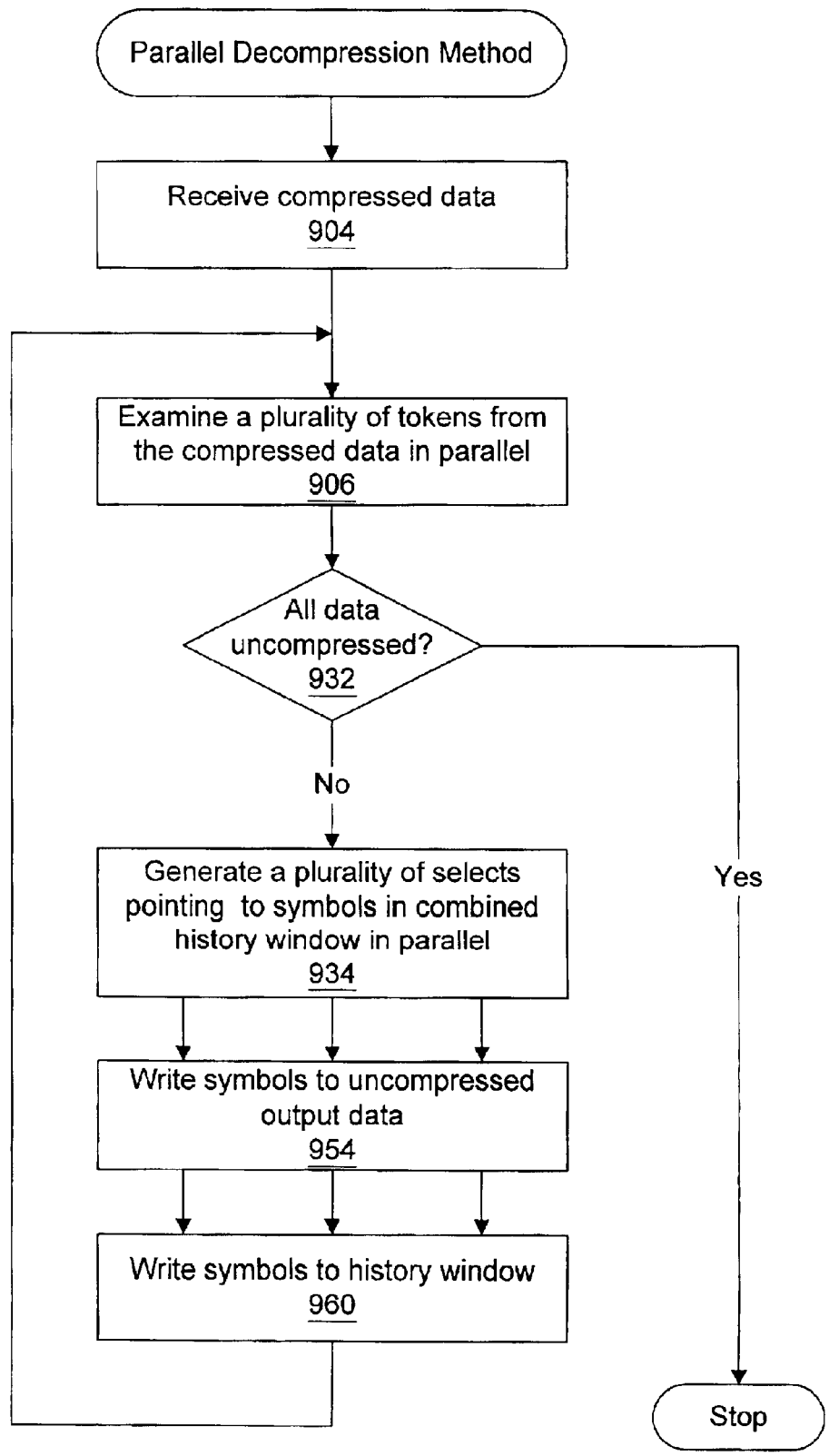
FIG. 23b is a flowchart illustrating a parallel decompression method according to one embodiment.
Figure 23C:
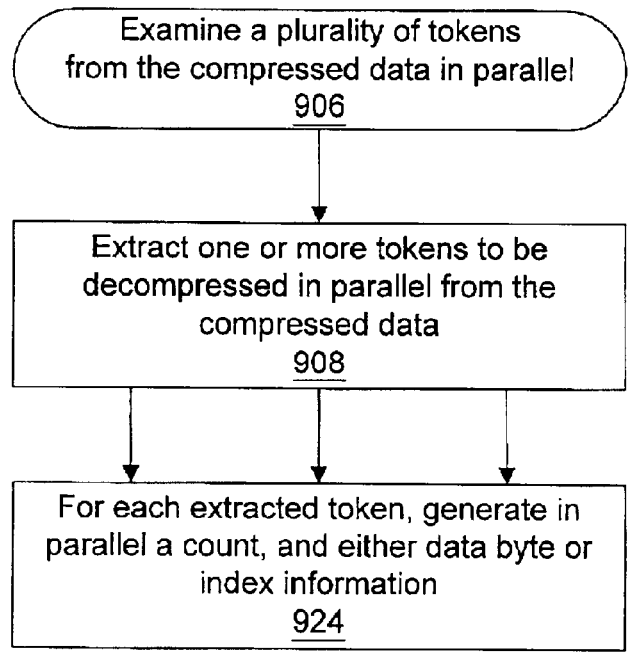
FIG. 23c is a flowchart illustrating a process for examining a plurality of tokens from the compressed data in parallel according to one embodiment.

FIG. 23a is a high-level flowchart illustrating an embodiment of decompression processing in an embodiment of parallel decompression engine 550. Parallel decompression engine 550 receives compressed data 900 to be decompressed, and outputs uncompressed data 970. Compressed data 900 is a compressed representation of uncompressed data 970. Compressed data 900 may comprise one or more tokens. Each token in compressed data 900 may be an encoded description of one or more uncompressed symbols in uncompressed data 970. Compressed data 900 may have been compressed by any of a variety of compression methods, including, but not limited to parallel and serial compression methods. FIGS. 23b–23f illustrate the flowchart of FIG. 23a in greater detail FIG. 23b—A Parallel Decompression Method FIG. 23b illustrates an embodiment of a parallel decompression method performed in one embodiment of the parallel decompression engine 550 of FIG. 23a. FIG. 23b illustrates that compressed data may be decompressed in a series of cycles, with one or more tokens from the compressed data examined and decompressed in parallel in each cycle. In block 906, the parallel decompression engine may examine a plurality of tokens from the decompressed data. The plurality of tokens may be examined in parallel, i.e., more than one token may be examined at a time. If it is determined in block 906 that all tokens in the compressed data have been decompressed by the decompression engine, then in block 932 the decompression process may stop. If it is determined in block 906 that there are tokens to be examined and decompressed, then the tokens are examined, and information extracted from the tokens in block 906 may be passed to block 934. In one embodiment, the information extracted from the tokens is passed to block 934 in parallel.

In block 934, the information extracted from the tokens in block 906 may be used to generate a plurality of selects, or pointers, that point to symbols in a combined history window. The combined history window may include uncompressed symbols from previous cycles of the decompression engine. The portion of the combined history window comprising uncompressed symbols from previous decompression cycles may be referred to as the history window or history table. The combined history window may also include uncompressed symbols from the current decompression cycle. The uncompressed symbols from the current decompression cycle may be referred to as "data bytes." During compression, one or more uncompressed symbols may not be compressed, and may be stored in a token in uncompressed form. The decompression engine recognizes tokens comprising uncompressed symbols, extracts the uncompressed symbols from the tokens, and passes the uncompressed symbol to the combined history window unchanged. Thus, selects generated in block 934 may point to either uncompressed symbols from previous decompression cycles or uncompressed symbols from the tokens being decompressed in the current cycle.

In block 954, the decompression engine uses the selects generated in block 934 to extract the one or more uncompressed symbols pointed to by the selects from the history window, and copies the extracted uncompressed symbols to uncompressed output data 970. The uncompressed symbols may be appended to the end of output data 970. Output data may be an output data stream, i.e., the data may be streamed out to a requesting process as it is decompressed, or alternatively the output data 970 may be an uncompressed output file that is not released until the entire compressed data 900 is decompressed.

In block 960, the uncompressed symbols from the current decompression cycle may be written to the history window. If the history window is full, one or more of the oldest symbols from previous decompression cycles may be moved out of the history window prior to writing the uncompressed symbols from this decompression cycle. The oldest symbols may be shifted out of the history window, or alternatively the history window may be a "ring buffer," and the oldest symbols may be overwritten by the new symbols. FIGS. 23c–23f illustrate the flowchart of FIG. 23b in greater detail FIG. 23c—Examining a Plurality of Tokens in Parallel FIG. 23c expands on block 906 of FIG. 23b, illustrating one embodiment of a method for examining a plurality of tokens from the compressed data 900 in parallel. In block 908, one or more tokens to be decompressed in parallel in the current decompression cycle may be extracted from the compressed data 900. The tokens may be extracted from the compressed data beginning at the first token compressed by the compression engine that compressed the data, and ending at the last token compressed by the compression engine. A maximum number of tokens may be decompressed in one cycle. As an example, the decompression logic illustrated in FIG. 15 accepts a maximum of eight tokens in a decompression cycle. Preferably, a decompression engine may accept less than the maximum number of tokens in a decompression cycle. Thus, the decompression logic illustrated in FIG. 15 accepts a minimum of one token in a decompression cycle, for example, in a last decompression cycle when only one token is left to decompress. If a token represents more uncompressed output symbols than can be compressed in a decompression cycle, then it will take more than one decompression cycle to fully decompress the token. Information in the token may be used in extracting the token. For example, the size of the token and the number of symbols to be decompressed by the token may be used in extracting the token. In one embodiment, the size of a token may be the size in bits of the token.

In block 924, the tokens extracted for this decompression cycle may be examined in parallel, and information about the tokens may be generated for use in the decompression cycle. Examples of information that may be extracted from a token include, but are not limited to: a count representing the number of uncompressed symbols this token represents; data byte information; and index information. Data byte information may include an uncompressed symbol if this token represents a symbol that was not compressed by the compression engine. Data byte information may also include a data byte valid flag indicating that the data byte for this token is valid. In one embodiment, the data byte valid flag may be a bit that is set (1) if the data byte is valid, and not set (0) if the data byte is not valid. Index information may include an index. In one embodiment, the index may represent an offset from the position in the uncompressed data 970 to receive first uncompressed symbol to be decompressed from the information in this in this token to the first uncompressed symbol previously decompressed and stored in the uncompressed data 970 to be copied into the position. In one embodiment, the previously decompressed symbols from one or more decompression cycles may be in a history window, and the maximum value for the index may be related to the length of the history window. In one embodiment, the index valid flag may be a bit that is set (1) if the index is valid, and not set (0) if the index is not valid.

Figure 23D:
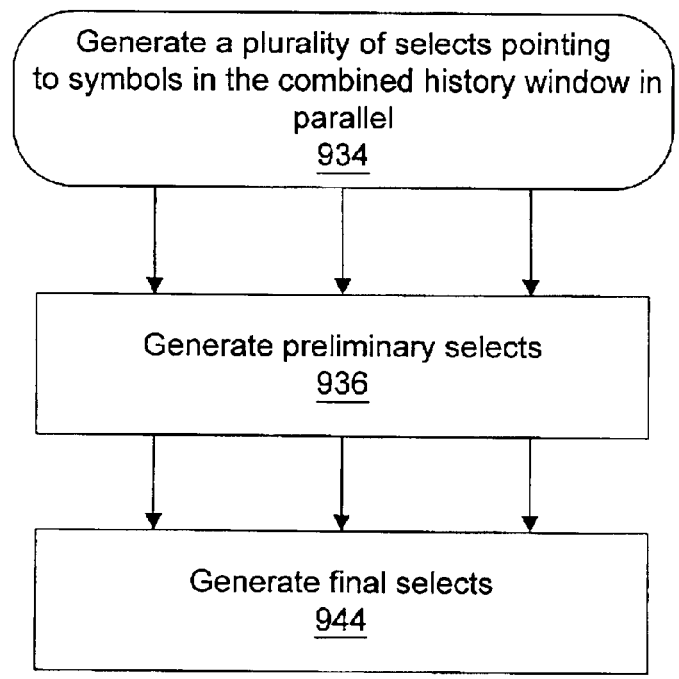
FIG. 23d is a flowchart illustrating a process for generating a plurality of selects to symbols in a combined history window according to one embodiment.

FIG. 23d—Generating a Plurality of Selects to Symbols in a Combined History Window FIG. 23d expands on block 934 of FIG. 23b, and illustrates one embodiment of a process for generating in parallel a plurality of selects to symbols in a combined history window. In block 936, one or more preliminary selects may be generated using the information generated in block 924 for this decompression cycle. A preliminary select may be generated for each of the symbols being decompressed in the current decompression cycle. In one embodiment, a preliminary select is an adjusted index with a single bit overflow. The index is adjusted by an offset from a starting index of a string of symbols in previous uncompressed symbols. The size of the preliminary select is determined by the combined size of the history window, the maximum number of data bytes (determined by the number of decoders), and the overflow bit. For example, for a 64-entry history window, plus eight data bytes, plus a single overflow bit, a preliminary select may be a minimum of eight bits. In this example, the selects may have the values of 0–63 if a window value is to be used for this output symbol or the values of 64–71 if one of the eight data bytes is to be used for this output symbol. The overflow output bit may be set if the data for the output symbol is being generated by one or more of the other tokens being decoded in this decompression cycle. Other combinations of bits may be used to signal to the later stages that no data is being generated for this output symbol in this decompression cycle.

In one example of a decode where an overflow bit may be set, a first decoder may decode a first token and output a pointer to a first data byte, and a second decoder may decode a second token and output a pointer to a second data byte. A third decoder may decode a third token that represents a compressed string including the first and second data bytes generated from the first and second tokens. As these data bytes are not in the history window yet, the overflow bit 26008 is set to signify that the data for the third decoder's output byte is defined by one of the prior decoders in the current decode. The preliminary select output of the second stage for the third decoder is resolved into a final select in the third stage. In this example, two final selects may be generated for the third token; the first pointing to the first decoder's data byte, and the second pointing to the second decoder's data byte.

Figure 23E:
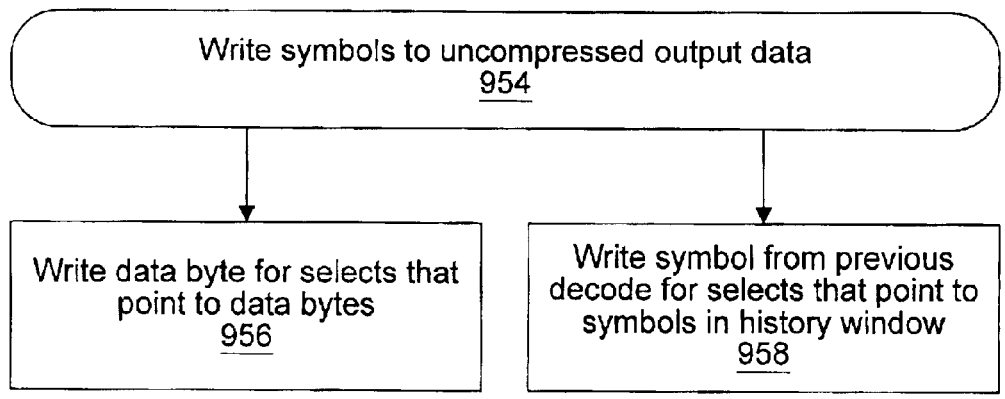
FIG. 23e is a flowchart illustrating a process for writing uncompressed symbols from the combined history window to the output data according to one embodiment.

FIG. 23e—Writing Uncompressed Symbols to the Output Data

FIG. 23e expands on block 954 of FIG. 23b, and illustrates one embodiment of a process for writing the symbols for the output bytes to the uncompressed output data. In block 956, the final selects indexing data bytes passed from the decoders may be used to locate the data bytes and copy the uncompressed data bytes into the output data. In block 958, the final selects indexing symbols in the history window may be used to locate the uncompressed symbols and copy the symbols into the output data. The output symbols may be assembled in the output data in the order of the output symbols in the decompression engine. For example, if there are 16 output symbols (0–15) being generated in a decompression cycle, output symbol 0 may be the first in the output data, and output symbol 15 may be the last. A decompression cycle may not generate a full set of output symbols. For example, with the 16 maximum output symbols in the previous example, a decompression cycle may generate only nine output symbols (output symbols 0–8). Preferably, every decompression cycle decompresses as close to the maximum number of output symbols as possible. Some decompression cycles, for example, the last decompression cycle, may not generate the maximum number of output symbols.

Figure 23F:
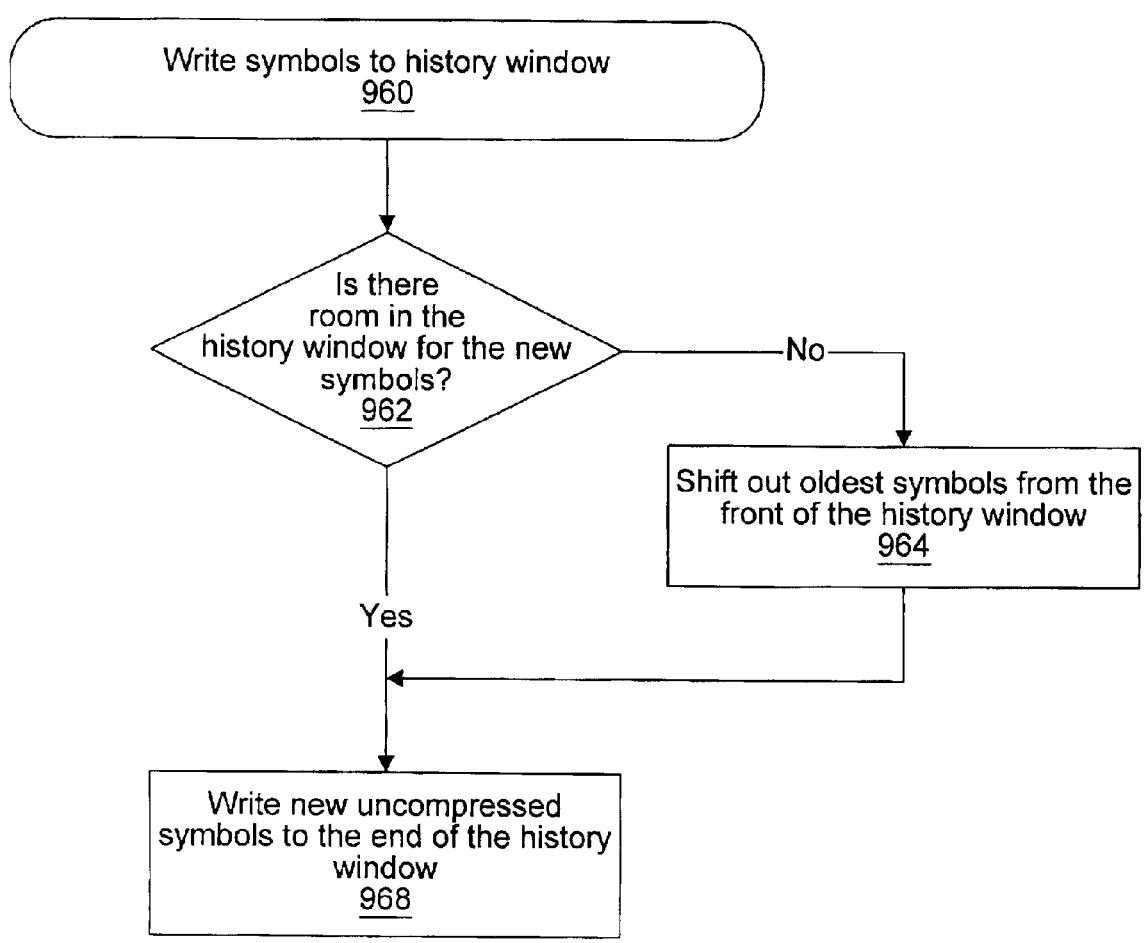
FIG. 23f is a flowchart illustrating a process for writing symbols uncompressed by the current decompression cycle to the history window according to one embodiment.

FIG. 23f—Writing Symbols to the History Window

FIG. 23f expands on block 960 of FIG. 23b, and illustrates one embodiment of a process for writing the symbols uncompressed in a decompression cycle to the history window. In one embodiment, the history window may be set up as a buffer, and the oldest data may be shifted out to make room for the newest data. In another embodiment, the history window may be set up as a ring buffer, and the oldest data may be overwritten by the newest data. Blocks 962 and 964 assume the oldest data may be shifted out of the history window, and may not be necessary in embodiments using a ring buffer for the history window.

In block 962, the history window is examined, and if there is not enough room for the symbols decompressed in this cycle, in block 964 the data in the history window is shifted to make room for the new data. In one embodiment, the history window may be shifted after every decompression cycle to make room for the new data.

In block 966, the newly uncompressed symbols are written to the end of the history window. In one embodiment, the symbols may be written to the history window using the method described for writing the symbols to the output data described for blocks 956 and 958 of FIG. 23e.

Although the system and method of the present invention has been described in connection with the preferred embodiment, it is not intended to be limited to the specific form set forth herein, but on the contrary, it is intended to cover such alternatives, modifications, and equivalents, as can be reasonably included within the spirit and scope of the invention as defined by the appended claims.

What is claimed is:

1. A data compression system comprising:
   a first plurality of compression engines, wherein each of the first plurality of compression engines implements a different respective data compression algorithm, wherein at least one of the first plurality of compression engines implements a parallel data compression algorithm, and wherein each of the first plurality of compression engines is configured to:
   receive uncompressed data; and
   compress the uncompressed data using its respective data compression algorithm;
   wherein the first plurality of compression engines produce a plurality of different versions of the compressed data;
   decision logic coupled to the first plurality of compression engines and configured to:
   select one of the plurality of different versions of the compressed data based upon one or more predetermined metrics; and
   output the selected compressed data.

2. The data compression system of claim 1, wherein the at least one of the first plurality of compression engines implements a parallel lossless data compression algorithm.

3. The data compression system of claim 1, wherein the at least one of the first plurality of compression engines implements a parallel dictionary-based data compression algorithm.

4. The data compression system of claim 1, wherein the at least one of the first plurality of compression engines implements a parallel statistical data compression algorithm.

5. The data compression system of claim 1, wherein the at least one of the first plurality of compression engines implements a parallel data compression algorithm based on a Lempel-Ziv (LZ) algorithm.

6. The data compression system of claim 1, wherein the uncompressed data comprises a plurality of symbols, wherein the at least one of the first plurality of compression engines is operable to compare each of a plurality of received symbols with each of a plurality of entries in a history table concurrently.

7. The data compression system of claim 1,
   wherein the at least one of the first plurality of compression engines comprises:
   an input for receiving the uncompressed data, wherein the uncompressed data comprises a plurality of symbols, wherein the plurality of symbols includes a first symbol, a last symbol, and one or more middle symbols;
   a history table comprising entries, wherein each entry comprises at least one symbol;
   a plurality of comparators for comparing the plurality of symbols with entries in the history table, wherein the plurality of comparators are operable to compare each of the plurality of symbols with each entry in the history table concurrently, wherein the plurality of comparators produce compare results;
   match information logic coupled to the plurality of comparators for determining match information for each of the plurality of symbols based on the compare results, wherein the match information logic is operable to determine if a contiguous match occurs for one or more of the one or more middle symbols that does not involve a match with either the first symbol or the last symbol; and
   an output coupled to the match information logic for outputting compressed data in response to the match information.

8. The data compression system of claim 1, wherein each of the first plurality of compression engines implements a parallel data compression algorithm.

9. The data compression system of claim 8,
   wherein each of the first plurality of compression engines implements a parallel dictionary-based data compression algorithm.

10. The data compression system of claim 9,
    wherein a first compression engine implements a parallel dictionary-based data compression algorithm using tag based encoding;

wherein a second compression engine implements a parallel dictionary-based data compression algorithm using escape characters to differentiate between compressed and raw data sequences in the compressed data.

11. The data compression system of claim 8, wherein each of the first plurality of compression engines comprises:

an input for receiving the uncompressed data, wherein the uncompressed data comprises a plurality of symbols, wherein the plurality of symbols includes a first symbol, a last symbol, and one or more middle symbols;

a history table comprising entries, wherein each entry comprises at least one symbol;

a plurality of comparators for comparing the plurality of symbols with entries in the history table, wherein the plurality of comparators are operable to compare each of the plurality of symbols with each entry in the history table concurrently, wherein the plurality of comparators produce compare results;

match information logic coupled to the plurality of comparators for determining match information for each of the plurality of symbols based on the compare results, wherein the match information logic is operable to determine if a contiguous match occurs for one or more of the one or more middle symbols that does not involve a match with either the first symbol or the last symbol; and an output coupled to the match information logic for outputting compressed data in response to the match information.

12. The data compression system of claim 1, wherein the one or more predetermined metrics includes compression ratio.

13. The data compression system of claim 1, wherein the one or more predetermined metrics includes compression speed.

14. The data compression system of claim 1, wherein, in selecting one of the plurality of different versions of the compressed data, the decision logic is further configured to select a version of the compressed data with a highest compression ratio from among the plurality of versions of the compressed data.

15. The data compression system of claim 1, wherein the decision logic is further configured to:

determine a particular data compression algorithm used in the compression of the selected compressed data; and output information indicating the particular data compression algorithm used in the compression of the selected compressed data.

16. The data compression system of claim 15, wherein the decision logic is further configured to:

encode the information indicating the particular data compression algorithm used in the compression of the selected compressed data into the selected compressed data.

17. The data compression system of claim 1, wherein a first compression engine of the first plurality of compression engines comprises a second plurality of compression engines, wherein each of the second plurality of compression engines implements a first data compression algorithm;

wherein the second plurality of compression engines are configured to compress a plurality of portions of the uncompressed data using the first data compression algorithm to produce a plurality of compressed portions of the uncompressed data; and wherein the first compression engine of the first plurality of compression engines is configured to merge the plurality of compressed portions of the uncompressed data to produce a version of the compressed data.

18. The data compression system of claim 17, wherein the second plurality of compression engines is configured to compress the plurality of portions of the uncompressed data in a parallel fashion.

19. A data compression system comprising:

a plurality of compression engines, wherein each of the plurality of compression engines implements a different data compression algorithm, wherein at least one of the plurality of compression engines implements a parallel lossless data compression algorithm;

and wherein the plurality of compression engines are configured to:

receive uncompressed data; and compress the uncompressed data using the different data compression algorithms to produce a plurality of different versions of the compressed data;

decision logic coupled to the plurality of compression engines and configured to:

select one of the plurality of different versions of the compressed data as a most qualified version of the compressed data based upon one or more predetermined metrics; and output the most qualified version of the compressed data.

20. The data compression system of claim 19, wherein the at least one of the plurality of compression engines implements a parallel dictionary-based data compression algorithm.

21. The data compression system of claim 20, wherein the uncompressed data comprises a plurality of symbols, wherein the at least one of the plurality of compression engines is operable to compare each of a plurality of received symbols with each of a plurality of entries in a history table concurrently.

22. The data compression system of claim 19, wherein the at least one of the plurality of compression engines comprises:

an input for receiving the uncompressed data, wherein the uncompressed data comprises a plurality of symbols, wherein the plurality of symbols includes a first symbol, a last symbol, and one or more middle symbols;

a history table comprising entries, wherein each entry comprises at least one symbol;

a plurality of comparators for comparing the plurality of symbols with entries in the history table, wherein the plurality of comparators are operable to compare each of the plurality of symbols with each entry in the history table concurrently, wherein the plurality of comparators produce compare results;

match information logic coupled to the plurality of comparators for determining match information for each of the plurality of symbols based on the compare results, wherein the match information logic is operable to determine if a contiguous match occurs for one or more of the one or more middle symbols that does not involve a match with either the first symbol or the last symbol; and an output coupled to the match information logic for outputting compressed data in response to the match information.

23. The data compression system of claim 19, wherein at least one of the plurality of compression engines performs parallel data compression using a plurality of parallel compression engines each operating in parallel on a different respective portion of said uncompressed data.

24. A data compression system comprising:
- a plurality of compression engines, wherein each of the plurality of compression engines implements a different data compression algorithm, wherein at least one of the plurality of compression engines implements a parallel lossless data compression algorithm;
- first logic coupled to the plurality of compression engines and configured to:
  - receive uncompressed data;
  - send the uncompressed data to each of the plurality of compression engines;
- wherein each of the plurality of compression engines is configured to:
  - receive the uncompressed data from the first logic;
  - compress the uncompressed data using a data compression algorithm implemented by the particular compression engine to produce a version of compressed data; and
  - output the compressed data;
- second logic coupled to the plurality of compression engines and configured to:
  - receive from the plurality of compression engines a plurality of different versions of the compressed data each compressed with a different compression algorithm; and
  - select one of the plurality of different versions of the compressed data based upon one or more predetermined metrics; and
  - output the selected compressed data.

25. The data compression system of claim 24, wherein the at least one of the plurality of compression engines implements a parallel dictionary-based data compression algorithm.

26. The data compression system of claim 25, wherein the uncompressed data comprises a plurality of symbols, wherein the at least one of the plurality of compression engines is operable to compare each of a plurality of received symbols with each of a plurality of entries in a history table concurrently.

27. The data compression system of claim 24,
- wherein the at least one of the plurality of compression engines comprises:
  - an input for receiving the uncompressed data, wherein the uncompressed data comprises a plurality of symbols, wherein the plurality of symbols includes a first symbol, a last symbol, and one or more middle symbols;
  - a history table comprising entries, wherein each entry comprises at least one symbol;
  - a plurality of comparators for comparing the plurality of symbols with entries in the history table, wherein the plurality of comparators are operable to compare each of the plurality of symbols with each entry in the history table concurrently, wherein the plurality of comparators produce compare results;
  - match information logic coupled to the plurality of comparators for determining match information for each of the plurality of symbols based on the compare results, wherein the match information logic is operable to determine if a contiguous match occurs for one or more of the one or more middle symbols that does not involve a match with either the first symbol or the last symbol; and
  - an output coupled to the match information logic for outputting compressed data in response to the match information.

28. The data compression system of claim 24, wherein the one or more predetermined metrics includes compression ratio.

29. The data compression system of claim 24, wherein the one or more predetermined metrics includes compression speed.

30. The data compression system of claim 24, wherein, in selecting the compressed data, the second logic is further configured to select a version of the compressed data with a highest compression ratio from among the plurality of different versions of the compressed data.

31. The data compression system of claim 24, wherein the second logic is further configured to:
- determine a particular data compression algorithm used in the compression of the selected compressed data; and
- output information indicating the particular data compression algorithm used in the compression of the selected compressed data.

32. A system comprising:
- a processor;
- a memory coupled to the processor and operable to store data for use by the processor;
- data compression logic coupled to the memory, comprising:
  - a plurality of compression engines, wherein each of the plurality of compression engines implements a different respective data compression algorithm, wherein at least one of the plurality of compression engines implements a parallel data compression algorithm, and wherein each of the plurality of compression engines is configured to:
    - receive uncompressed data; and
    - compress the uncompressed data using its respective data compression algorithm;
  - wherein the plurality of compression engines produce a plurality of different versions of the compressed data;
  - decision logic coupled to the plurality of compression engines and configured to:
    - select one of the plurality of different versions of the compressed data based upon one or more predetermined metrics; and
    - output the selected compressed data.

33. The system of claim 32, wherein the at least one of the plurality of compression engines implements a parallel dictionary-based data compression algorithm.

34. The system of claim 33, wherein the uncompressed data comprises a plurality of symbols, wherein the at least one of the plurality of compression engines is operable to compare each of a plurality of received symbols with each of a plurality of entries in a history table concurrently.

35. The system of claim 32,
- wherein the at least one of the plurality of compression engines comprises:
  - an input for receiving the uncompressed data, wherein the uncompressed data comprises a plurality of symbols, wherein the plurality of symbols includes a first symbol, a last symbol, and one or more middle symbols;
  - a history table comprising entries, wherein each entry comprises at least one symbol;
  - a plurality of comparators for comparing the plurality of symbols with entries in the history table, wherein the plurality of comparators are operable to compare each of the plurality of symbols with each entry in the history table concurrently, wherein the plurality of comparators produce compare results;

match information logic coupled to the plurality of comparators for determining match information for each of the plurality of symbols based on the compare results, wherein the match information logic is operable to determine if a contiguous match occurs for one or more of the one or more middle symbols that does not involve a match with either the first symbol or the last symbol; and an output coupled to the match information logic for outputting compressed data in response to the match information.

36. The system of claim 32, wherein each of the plurality of compression engines implements a parallel dictionary-based data compression algorithm.

37. The system of claim 36, wherein a first compression engine implements a parallel dictionary-based data compression algorithm using tag based encoding;

wherein a second compression engine implements a parallel dictionary-based data compression algorithm using escape characters to differentiate between compressed and raw data sequences in the compressed data.

38. The system of claim 32, wherein the decision logic is further configured to:

determine a particular data compression algorithm used in the compression of the selected compressed data; and output information indicating the particular data compression algorithm used in the compression of the selected compressed data.

39. The system of claim 32, wherein the data compression logic is configured to write the selected compressed data to the memory.

40. The system of claim 32, wherein the system further comprises:

a plurality of decompression engines, wherein the plurality of decompression engines implement decompression algorithms corresponding to the different respective data compression algorithms of the plurality of compression engines;

decompression logic coupled to the plurality of decompression engines and configured to:

determine a first decompression engine of the plurality of decompression engines that implements a particular data compression algorithm used in compression of first compressed data; and provide the first compressed data to the first decompression engine;

wherein the first decompression engine is configured to decompress the first compressed data to produce the uncompressed data.

41. The system of claim 40, wherein the data compression logic is further configured to write data compression information indicating the particular data compression algorithm used in the compression of the first compressed data to the memory;

wherein, in said determining the first decompression engine, the decompression logic is further configured to read the data compression information to determine the particular data compression algorithm.

42. The system of claim 32, further comprising:

a memory controller coupled to the processor and the memory and configured to control the memory, wherein the data compression logic is comprised in the memory controller.

43. The system of claim 32, wherein the data compression logic is comprised in the processor.

44. The system of claim 32, further comprising:

wherein the memory comprises one or more memory modules, wherein the data compression logic is comprised in one of the one or more memory modules.

45. The system of claim 32, further comprising a network interface device operable to interface the system to a network, wherein the data compression logic is comprised in the network interface device.

46. A method for compressing data in a system comprising a memory, the method comprising:

receiving uncompressed data;

providing the uncompressed data to a plurality of compression engines, wherein each of the plurality of compression engines implements a different respective data compression algorithm;

the plurality of compression engines compressing the uncompressed data using the different respective data compression algorithms, thereby producing a plurality of different versions of the compressed data, wherein said compressing comprises at least one of the plurality of compression engines compressing the uncompressed data using a parallel lossless data compression algorithm; and selecting one of the plurality of different versions of the compressed data based upon one or more predetermined metrics.

47. The method of claim 46, further comprising:

outputting the selected compressed data.

48. The method of claim 46, wherein the at least one of the plurality of compression engines implements a parallel statistical data compression algorithm;

wherein the plurality of compression engines compressing the uncompressed data includes the at least one of the plurality of compression engines compressing the uncompressed data using the parallel statistical data compression algorithm.

49. The method of claim 46, wherein the at least one of the plurality of compression engines implements a parallel dictionary-based data compression algorithm;

wherein the plurality of compression engines compressing the uncompressed data includes the at least one of the plurality of compression engines compressing the uncompressed data using the parallel dictionary-based data compression algorithm.

50. The method of claim 49, wherein the uncompressed data comprises a plurality of symbols;

wherein the at least one of the plurality of compression engines compressing the data using the parallel dictionary-based data compression algorithm comprises the at least one of the plurality of compression engines comparing each of a plurality of received symbols with each of a plurality of entries in a history table concurrently.

51. The method of claim 50, wherein the at least one of the plurality of compression engines compressing the uncompressed data using the parallel dictionary-based data compression algorithm comprises:

receiving the uncompressed data, wherein the uncompressed data comprises a plurality of symbols, wherein the plurality of symbols includes a first symbol, a last symbol, and one or more middle symbols;

maintaining a history table comprising entries, wherein each entry comprises at least one symbol;

comparing the plurality of symbols with entries in the history table in a parallel fashion, wherein said comparing in a parallel fashion comprises comparing each of the plurality of symbols with each entry in the history table concurrently, wherein said comparing produces compare results;

determining match information for each of the plurality of symbols based on the compare results, wherein said determining match information includes determining if a contiguous match occurs for one or more of the one or more middle symbols that does not involve a match with either the first symbol or the last symbol; and outputting compressed data in response to the match information.

52. The method of claim 46, wherein each of the plurality of compression engines implements a different parallel dictionary-based data compression algorithm;

wherein the plurality of compression engines compressing the uncompressed data includes the plurality of compression engines compressing the uncompressed data using the different parallel dictionary-based data compression algorithms.

53. The method of claim 52, wherein the plurality of compression engines compressing the uncompressed data includes:
 a first compression engine compressing the uncompressed data using a parallel dictionary-based data compression algorithm using tag based encoding; and
 a second compression engine compressing the uncompressed data using a parallel dictionary-based data compression algorithm using escape characters to differentiate between compressed and raw data sequences.

54. The method of claim 46, wherein the one or more predetermined metrics includes compression ratio.

55. The method of claim 46, wherein the one or more predetermined metrics includes compression speed.

56. The method of claim 46, further comprising writing the selected compressed data to the memory.

57. The method of claim 46, further comprising:

incorporating data compression information into the selected compressed data, wherein the data compression information indicates a particular data compression algorithm used in the compression of the selected compressed data.

58. The method of claim 57, further comprising:

determining that the selected compressed data needs to be decompressed;

receiving the selected compressed data;

examining the data compression information to determine the particular data compression algorithm used in compressing the selected compressed data;

selecting a decompression engine from a plurality of decompression engines, wherein the selected decompression engine implements a decompression algorithm for decompressing data compressed using the particular data compression algorithm;

providing the selected compressed data to the selected decompression engine; and the selected decompression engine decompressing the selected compressed data using the decompression algorithm to produce the uncompressed data.

59. A method for compressing data in a system comprising a memory, the method comprising:

receiving uncompressed data;

providing the uncompressed data to a plurality of compression engines, wherein each of the plurality of compression engines implements a different data compression algorithm;

the plurality of compression engines compressing the uncompressed data using a plurality of different data compression algorithms to produce a plurality of different versions of the compressed data, wherein said compressing includes at least one of the plurality of compression engines compressing the uncompressed data using a parallel lossless dictionary-based data compression algorithm; and selecting one of the plurality of different versions of the compressed data as a most qualified version of the compressed data based upon one or more predetermined metrics.

60. The method of claim 59, wherein selecting the most qualified version of the compressed data further comprises selecting a version of the compressed data with a highest compression ratio from among the plurality of different versions of the compressed data.

61. The method of claim 59, wherein at least one of the first plurality of compression engines implements a parallel data compression algorithm based on a serial statistical data compression algorithm.

62. The method of claim 59, wherein at least one of the first plurality of compression engines implements a parallel data compression algorithm based on a Lempel-Ziv (LZ) algorithm.

63. The method of claim 59, wherein a first of the first plurality of compression engines comprises a second plurality of compression engines, wherein each of the second plurality of compression engines implements a first data compression algorithm, wherein said compressing further comprises:

providing a different portion of the uncompressed data to each of the second plurality of compression engines;

each of the second plurality of compression engines compressing the different portion of the uncompressed data using the first data compression algorithm to produce a compressed portion of the uncompressed data;

wherein the second plurality of compression engines compress a plurality of different portions of the uncompressed data to produce a plurality of compressed portions of the uncompressed data; and merging the plurality of compressed portions of the uncompressed data to produce a version of the compressed data.

64. The method of claim 63, wherein the second plurality of compression engines is configured to compress the plurality of portions of the uncompressed data in a parallel fashion.

65. The data compression system of claim 63, wherein the first data compression algorithm is a parallel dictionary-based data compression algorithm.

66. The method of claim 59, wherein at least one of the plurality of compression engines performs parallel data compression using a plurality of parallel compression engines each operating in parallel on a different respective portion of said uncompressed data.

67. A data compression system comprising:
- a plurality of compression engines, wherein each of the plurality of compression engines implements a different respective parallel dictionary-based data compression algorithm, and wherein each of the plurality of compression engines is configured to:
  - receive uncompressed data, wherein the uncompressed data comprises a plurality of symbols; and
  - compress the uncompressed data using its respective data compression algorithm, wherein each of the plurality of compression engines is operable to compare each of a plurality of received symbols with each of a plurality of entries in a history table concurrently;
- wherein the plurality of compression engines produce a plurality of different versions of the compressed data;
- decision logic coupled to the plurality of compression engines and configured to:
  - select one of the plurality of different versions of the compressed data based upon one or more predetermined metrics; and
  - output the selected compressed data.

68. The data compression system of claim 67,
wherein a first compression engine implements a parallel dictionary-based data compression algorithm using tag based encoding;
wherein a second compression engine implements a parallel dictionary-based data compression algorithm using escape characters to differentiate between compressed and raw data sequences in the compressed data.

69. The data compression system of claim 67,
wherein the plurality of compression engines share a common history table.

70. The data compression system of claim 67,
wherein each of the plurality of compression engines includes its own history table.

71. The data compression system of claim 67,
wherein each of the first plurality of compression engines comprises:
- an input for receiving the uncompressed data, wherein the uncompressed data comprises a plurality of symbols, wherein the plurality of symbols includes a first symbol, a last symbol, and one or more middle symbols;
- a history table comprising entries, wherein each entry comprises at least one symbol;
- a plurality of comparators for comparing the plurality of symbols with entries in the history table, wherein the plurality of comparators are operable to compare each of the plurality of symbols with each entry in the history table concurrently, wherein the plurality of comparators produce compare results;
- match information logic coupled to the plurality of comparators for determining match information for each of the plurality of symbols based on the compare results, wherein the match information logic is operable to determine if a contiguous match occurs for one or more of the one or more middle symbols that does not involve a match with either the first symbol or the last symbol; and
- an output coupled to the match information logic for outputting compressed data in response to the match information.

72. The data compression system of claim 67,
wherein the one or more predetermined metrics comprise at least one of compression ratio and compression speed.

73. A data compression system comprising:
- a first plurality of compression engines, wherein each of the first plurality of compression engines implements a different respective data compression algorithm, wherein at least one of the first plurality of compression engines implements a parallel data compression algorithm, and wherein each of the first plurality of compression engines is configured to:
  - receive uncompressed data; and
  - compress the uncompressed data using its respective data compression algorithm;
- wherein the first plurality of compression engines produce a plurality of different versions of the compressed data; and
- decision logic coupled to the first plurality of compression engines and configured to:
  - select one of the plurality of different versions of the compressed data based upon a plurality of predetermined metrics; and
  - output the selected compressed data.

* * * * *